United States Patent
Nagaya et al.

(10) Patent No.: US 12,139,813 B2
(45) Date of Patent: Nov. 12, 2024

(54) SiC WAFER AND MANUFACTURING METHOD FOR SiC WAFER

(71) Applicant: TOYOTA TSUSHO CORPORATION, Nagoya (JP)

(72) Inventors: Masatake Nagaya, Aichi (JP); Takahiro Kanda, Aichi (JP); Takeshi Okamoto, Aichi (JP); Satoshi Torimi, Kagawa (JP); Satoru Nogami, Kagawa (JP); Makoto Kitabatake, Kagawa (JP)

(73) Assignee: TOYOTA TSUSHO CORPORATION, Aichi (JP)

( * ) Notice: Subject to any disclaimer, the term of this patent is extended or adjusted under 35 U.S.C. 154(b) by 786 days.

(21) Appl. No.: 17/263,149

(22) PCT Filed: Jul. 24, 2019

(86) PCT No.: PCT/JP2019/029063
§ 371 (c)(1),
(2) Date: Jan. 25, 2021

(87) PCT Pub. No.: WO2020/022391
PCT Pub. Date: Jan. 30, 2020

(65) Prior Publication Data
US 2021/0301421 A1    Sep. 30, 2021

(30) Foreign Application Priority Data

Jul. 25, 2018 (JP) .................................. 2018-139494
Jul. 25, 2018 (JP) .................................. 2018-139495
(Continued)

(51) Int. Cl.
*C30B 29/36* (2006.01)
*B28D 5/04* (2006.01)
(Continued)

(52) U.S. Cl.
CPC .............. *C30B 29/36* (2013.01); *B28D 5/042* (2013.01); *C30B 11/02* (2013.01); *C30B 33/10* (2013.01);
(Continued)

(58) Field of Classification Search
None
See application file for complete search history.

(56) References Cited

U.S. PATENT DOCUMENTS 5,888,414 A * 3/1999 Collins ............. H01J 37/32165
                                              257/E21.252
2004/0134418 A1* 7/2004 Hirooka .................. C30B 29/36
                                              257/E21.054
(Continued)

FOREIGN PATENT DOCUMENTS

JP    H10162768 A    6/1998
JP    2004168649 A   6/2004
(Continued)

OTHER PUBLICATIONS

M. Nagaya, et al., "Processing characteristics of the SiC wafer lapped with the B4C abrasives", Lecture Collection of the 2014 Autumn Meeting Academic Lectures of the Japan Society for Precision Engineering, 605-606.
(Continued)

*Primary Examiner* — Jeffrey D Washville
(74) *Attorney, Agent, or Firm* — RANKIN, HILL & CLARK LLP

(57) ABSTRACT

An object is to provide a SiC wafer in which a detection rate of an optical sensor can improved and a SiC wafer manufacturing method.
The method includes: a satin finishing process S141 of satin-finishing at least a back surface 22 of a SiC wafer 20; an etching process 21 of etching at least the back surface 22
(Continued)

of the SiC wafer 20 by heating under Si vapor pressure after the satin finishing process S141; and a mirror surface processing process S31 of mirror-processing a main surface 21 of the SiC wafer 20 after the etching process S21. Accordingly, it is possible to obtain a SiC wafer having the mirror-finished main surface 21 and the satin-finished back surface 22.

4 Claims, 23 Drawing Sheets

(30) Foreign Application Priority Data

| | | | |
|---|---|---|---|
| Jul. 25, 2018 | (JP) | ................................ | 2018-139496 |
| Jul. 25, 2018 | (JP) | ................................ | 2018-139497 |
| Jul. 25, 2018 | (JP) | ................................ | 2018-139498 |
| Jul. 25, 2018 | (JP) | ................................ | 2018-139499 |

(51) Int. Cl.

| | |
|---|---|
| *C30B 11/02* | (2006.01) |
| *C30B 33/10* | (2006.01) |
| *C30B 33/12* | (2006.01) |
| *H01L 21/02* | (2006.01) |
| *H01L 29/16* | (2006.01) |

(52) U.S. Cl.
CPC ........ *C30B 33/12* (2013.01); *H01L 21/02013* (2013.01); *H01L 21/02016* (2013.01); *H01L 21/02019* (2013.01); *H01L 21/02021* (2013.01); *H01L 21/02024* (2013.01); *H01L 29/1608* (2013.01)

(56) References Cited

U.S. PATENT DOCUMENTS

| | | | |
|---|---|---|---|
| 2006/0057850 A1* | 3/2006 | Britt | .................... H01L 21/6836 |
| | | | 257/E23.179 |
| 2012/0294790 A1 | 11/2012 | Sasaki et al. | |
| 2013/0157009 A1 | 6/2013 | Kondo | |
| 2014/0317791 A1 | 10/2014 | Kaneko et al. | |
| 2017/0114475 A1 | 4/2017 | Yabuki et al. | |
| 2017/0236905 A1 | 8/2017 | Torimi et al. | |
| 2019/0136411 A1 | 5/2019 | Kaneko et al. | |

FOREIGN PATENT DOCUMENTS

| | | |
|---|---|---|
| JP | 2004200240 A | 7/2004 |
| JP | 2010254521 A | 11/2010 |
| JP | 2011-111372 A | 6/2011 |
| JP | 2011247807 A | 12/2011 |
| JP | 2012-240892 A | 12/2012 |
| JP | 2015196616 A | 11/2015 |
| JP | 6054341 B2 | 12/2016 |
| JP | 2008303097 A | 4/2017 |
| JP | 2017105697 A | 6/2017 |
| WO | 2012093684 A1 | 6/2014 |
| WO | 2013069067 A1 | 4/2015 |
| WO | 2017188382 A1 | 3/2019 |

OTHER PUBLICATIONS

International Search Report of PCT/JP2019/029063 dated Oct. 21, 2019 (2 pages).
Extended European Search Report (EESR) dated Aug. 18, 2022 for European Patent Application No. 19840989.8.
English translation of Japanese Office Action (JPOA) dated Jun. 27, 2023 and issued in Japanese Patent Application No. 2018-139499.

\* cited by examiner

FIG. 8
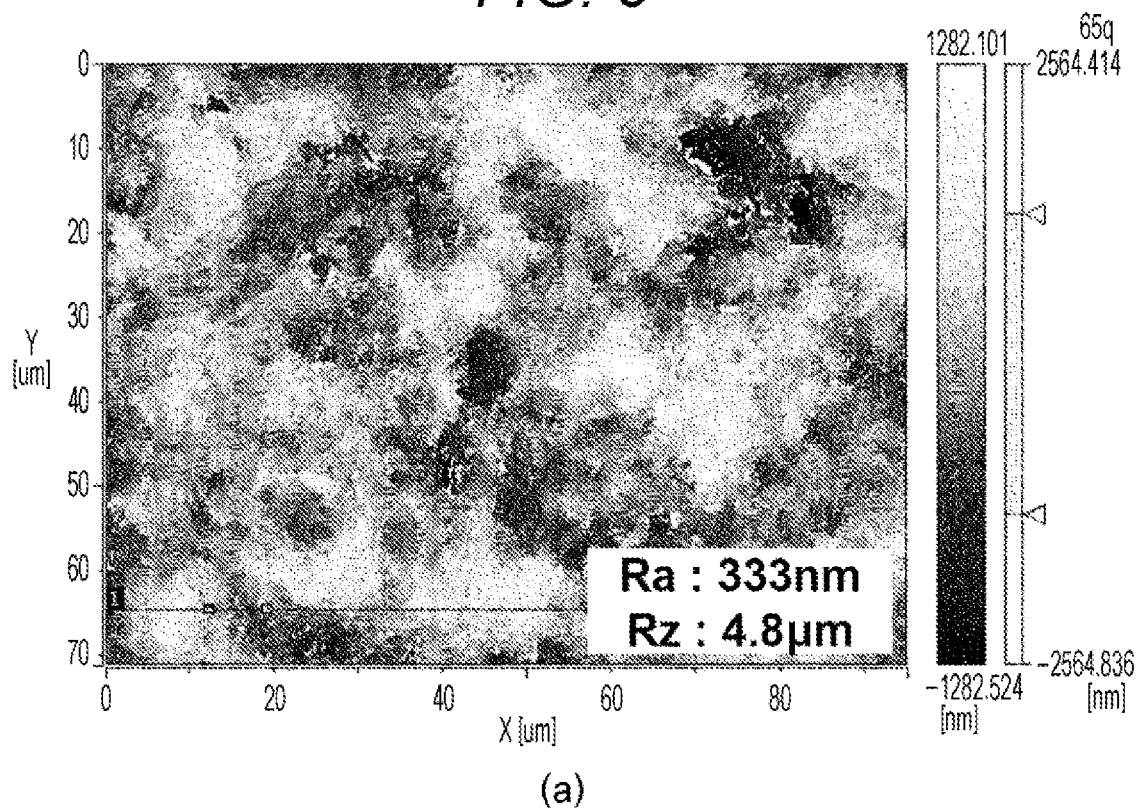
(a)
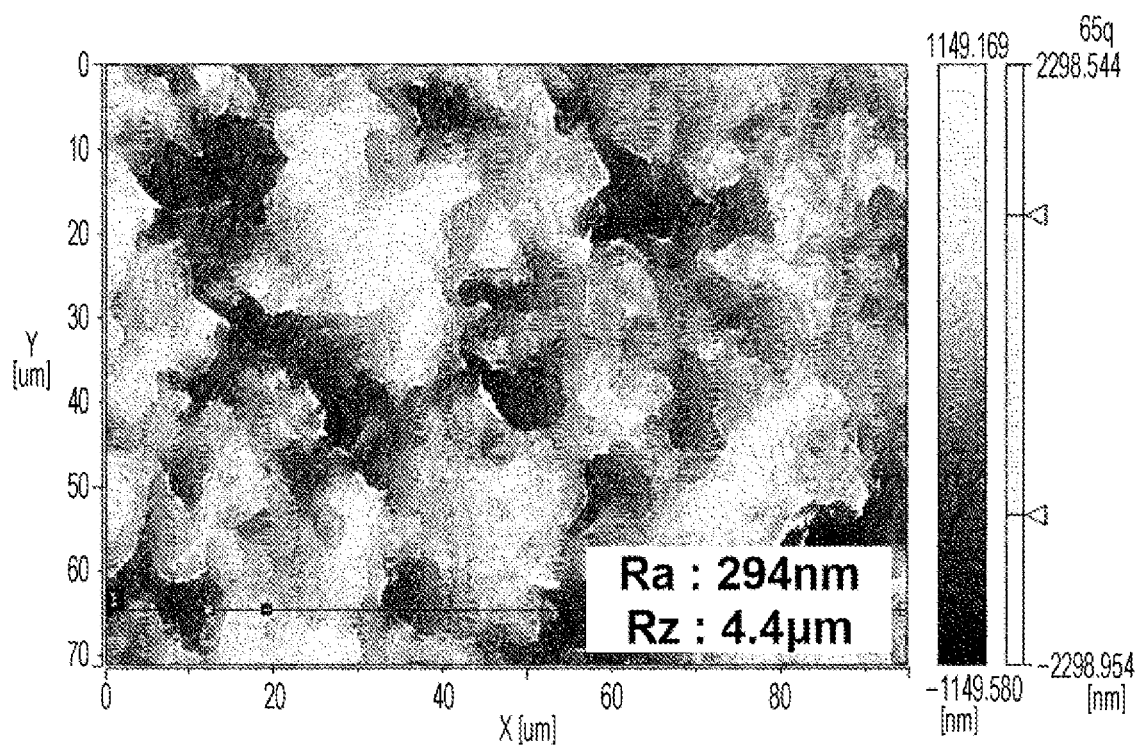
(b)

FIG. 9
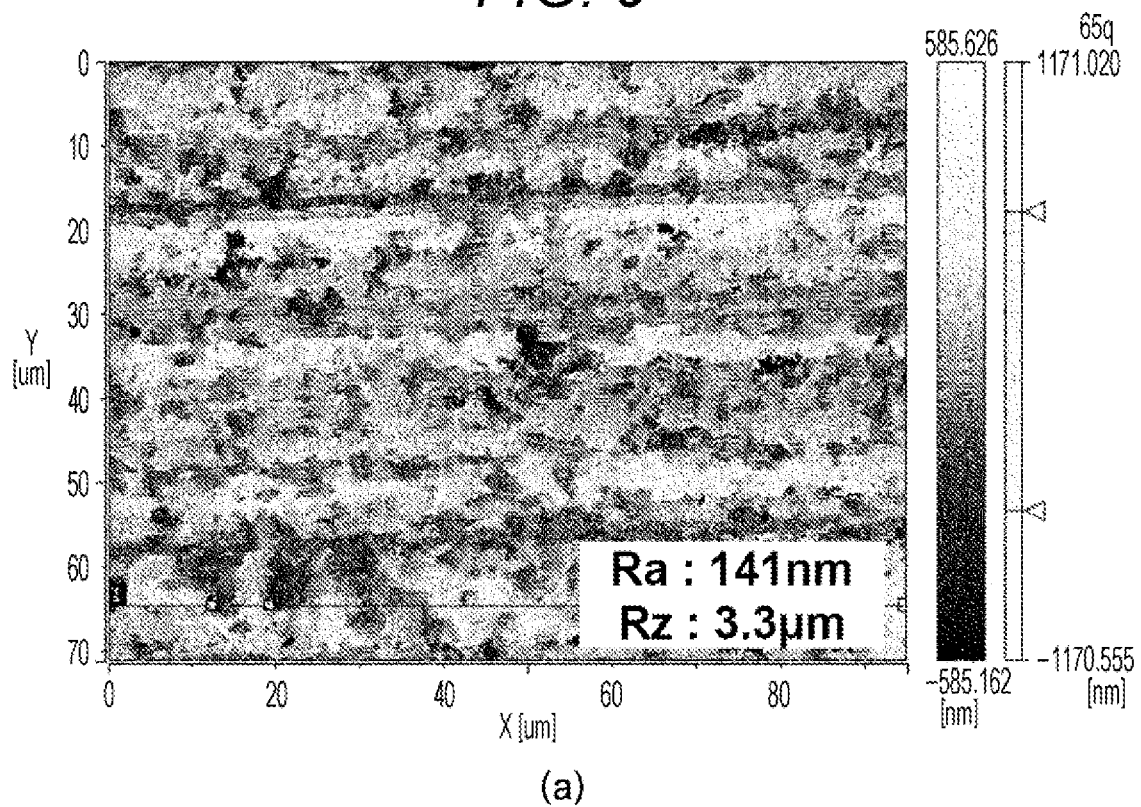
(a)
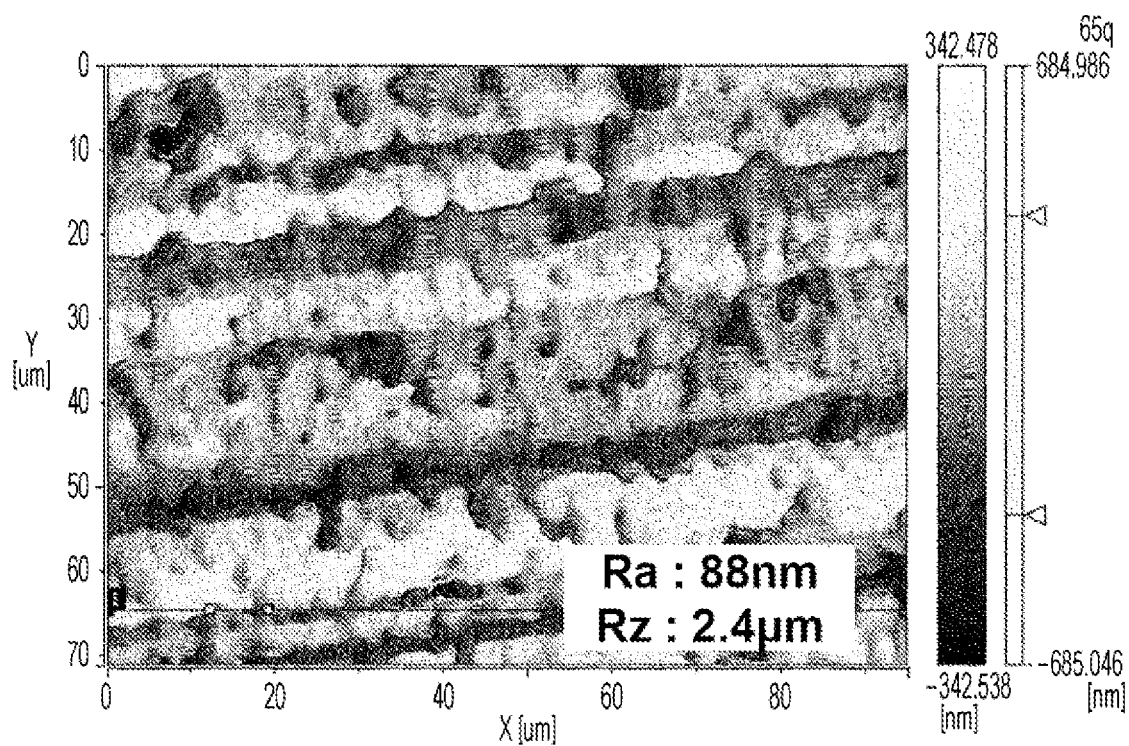
(b)

FIG. 10
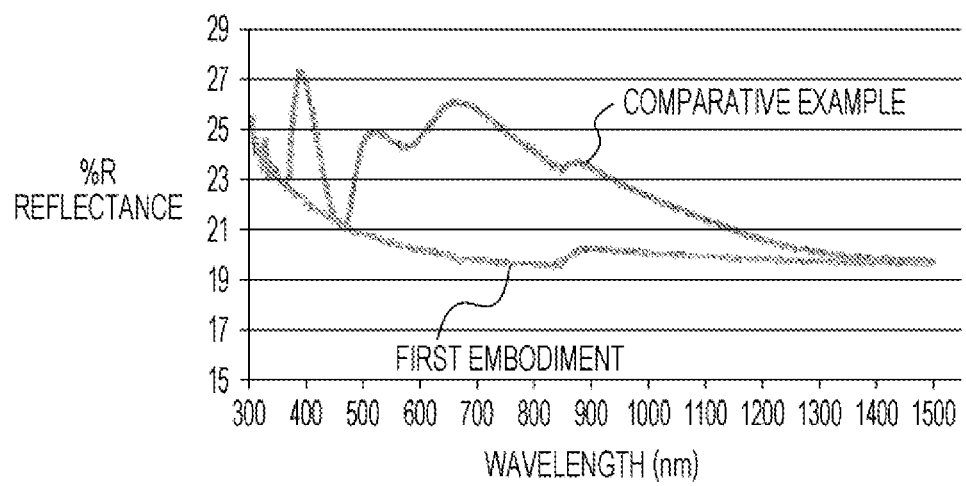
(a)
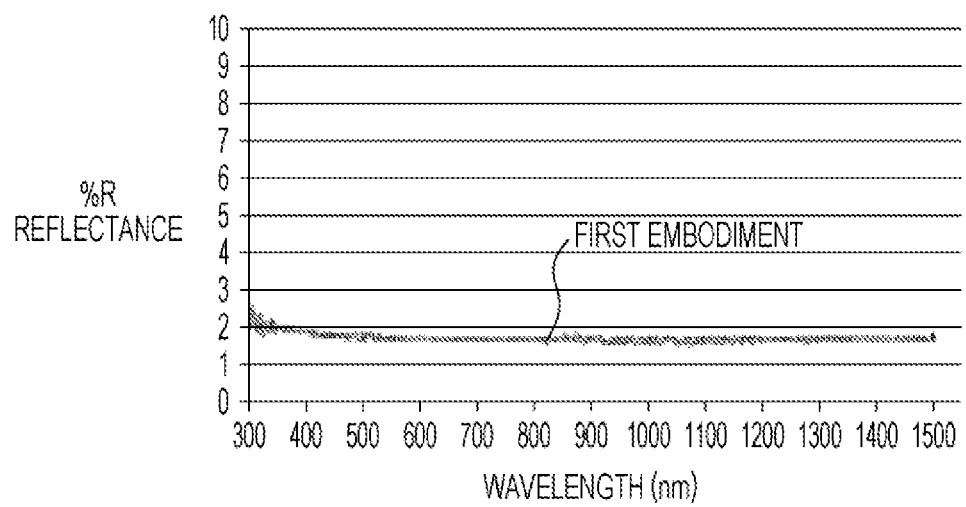
(b)

(a)  (b)

FIG. 16
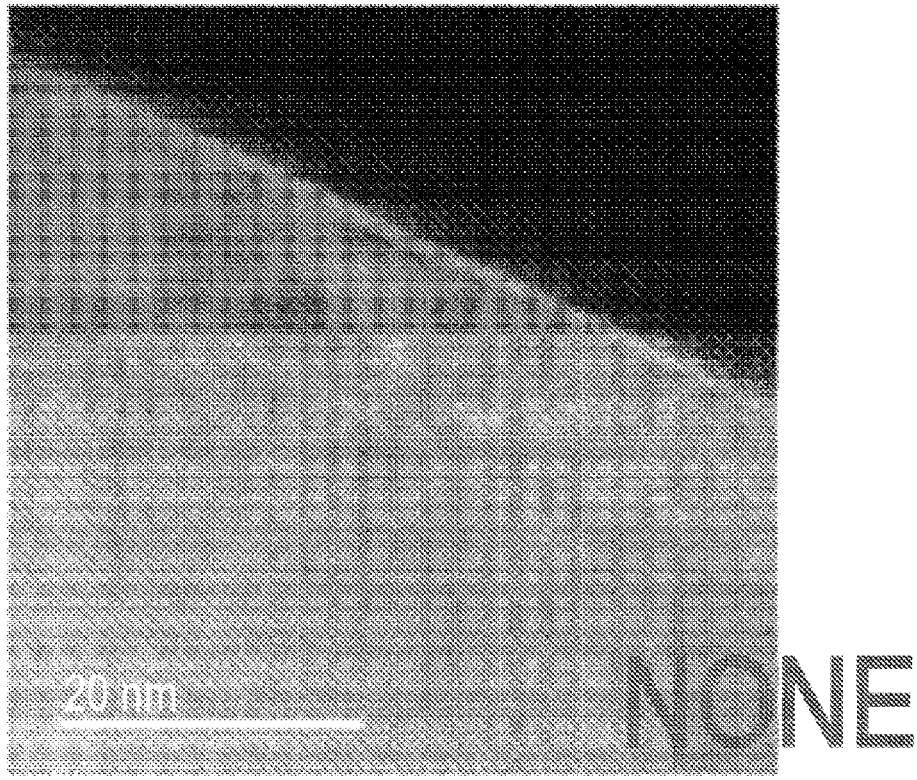
(a)
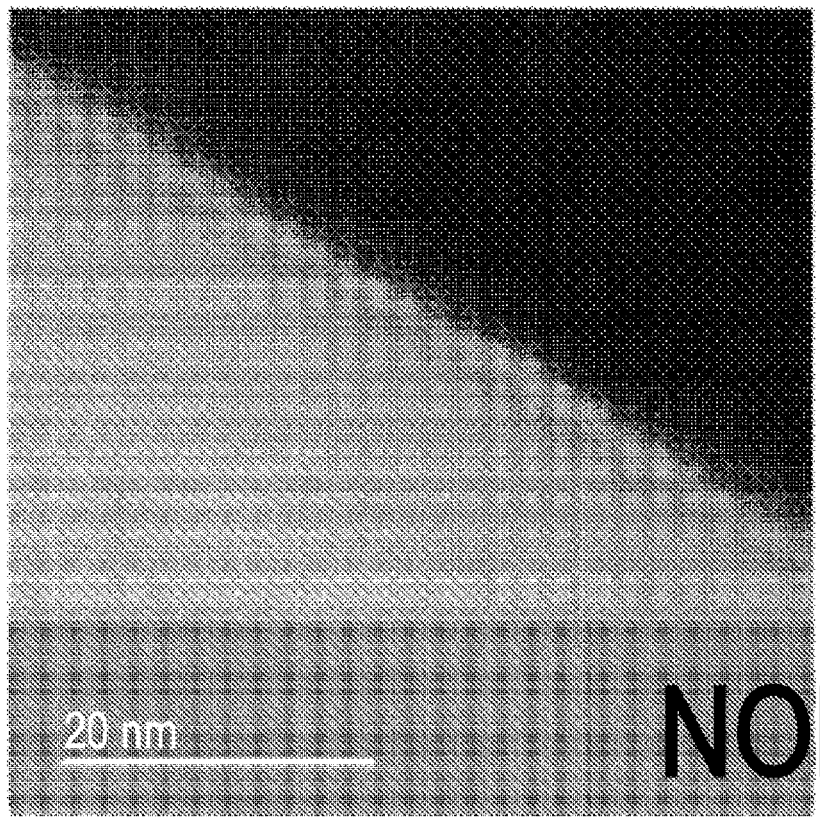
(b)

FIG. 17
(a)
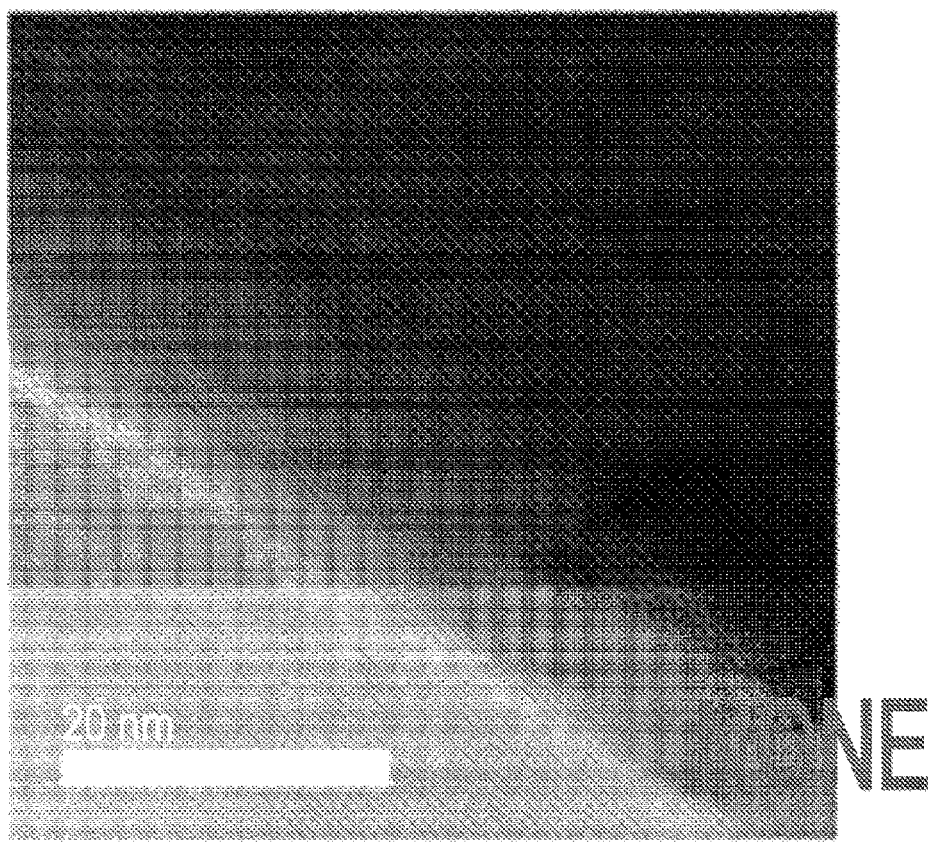
(b)
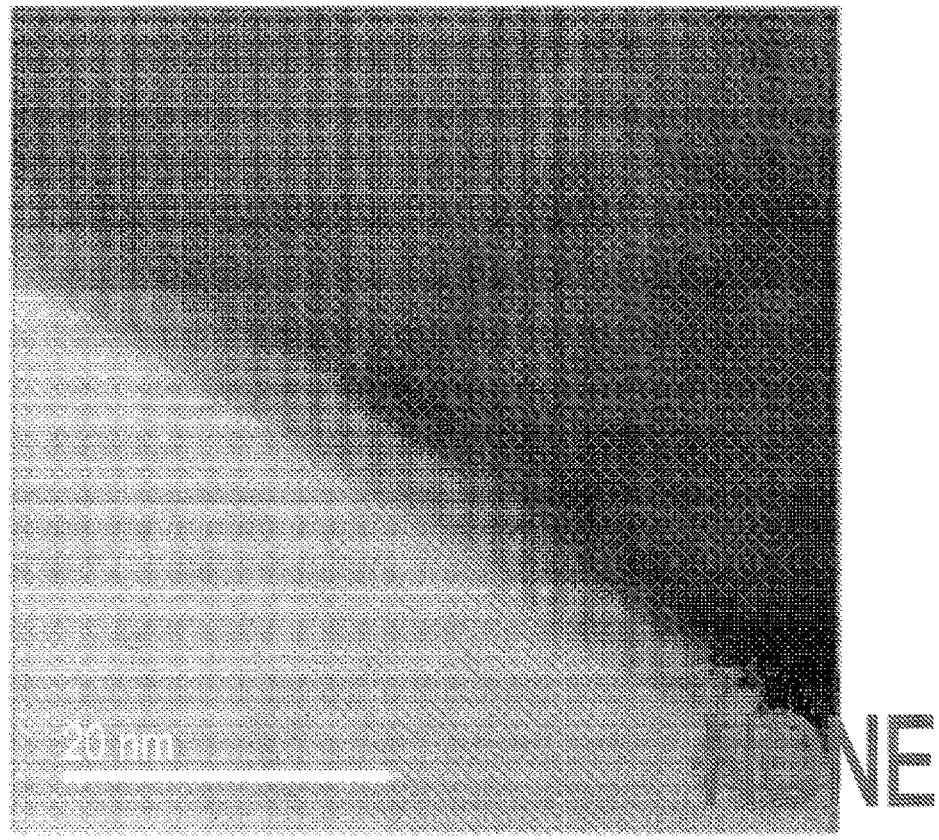

*FIG. 18*
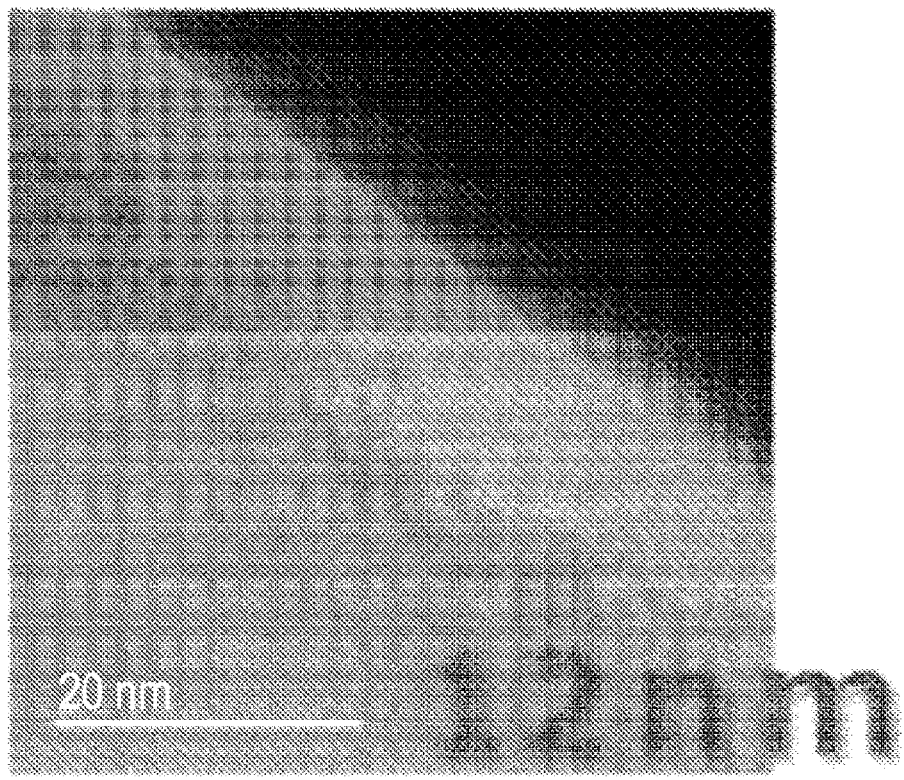
(a)
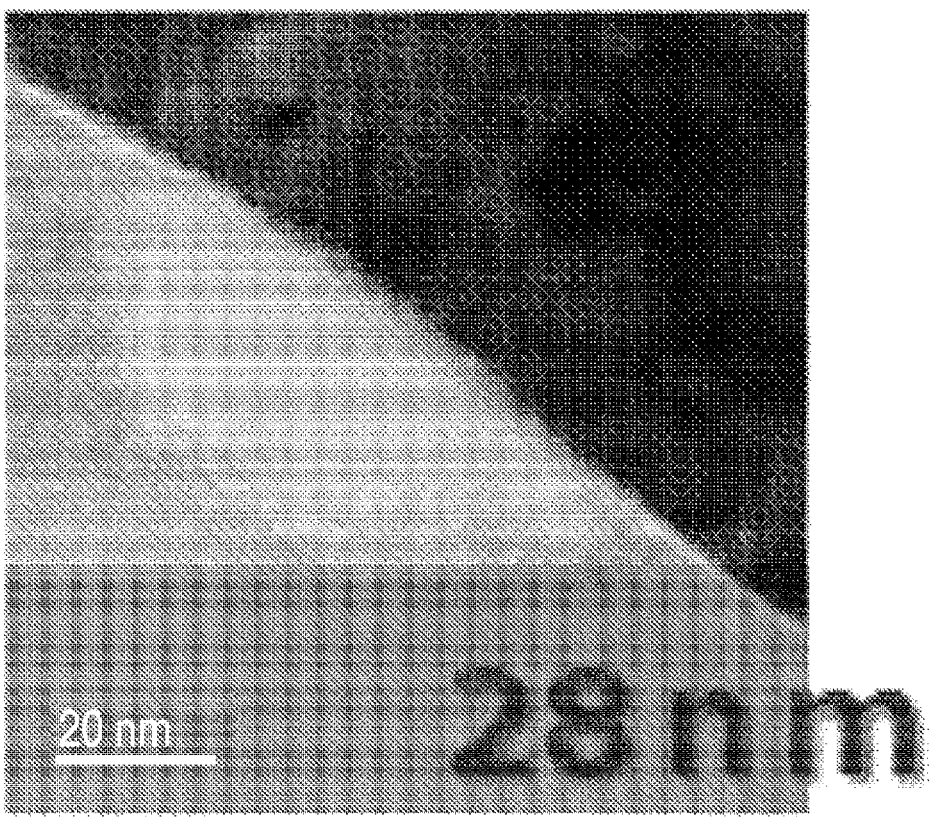
(b)

FIG. 19
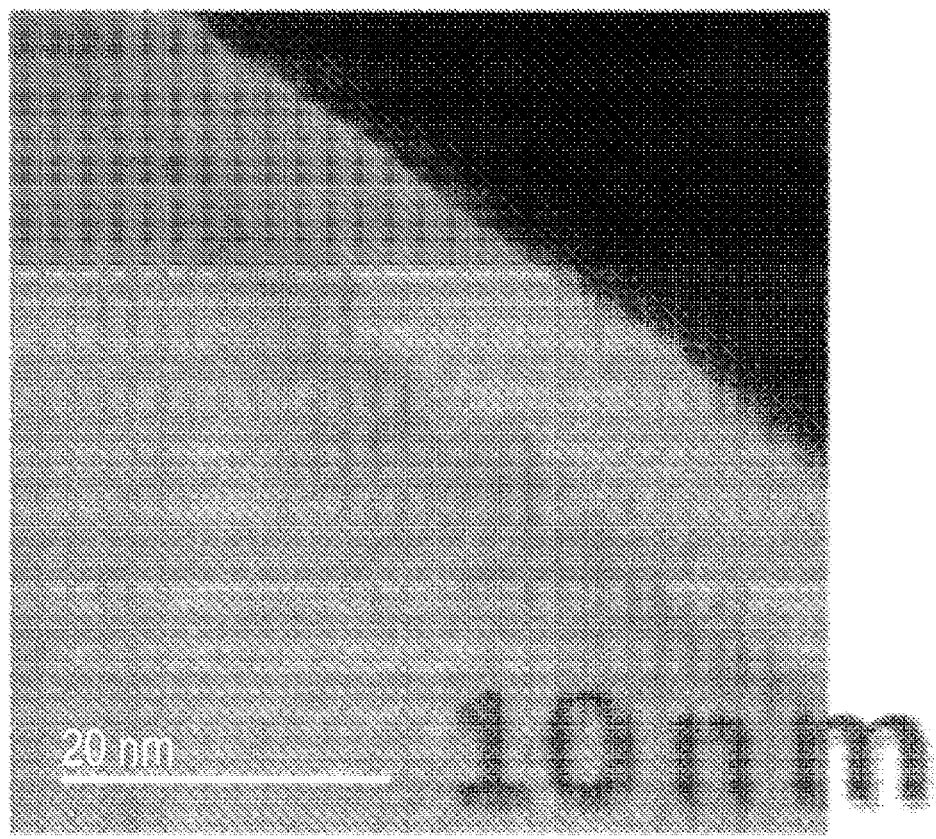
(a)
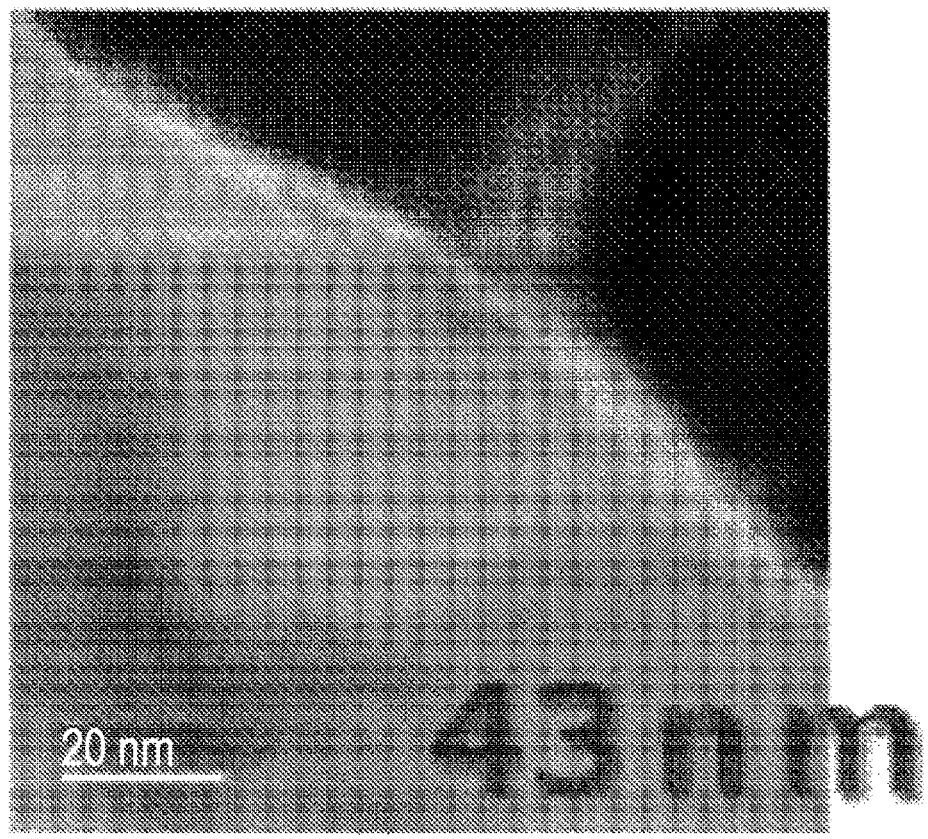
(b)

SiC WAFER AND MANUFACTURING METHOD FOR SiC WAFER

CROSS-REFERENCE TO RELATED APPLICATIONS

This application is a 371 of PCT Application No. PCT/JP2019/029063 filed on Jul. 24, 2019, which claims priority to Japanese Application No. 2018-139494, filed on Jul. 25, 2018, Japanese Application No. 2018-139495, filed on Jul. 25, 2018, Japanese Application No. 2018-139496, filed on Jul. 25, 2018, Japanese Application No. 2018-139497, filed on Jul. 25, 2018, Japanese Application No. 2018-139498, filed on Jul. 25, 2018, and Japanese Application No. 2018-139499, filed on Jul. 25, 2018, the contents of which are hereby incorporated by reference as if recited in their entirety.

TECHNICAL FIELD

The present invention relates to a SiC wafer and a SiC wafer manufacturing method.

BACKGROUND ART

In recent years, silicon carbide (SiC) semiconductor devices have attracted attention as energy-saving and high-performance semiconductor devices since the devices are capable of high withstand voltage, high efficiency, and high-temperature operation as compared with silicon (Si) semiconductor devices or gallium arsenide (GaAs) semiconductor devices.

In the related art, in commercially available SiC wafers for semiconductor devices, the main surface and the back surface are normally finished into mirror surfaces. On the other hand, in Si wafers and the like, satin finishing is performed on the back surface of the wafer (for example, see Patent Literature 1).

By making the back surface of the wafer a satin surface in this way, it becomes easy to distinguish the main surface and the back surface of the wafer. Further, there are advantages that a friction coefficient on the back surface of the wafer is increased to prevent slipping during conveyance or in the equipment, the wafer is easily peeled off from an electrostatic chuck type sample table, and the like.

Silicon carbide (SiC) wafers are also formed by slicing single crystal SiC ingots. The surface of the sliced SiC wafer has a surface layer (hereinafter, referred to as a work-affected layer) having strain, scratches, and the like of crystals introduced at the time of slicing. In order not to reduce the yield in the device manufacturing process, it is necessary to remove the work-affected layer.

Conventionally, in removal of this work-affected layer, the mainstream is removal by surface processing using diamond abrasive grains. In recent years, various proposals have been made for surface processing techniques which do not use diamond abrasive grains.

For example, Non Patent Literature 1 discloses a technique for free abrasive grain polishing using boron carbide ($B_4C$) abrasive grains. Further, Patent Literature 2 describes an etching technique (hereinafter, also referred to as Si vapor pressure etching) for etching a SiC wafer by heating the SiC wafer under Si vapor pressure.

CITATION LIST

Patent Literature

Patent Literature 1: JP 2004-200240 A
Patent Literature 2: JP 2011-247807 A

Non Patent Literature

Non Patent Literature 1: Lecture Collection of the 2014 Autumn Meeting Academic Lectures of the Japan Society for Precision Engineering p. 605-606

SUMMARY OF INVENTION

Technical Problem

Incidentally, unlike a single crystal Si, a single crystal SiC has translucency and thus transmits visible light. Therefore, there is a problem that it is difficult to detect a wafer during a device manufacturing process using an optical sensor.

A first object of the present invention is to provide a SiC wafer in which a detection rate of an optical sensor can be improved and a method for manufacturing the same.

The single crystal SiC is a hard and brittle material having hardness next to diamond and the like and having a characteristic of being easily cleaved on a (0001) surface and a (1-100) surface, and is classified as a material which is extremely difficult to process. The requirement in the processing process of semiconductor materials is "high quality (high flatness and damageless)", "low loss (material loss and yield)", "low cost (high efficiency and inexpensive means/process)". However, when hardness and brittleness increases, the hardness and brittleness become in a trade-off relationship, and it is difficult to be compatible with each other.

Above all, in order to industrially produce SiC wafers, a technique for manufacturing high-quality SiC wafers is particularly required. In particular, a SiC wafer having a work-affected layer has a problem that a SORI value increases at the time of high temperature annealing in the subsequent device manufacturing process, a problem that cracks (scratches) and crystal strain appear as defects, and the like.

Therefore, it is desirable to remove the work-affected layer over the entire SiC wafer. However, there is no means for removing the work-affected layer such as an outer peripheral portion, a notch portion such as an orientation flat, and the periphery of a stamp portion other than the main surface and the back surface of the SiC wafer.

A second object of the present invention is to provide a high-quality SiC wafer from which scratches and lattice strains have been removed and a method for manufacturing the same.

Reducing the amount of single crystal SiC removed (material loss) in surface processing contributes to cost reduction of SiC wafers. That is, by reducing the material loss in surface processing, the number of SiC wafers taken from one ingot can be increased, and the unit price per wafer can be reduced.

A third object of the present invention is to provide a SiC wafer manufacturing method in which material loss can be reduced.

A fourth object of the present invention is to provide a SiC wafer manufacturing method in which material loss can be reduced, and more SiC wafers can be manufactured from one ingot.

In order to industrially produce SiC wafers, a technique for manufacturing high-quality SiC wafers is particularly required.

A fifth object of the present invention is to provide a new SiC wafer manufacturing method in which a high-quality SiC wafer can be manufactured.

Solution to Problem

According to one aspect of the present invention for achieving the first object, a SiC wafer includes: a mirror-finished main surface; and a satin-finished back surface.

As described above, when the back surface of the SiC wafer is formed as a satin surface, the detection rate of the optical sensor can be improved.

In this aspect, the back surface has an arithmetic mean deviation Ra of 50 to 300 nm.

In this aspect, the back surface has a maximum height Rz of 0.5 to 5 µm.

With such roughness, it is possible to prevent the wafer from slipping, suppress the adhesion of particles and the like, and suppress the deterioration of the flatness of the wafer during chucking to the sample table.

In this aspect, the back surface has substantially no work-affected layer.

As described above, when the work-affected layer is not substantially formed on the back surface, a satin surface preferable for the device manufacturing process can be formed.

According to another aspect of the present invention for achieving the first object, a SiC wafer is obtained by performing satin finishing on at least a back surface of the SiC wafer, and then etching at least the back surface of the SiC wafer by heating under Si vapor pressure.

As described above, when heating is performed under Si vapor pressure after the satin finishing, a satin surface preferable for the device manufacturing process can be formed.

According to another aspect of the present invention for achieving the first object, a SiC wafer is obtained by performing satin finishing on at least a back surface of the SiC wafer, etching at least the back surface of the SiC wafer by heating under Si vapor pressure, and then mirror-processing a main surface of the SiC wafer.

In these aspects, the satin finishing is free abrasive grain processing using boron carbide abrasive grains and/or silicon carbide abrasive grains.

In these aspects, a wafer thickness is 1 mm or less.

The present invention also relates to the above-described SiC wafer manufacturing method. That is, a SiC wafer manufacturing method of the present invention for achieving the first object includes: a satin finishing process of satin-finishing at least a back surface of a SiC wafer; and an etching process of etching at least the back surface of the SiC wafer by heating under Si vapor pressure after the satin finishing process.

The single crystal SiC is a hard and brittle material having hardness next to diamond and the like and having a characteristic of being easily cleaved on a (0001) surface and a (1-100) surface, and is classified as a material which is extremely difficult to process. However, according to the manufacturing method of the present invention, it is possible to form a satin surface suitable for the device manufacturing process on the back surface of the SiC wafer which is difficult to process.

In this aspect, the SiC wafer manufacturing method further includes: a mirror surface processing process of mirror-processing a main surface of the SiC wafer after the etching process.

In this aspect, the satin finishing process is free abrasive grain processing using boron carbide abrasive grains and/or silicon carbide abrasive grains.

In this aspect, the etching process has a roughness adjusting process of adjusting a roughness of the back surface such that an arithmetic mean deviation Ra is 50 to 300 nm by controlling an etching amount.

According to one aspect of the present invention for achieving the second object, in the SiC wafer, a work-affected layer is not substantially present.

Further, according to another aspect of the present invention for achieving the second object, a SiC wafer includes: a main surface on which semiconductor elements are formed; a back surface which faces the main surface; an outer peripheral portion which is connected to outer edges of the main surface and the back surface; a notch portion which is provided in a part of the outer peripheral portion; and a stamp portion which is provided on the main surface or the back surface. The main surface, the back surface, the outer peripheral portion, the notch portion, and the stamp portion have substantially no work-affected layer.

Further, according to another aspect of the present invention for achieving the second object, in a SiC wafer, a lattice strain other than a lattice strain derived from surface reconstruction is not substantially present.

Further, according to another aspect of the present invention for achieving the second object, a SiC wafer includes a main surface on which semiconductor elements are formed; a back surface which faces the main surface; and a bulk layer which is adjacent to the main surface and the back surface. The bulk layer has a lattice strain amount of 0.01% or less with respect to a reference crystal lattice.

As described above, when a lattice strain other than a lattice strain derived from surface reconstruction is not substantially present, it is possible to obtain a high-quality SiC wafer preferable for the subsequent device manufacturing process.

In this aspect, the bulk layer has a lattice strain amount of 0.01% or less with respect to a reference crystal lattice.

In this aspect, a SORI value does not change when heating is performed in a temperature range of 1500 to 2000° C.

According to one aspect of the present invention for achieving the second object, a SiC wafer manufacturing method includes: a flattening process of flattening a SiC wafer; and an etching process of etching a main surface and a back surface of the SiC wafer by heating under Si vapor pressure after the flattening process.

In this aspect, a processing temperature of the etching process is 1500° C. or higher.

In this aspect, the SiC wafer manufacturing method includes a mirror surface processing process of mirror-processing the main surface of the SiC wafer following the etching process.

In this aspect, the SiC wafer manufacturing method further includes, before the etching process, an ingot molding process of processing a mass of a crystal-grown single crystal SiC into a columnar ingot; a slicing process of slicing the ingot to obtain a thin disk-shaped SiC wafer; a stamp forming process of forming a stamp portion by selectively removing a surface of the SiC wafer; and a chamfering process of chamfering an outer peripheral portion of the SiC wafer.

According to one aspect of the present invention for achieving the third object, a SiC wafer manufacturing method includes: a flattening process of flattening a SiC wafer in presence of abrasive grains having a modified Mohs hardness of less than 15; and an etching process of etching the SiC wafer by heating under Si vapor pressure.

By combining such a flattening process and an etching process, it is possible to reduce the amount of material loss removed in the work-affected layer removing process.

In this aspect, the abrasive grains are abrasive grains having a modified Mohs hardness of 13 or more.

By using abrasive grains having such hardness, it is possible to reduce the processing time.

In this aspect, the abrasive grains are boron carbide abrasive grains and/or silicon carbide abrasive grains.

By using the material of such abrasive grains, the material cost can be reduced as compared with the diamond abrasive grains.

In this aspect, the flattening process is a free abrasive grain method.

In this aspect, an amount of the SiC wafer etched by the etching process is 10 μm or less per side.

In this aspect, the SiC wafer manufacturing method further includes: a chamfering process of chamfering an outer peripheral portion of the SiC wafer; and a stamp forming process of forming a stamp on a surface of the SiC wafer. The chamfering process and the stamp forming process are performed before the etching process.

In this aspect, the SiC wafer manufacturing method further includes: a chamfering process of chamfering an outer peripheral portion of the SiC wafer; and a stamp forming process of forming a stamp on a surface of the SiC wafer. The chamfering process and the stamp forming process are performed after the flattening process.

According to one aspect of the present invention for achieving the third object, a SiC wafer manufacturing method includes: a flattening process of flattening a SiC wafer while crushing abrasive grains by a free abrasive grain method; and an etching process of etching the SiC wafer by heating under Si vapor pressure.

By combining such a flattening process and an etching process, it is possible to reduce the amount of material loss removed in the work-affected layer removing process.

In this aspect, in the flattening process, the SiC wafer is flattened while crushing the abrasive grains such that an average abrasive grain size at start of processing is 20 μm or more, and an average abrasive grain size at end of processing is less than 20 μm.

When the SiC wafer is flattened while crushing the abrasive grains under such conditions, it is possible to form a thinner and more uniform work-affected layer introduced into the SiC wafer in the flattening process, thereby further reducing the material loss.

According to another aspect of the present invention for achieving the third object, a SiC wafer manufacturing method includes: a flattening process of flattening a SiC wafer by a free abrasive grain method using abrasive grains which are brittle to be crushed in the free abrasive grain method; and an etching process of etching the SiC wafer by heating under Si vapor pressure.

By combining the flattening process using such abrasive grains and the etching process, it is possible to reduce the amount of material loss removed in the work-affected layer removing process.

In this aspect, the abrasive grains satisfy a following brittleness condition.

(Brittleness condition) When the both sides of the surface of the SiC wafer are flattened at the same time with abrasive grains adjusted to an average abrasive grain size of 40 μm under the condition of processing pressure of 150 g/cm$^2$ by the free abrasive grain method, the average abrasive grain size becomes 20 μm or less after the lapse of processing time of 20 minutes.

In these aspects, the abrasive grains are boron carbide abrasive grains and/or silicon carbide abrasive grains.

By using the material of such abrasive grains, the material cost can be reduced as compared with the diamond abrasive grains.

In these aspects, an amount of the SiC wafer etched by the etching process is 10 μm or less per side.

In these aspects, the SiC wafer manufacturing method further includes: a chamfering process of chamfering an outer peripheral portion of the SiC wafer; and a stamp forming process of forming a stamp on a surface of the SiC wafer. The chamfering process and the stamp forming process are performed before the etching process.

In these aspects, the SiC wafer manufacturing method further includes: a chamfering process of chamfering an outer peripheral portion of the SiC wafer; and a stamp forming process of forming a stamp on a surface of the SiC wafer. The chamfering process and the stamp forming process are performed after the flattening process.

According to one aspect of the present invention for achieving the fourth object, a SiC wafer manufacturing method includes: a slicing process of slicing an ingot to obtain a SiC wafer; a flattening process of flattening the SiC wafer; and an etching process of etching the SiC wafer by heating under Si vapor pressure and removing a work-affected layer introduced in the flattening process. In the slicing process, the SiC wafer is obtained which has a thickness obtained by adding a thickness of 122 μm or less to a thickness of the SiC wafer after completion of surface processing including the flattening process and the etching process.

By adopting the etching process in the work-affected layer removing process, the material loss in this process can be reduced.

Specifically, the SiC wafer can be manufactured with an extremely small material loss of 122 μm or less as compared with the conventional method. Therefore, the SiC wafer may be cut out to have "a thickness obtained by adding a thickness of 122 μm or less to a thickness of the SiC wafer after completion of surface processing" in the slicing process. Accordingly, more SiC wafers can be manufactured from one ingot as compared with the conventional method.

In this aspect, in the slicing process, the SiC wafer is obtained which has a thickness obtained by adding a thickness of less than 100 μm to a thickness of the SiC wafer after completion of surface processing including the flattening process and the etching process.

In this aspect, in the slicing process, the SiC wafer is obtained which has a thickness obtained by adding a thickness of less than 87 μm to a thickness of the SiC wafer after completion of surface processing including the flattening process and the etching process.

In this aspect, in the slicing process, the SiC wafer is obtained which has a thickness obtained by adding a thickness of 61 μm or more to a thickness of the SiC wafer after completion of surface processing including the flattening process and the etching process.

In this aspect, the thickness of the SiC wafer after the completion of surface processing is 300 to 400 μm.

In this aspect, a SiC wafer having a thickness of 472 μm or less is obtained in the slicing process.

In this aspect, an etching amount in the etching process is 10 μm or less per one side of the SiC wafer.

In this aspect, boron carbide abrasive grains and/or silicon carbide abrasive grains are used in the flattening process.

By using the material of such abrasive grains, the material cost can be reduced as compared with the diamond abrasive grains widely used in the conventional method.

In this aspect, the flattening processing is a free abrasive grain method.

In this aspect, the SiC wafer manufacturing method further includes: a chamfering process of chamfering an outer peripheral portion of the SiC wafer; and a stamp forming process of forming a stamp on a surface of the SiC wafer. The chamfering process and the stamp forming process are performed before the etching process.

In this aspect, the SiC wafer manufacturing method further includes: a chamfering process of chamfering an outer peripheral portion of the SiC wafer; and a stamp forming process of forming a stamp on a surface of the SiC wafer. The chamfering process and the stamp forming process are performed after the flattening process.

According to one aspect of the present invention for achieving the fifth object, a SiC wafer manufacturing method includes: a flattening process of flattening a SiC wafer; an etching process of etching the SiC wafer by heating under Si vapor pressure after the flattening process; and a chemical mechanical polishing process of performing chemical mechanical polishing on a surface of the SiC wafer after the etching process.

As described above, when the method includes the flattening process of flattening the SiC wafer, the etching process of removing the strain layer introduced in the wafer, and the chemical mechanical polishing process of mirrorizing the surface, a high-quality SiC wafer can be manufactured.

In this aspect, the SiC wafer manufacturing method further includes: a chamfering process of chamfering an outer peripheral portion of the SiC wafer; and a stamp forming process of forming a stamp on a surface of the SiC wafer. The chamfering process and the stamp forming process are performed before the etching process.

By performing the etching process after the chamfering process and the stamp forming process, it is possible to remove the outer peripheral portion formed by the chamfering process and the work-affected layer in the stamp formed by the stamp forming process.

In this aspect, the chamfering process and the stamp forming process are performed after the flattening process.

When the waviness of the SiC wafer is removed by performing the flattening process first as described above, it is possible to accurately form the stamp in the stamp forming process and determine the chamfering position in the chamfering process, and it is possible to improve the homogeneity of the wafer.

In this aspect, a process in which a work-affected layer is newly introduced into the SiC wafer is not included after the etching process.

When all the processes in which a work-affected layer is introduced in the SiC wafer are carried out before the etching process, it is possible to manufacture a high-quality SiC wafer.

In this aspect, the SiC wafer manufacturing method further includes: a chemical mechanical polishing process of performing chemical mechanical polishing on a surface of the SiC wafer following the etching process.

When the chemical mechanical polishing process is performed immediately after the etching process without interposing another process, it is possible to manufacture a high-quality SiC wafer.

In this aspect, in the chemical mechanical polishing process, chemical mechanical polishing is performed only on a (0001) surface side of the SiC wafer.

When the chemical mechanical polishing is performed only on the (0001) surface side of the SiC wafer, it is possible to manufacture a high-quality SiC wafer having a mirror surface and a satin surface.

In this aspect, boron carbide abrasive grains and/or silicon carbide abrasive grains are used in the flattening process.

By using the material of such abrasive grains, the material cost can be reduced as compared with the diamond abrasive grains.

In these aspects, an amount of the SiC wafer etched by the etching process is 10 μm or less per side.

Advantageous Effects of Invention

According to the disclosed technique, it is possible to provide a SiC wafer in which a detection rate of an optical sensor can improved and a SiC wafer manufacturing method.

Further, according to the disclosed technique, it is possible to provide a high-quality SiC wafer from which scratches and lattice strains are removed and a method for manufacturing the same.

Further, according to the disclosed technique, it is possible to provide a SiC wafer manufacturing method in which material loss can be reduced.

Further, according to the disclosed technique, it is possible to provide a new SiC wafer manufacturing method in which material loss can be reduced, and more SiC wafers can be manufactured from one ingot.

Further, according to the disclosed technique, it is possible to manufacture a high-quality SiC wafer.

Other objects, features and advantages will become apparent by reading the embodiments described below for carrying out the invention when taken in conjunction with the drawings and the claims.

BRIEF DESCRIPTION OF DRAWINGS

FIG. 8 is an image of a back surface of a SiC wafer of a first embodiment when observed with a white interference microscope.

FIG. 9 is an image of a back surface of a SiC wafer of a second embodiment when observed with the white interference microscope.

FIG. 10 is a graph illustrating a reflectance of the SiC wafer of the first embodiment.

FIG. 16 is an image of a cross section of a SiC wafer of a third embodiment when observed with the transmission electron microscope.

FIG. 17 is an image of a cross section of a SiC wafer of a fourth embodiment when observed with the transmission electron microscope.

FIG. 18 is an image of a cross section of a SiC wafer of a first comparative example when observed with the transmission electron microscope.

FIG. 19 is an image of a cross section of a SiC wafer of a second comparative example when observed with the transmission electron microscope.

DESCRIPTION OF EMBODIMENTS

Hereinafter, a detailed description of one embodiment of a SiC wafer of the present invention will be given, and then a detailed description of one embodiment of a SiC wafer manufacturing method of the present invention will be given.

Figure 22:
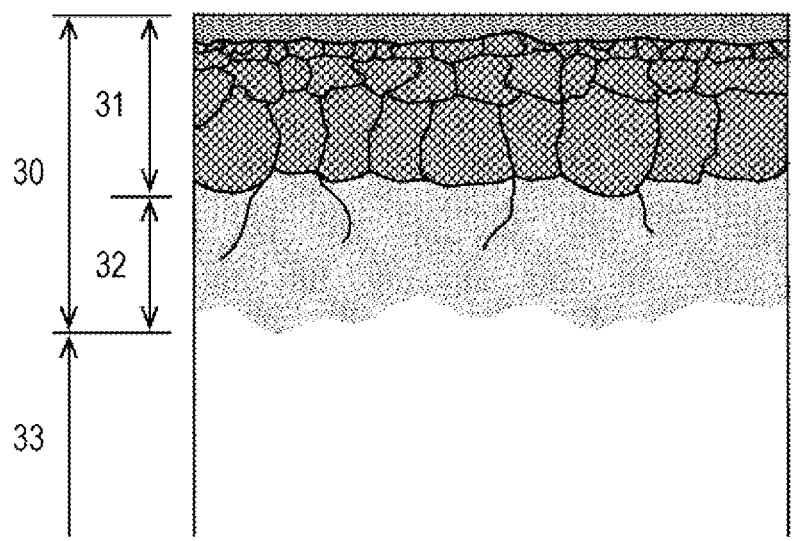
FIG. 22 is a conceptual diagram of a surface of a SiC wafer subjected to general machining processing when observed from a cross section.

Further, FIG. 22 illustrates a conceptual diagram of a surface of a wafer subjected to machining processing when observed from a cross section. A SiC wafer 20 is formed by slicing and flattening an ingot 10 of single crystal SiC. At this time, a work-affected layer 30 including a crack layer 31 having a large number of cracks (scratches) and a strain layer 32 in which the crystal lattice is distorted is introduced on the surface of the SiC wafer 20. Further, the work-affected layer 30 is also introduced even at the time of surface processing in which the wafer surface is selectively removed by laser processing or the like to form a stamp portion 25.

In order not to reduce the yield in the device manufacturing process, it is necessary to remove the work-affected layer 30. That is, it is preferable to expose a bulk layer 33 under the work-affected layer 30 in which cracks and lattice strains due to the surface processing are not introduced.

The SiC wafer 20 normally having the work-affected layer 30 has a warp due to the work-affected layer 30. A SORI value is one of indexes for evaluating a warped shape. In a case where measurement is made such that the back surface of the wafer is supported so as not to change an original shape, this SORI value refers to the sum of normal distances from the least squares plane calculated by a least squares method using all data on the surface of the wafer to the highest point and the lowest point on the surface of the wafer.

Figure 23:
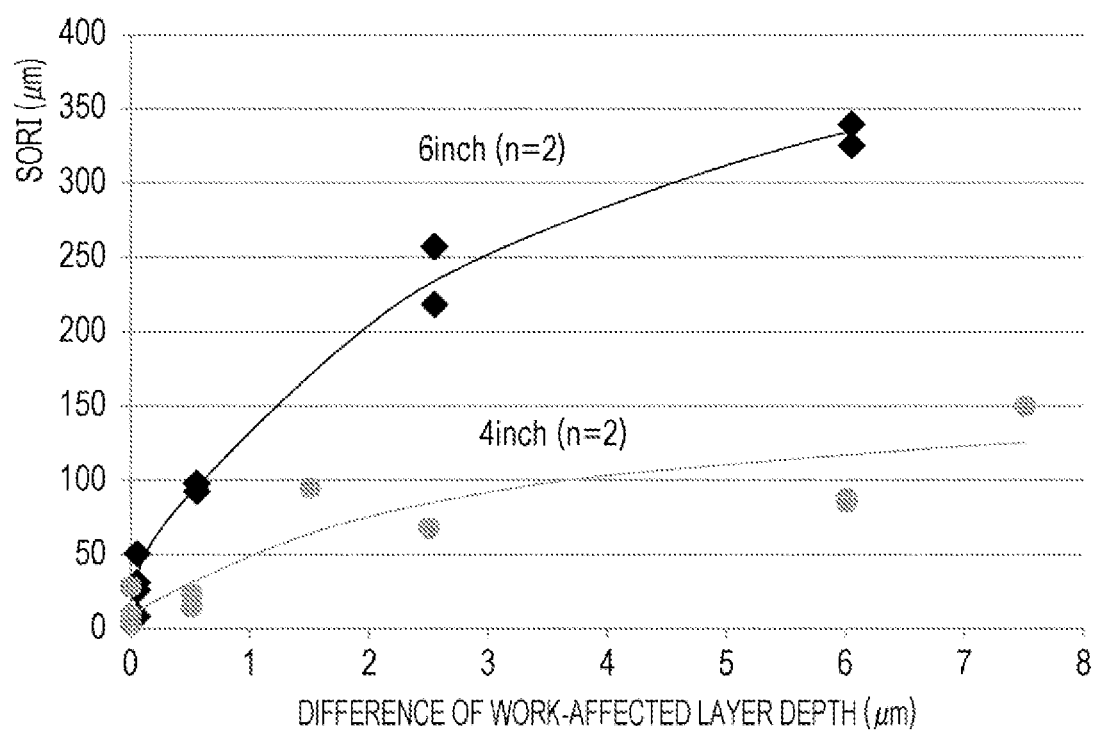
FIG. 23 is a graph illustrating a relationship between a work-affected layer depth and a warp (SORI value) in a single crystal SiC wafer.

It is newly found that when the diameter of the wafer enlarges, the SORI value becomes more susceptible to the influence of the work-affected layer 30. FIG. 23 illustrates a graph illustrating a relationship between the depth of the work-affected layer 30 and the SORI value in a single crystal SiC wafer. As illustrated in FIG. 23, it is found that when the depth of the work-affected layer 30 increases, the SORI value increases. Further, in a case where a six-inch single crystal SiC wafer is compared with a four-inch single crystal SiC wafer, it is found that the six-inch single crystal SiC wafer is more susceptible to the work-affected layer 30 and has a larger SORI value. Therefore, it is important to remove the work-affected layer 30 in order to reduce the warp of the SiC wafer.

Incidentally, in the description of this specification, the surface (specifically, the surface on which the epitaxial film is deposited) of the SiC wafer 20 on which a semiconductor element is formed is referred to as a main surface 21, and the surface facing the main surface 21 is referred to as a back surface 22. Further, the main surface 21 and the back surface 22 are collectively referred to as a surface. Incidentally, the main surface 21 can be exemplified by a (0001) surface, a (000-1) surface, a surface provided with an off angle of several degrees from these surfaces, and the like. (Incidentally, in this specification, in the notation of the Miller index, "–" means the bar attached to the index immediately after "–")

<<Sic Wafer>>
<SiC Wafer for Achieving First Object>

The SiC wafer 20 of the present invention for achieving the first object includes the mirror-finished main surface 21 and the satin-finished back surface 22.

Single crystal SiC has translucency and transmits visible light. Therefore, there is a problem that it is difficult to detect a wafer during a device manufacturing process by using an optical sensor. In the SiC wafer 20 of the present invention, the back surface 22 is a satin surface, and thus the detection rate by the optical sensor can be improved as compared with the conventional SiC wafer having both mirror surfaces.

Further, since the friction coefficient of the back surface of the wafer is large, it is hard to slip during conveyance or in the equipment, and it is easy to peel off from the electrostatic chuck type sample table, which has an advantage in the device manufacturing process.

In the description in this specification, the satin surface is a concept representing a surface on which fine irregularities are formed similarly to the epidermis of a pear fruit. Examples of the satin surface include a surface in which irregular and fine speckled irregularities are randomly combined in a non-directional manner, and a surface in which streaky irregularities extending in one direction are arranged.

In particular, the back surface 22 of the satin surface is provided so that the reflectance of visible light incident from the main surface 21 side of the mirror surface does not vary with each wavelength. On the other hand, in a case where both sides are mirror surfaces, the reflectance increases in a specific wavelength region due to light interference or the like, and the reflectance for each wavelength varies.

That is, by diffusing and scattering the light incident on the satin surface, it is possible to suppress interference and the like which occur in a specific wavelength region, and it is possible to reduce the difference in reflectance for each wavelength. Accordingly, it possible to improve the detection rate for various optical sensors using different wavelengths. Incidentally, the difference in reflectance for each wavelength in the visible light region is preferably 6% or less, more preferably 5% or less, and still more preferably the difference in reflectance is 4% or less.

In other words, it is desirable that the reflectance of visible light on the mirror surface side does not vary from wavelength to wavelength, and the difference in reflectance between wavelengths is 6% or less, more preferably 5% or less, and still more preferably the difference in reflectance is 4% or less.

As described above, in the SiC wafer 20 including the satin surface, the detection rate for optical sensors having various wavelengths can be improved by reducing the difference in reflectance for each wavelength. That is, in the satin surface, by diffusing and scattering the incident light, it is possible to suppress interference and the like which occur in a specific wavelength region, and it is possible to reduce the difference in reflectance for each wavelength.

The reflectance incident on the main surface 21 of the mirror surface is preferably 10% or more, more preferably 15% or more in the wavelength region of visible light. On the other hand, the reflectance of visible light incident on the back surface 22 of the satin surface is preferably 5% or less, more preferably 3% or less, and still more preferably 2% or less.

In the SiC wafer 20 having a satin surface having such a reflectance, the detection rate of the optical sensor used in the device manufacturing process is high. That is, such a satin surface has low reflectance and high visibility, and thus the wafer can be easily detected. Further, distinguishment from the mirror surface (main surface 21) is facilitated, and the inspection and diagnosis can be performed appropriately without erroneously focusing on the back surface 22 when trying to focus on the main surface 21 even in an inspection process of a wafer or an assembly.

Although numerical expression is not possible, the surface shape of the satin surface is preferably a structure in which a plurality of gently convex portions having different diameters are arranged in a scaly shape. When the satin surface is formed in such a shape, the advantage in the device manufacturing process can be further improved.

Incidentally, in the description of this specification, the term of reflectance means, when the surface of the SiC wafer is irradiated with an electromagnetic wave having a wavelength of 300 to 1500 nm, the ratio of the irradiated electromagnetic wave reflected on the surface. Further, in the description in this specification, the term of visible light means an electromagnetic wave having a wavelength of 360 to 830 nm.

The external transmittance of visible light including the interface of the SiC wafer 20 is preferably 25% or less. The SiC wafer 20 having such an external transmittance has a high detection rate of the optical sensor, and it is possible to suppress a detection error in the device manufacturing process.

Incidentally, in the description of this specification, the term of external transmittance means, when the main surface 21 or the back surface 22 of the SiC wafer is irradiated with an electromagnetic wave having a wavelength of 300 to 1500 nm, the ratio of the electromagnetic wave transmitted through the SiC wafer 20.

The thickness (wafer thickness) of the SiC wafer 20 is preferably 1 mm or less, more preferably 500 μm or less, and still more preferably 50 to 350 μm.

Even when the SiC wafer 20 is set to such a thin thickness, the detection rate of the optical sensor can be improved since the back surface 22 is satin finished.

An arithmetic mean roughness Ra of the satin surface is preferably 50 to 300 nm, more preferably 75 to 200 nm.

Further, a maximum height Rz of the satin surface is preferably 0.5 to 5 μm, more preferably 0.75 to 2.5 μm.

When the roughness of the satin surface is formed with such a value, advantages such as easy distinguishment of the main surface and the back surface of the SiC wafer 20, prevention of slipping during conveyance or in a equipment by the increase in friction coefficient of the back surface of the wafer, and easy peeling off from the electrostatic chuck type sample table are strongly demonstrated.

Further, it is possible to more strongly suppress problems such as easy adhesion of particles and deterioration of the flatness of the wafer when chucking to the sample table.

Incidentally, in the description of this specification, the arithmetic mean roughness Ra and the maximum height Rz refer to the arithmetic mean roughness and the maximum height conforming to Japanese Industrial Standards (JIS) B0601-2001.

Further, although numerical expression is not possible, it is preferable that the surface shape of the satin of the SiC wafer 20 of the present invention has a structure which has a convex portion having a smooth edge with fine burrs removed.

On the other hand, the arithmetic mean roughness Ra of the mirror surface is preferably 0.05 to 0.3 nm, more preferably 0.05 to 0.1 nm.

Further, the maximum height Rz of the mirror surface is 0.2 to 1.2 μm, more preferably 0.2 to 0.4 μm.

When the surface of the mirror surface is formed in this way, distinguishment of the main surface and the back surface of the wafer is facilitated.

The SiC wafer 20 may include an orientation flat 24 and the stamp portion 25. Further, the shape of the SiC wafer 20 is not particularly limited, and is typically a thin disk shape.

<SiC Wafer for Achieving Second Object>

In the SiC wafer 20 of the present invention for achieving the second object, the work-affected layer 30 is not substantially present. That is, the work-affected layer 30 is not substantially present on any of the main surface 21 on which the semiconductor element is made, the back surface 22 facing the main surface 21, the outer peripheral portion 23, the notch portions such as the orientation flat 24 and a notch, and the stamp portion 25. In other words, it is desirable that a lattice strain other than the lattice strain derived from surface reconstruction is not substantially present. In other words, in the bulk layer 33 adjacent to the main surface 21 and the back surface 22, a lattice strain other than the lattice strain derived from the surface reconstruction is not substantially present.

Further, it is desirable that the crystal lattice under the surface (the main surface 21 and the back surface 22) of the SiC wafer 20 does not have lattice strain. In other words, it is desirable to include the main surface 21, the bulk layer 33 provided directly below the main surface 21, and the back surface 22 provided directly below the bulk layer 33.

Here, "the work-affected layer is not substantially present" means that there is no work-affected layer enough to affect the device manufacturing process. For example, there is no work-affected layer having a lattice strain amount of more than 0.01% which will be described later.

"A lattice strain other than the lattice strain derived from the surface reconstruction is not substantially present" means that there is no lattice strain enough to affect the device manufacturing process. For example, the amount of lattice strain other than the surface of the single crystal SiC configuring the SiC wafer 20 is 0.01% or less.

The lattice strain does not occur in the entire SiC wafer 20 as described above, and thus it is possible to provide the SiC wafer 20 which is preferable for the device manufacturing process.

Incidentally, in the description of this specification, the term of lattice strain means a lattice strain excluding the lattice strain derived from surface reconstruction.

Incidentally, in the description of this specification, the term of lattice strain amount means the amount of deviation when the crystal lattice of the bulk layer 33 in FIG. 22 is compared with the crystal lattice of the strain layer and is expressed as "%" since the lattice strain amount is just a numerical value representing the ratio.

The lattice strain under the surface of the SiC wafer 20 can be determined by comparing with a reference crystal lattice as a reference. The examples of a means for measuring this lattice strain may include an SEM-EBSD method. The SEM-EBSD method is a method (electron back scattering diffraction: EBSD) that enables strain measurement in a minute region based on the Kikuchi line diffraction pattern obtained by electron backscatter diffraction in a scanning electron microscope (SEM). In this method, a lattice strain amount can be obtained by comparing the diffraction pattern of the reference crystal lattice as a reference with the diffraction pattern of the measured crystal lattice.

As the reference crystal lattice, for example, a reference point R is set in a region where a lattice strain is not considered to occur. That is, it is desirable to arrange the reference point R in the region of the bulk layer 33 in FIG. 22. Normally, it is a well-established theory that the depth of the work-affected layer 30 is about 10 μm. Therefore, the reference point R may be set at a position of a depth of about 20 to 30 μm which is considered to be sufficiently deeper than the work-affected layer 30.

Next, the diffraction pattern of the crystal lattice at the reference point R is compared with the diffraction pattern of the crystal lattice in each measurement region measured at a pitch on the order of nanometers. Accordingly, it is possible to calculate a lattice strain amount in each measurement region with respect to the reference point R.

A case is described in which the reference point R which is considered to have no lattice strain is set as the reference crystal lattice. However, of course, the ideal crystal lattice of single crystal SiC may be used as the reference, and a crystal lattice occupying the majority (for example, a half or more) in the measuring region surface may be used as the reference.

As a method for determining the lattice strain amount under the surface of the SiC wafer 20, a general-purpose stress measurement method may be adopted, and examples thereof may include Raman spectroscopy, X-ray diffraction, and electron diffraction.

The crystal lattice under the surface of the SiC wafer 20 of the present invention has a lattice strain amount of preferably 0.01% or less, more preferably 0.005% or less, and still more preferably 0.001% or less with respect to the reference crystal lattice.

As described above, when the lattice strain amount is 0.01% or less, it is possible to suppress the occurrence of defects due to lattice strain in the subsequent device manufacturing process, and it is possible to provide a high-quality SiC wafer 20.

Further, it is found that when the lattice strain amount is 0.01% or less as described above, almost no stress is generated in the SiC wafer 20, and the strain layer which is difficult to remove among the work-affected layers is removed.

The thickness (wafer thickness) of the SiC wafer 20 is preferably 1 mm or less, more preferably 500 μm or less, and still more preferably 50 to 350 μm.

Even when the SiC wafer 20 is set to such a thin thickness, the detection rate of the optical sensor can be improved since the back surface 22 is satin finished.

The external transmittance of visible light including the interface of the SiC wafer 20 is preferably 25% or less. The SiC wafer 20 having such an external transmittance has a high detection rate of the optical sensor, and it is possible to suppress a detection error in the device manufacturing process.

Incidentally, in the description of this specification, the term of external transmittance means, when the main surface 21 or the back surface 22 of the SiC wafer is irradiated with an electromagnetic wave having a wavelength of 300 to 1500 nm, the ratio of the electromagnetic wave transmitted through the SiC wafer 20.

In the SiC wafer according to the present invention, the SORI value does not change when the SiC wafer is heated in the temperature range of 1500 to 2000° C. That is, the work-affected layer 30 is removed in the entire area of the SiC wafer 20, and thus the warp due to the work-affected layer 30 does not occur in the subsequent device manufacturing process.

Incidentally, "the SORI value does not change" in this specification means that there is no change in the SORI value due to the work-affected layer 30. For example, a change in the SORI value due to lattice strain, damage, and the like introduced in the device manufacturing process after the epitaxial growth process, ion implantation process, and the like is not included.

Incidentally, in the SiC wafer 20 according to the present invention, the work-affected layer 30 is removed not only on the main surface 21 and the back surface 22 but also on the outer peripheral portion 23, notch portions such as the orientation flat 24 and the notch, and the stamp portion 25 which are difficult to machine. Therefore, it is possible to suppress defects and the like due to the work-affected layer 30 in the subsequent device manufacturing process.

The SiC wafer 20 according to the present invention may solve the above-described first and second objects at the same time.

The method for manufacturing the SiC wafer 20 of the present invention is not particularly limited, but the manufacturing method of the present invention described later is preferably used for manufacturing. Hereinafter, the manufacturing method of the present invention will be described.

<<SiC Wafer Manufacturing Method>>

Hereinafter, the SiC wafer manufacturing method of the present invention will be described in more detail with reference to FIGS. 1 to 7. The drawings illustrate preferable embodiments. However, the present invention can be implemented in many different embodiments and is not limited to the embodiments described in this specification.

Incidentally, in understanding the present invention, it is recognized that it is useful to compare with the conventional SiC wafer manufacturing process. Therefore, each process in the SiC wafer manufacturing method of the present invention will be described with reference to FIGS. 24 to 27 as appropriate while comparing with each process in the conventional SiC wafer manufacturing method.

Hereinafter, the SiC wafer manufacturing method of the present invention for achieving the first to fifth objects will be described in accordance with the process sequence illustrated in FIGS. 1 to 7.

<SiC Wafer Manufacturing Method for Achieving First Object>

Figure 1:
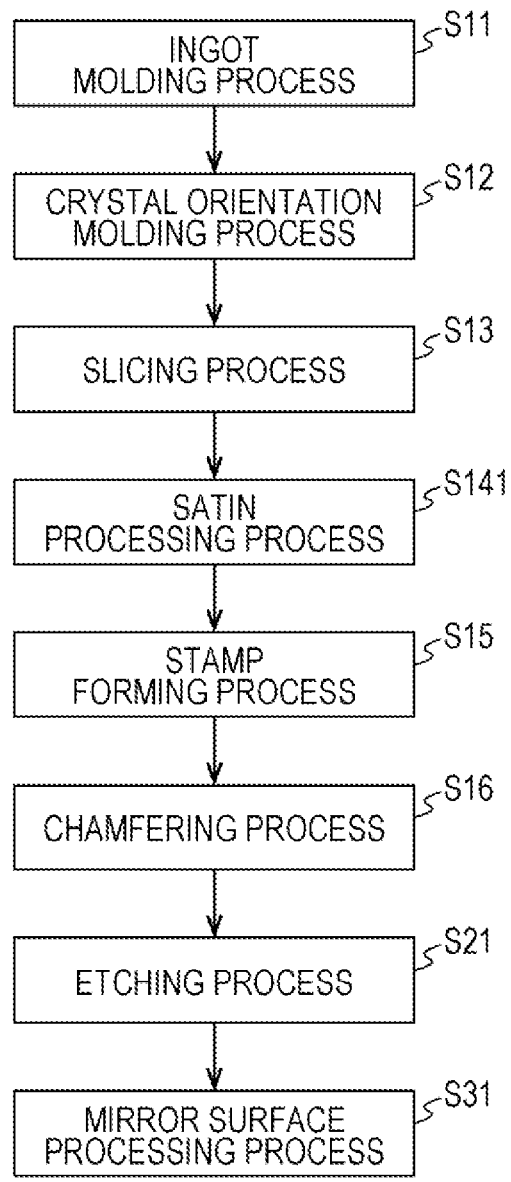
FIG. 1 is a schematic diagram illustrating a SiC wafer manufacturing process for achieving a first object.
Figure 2:
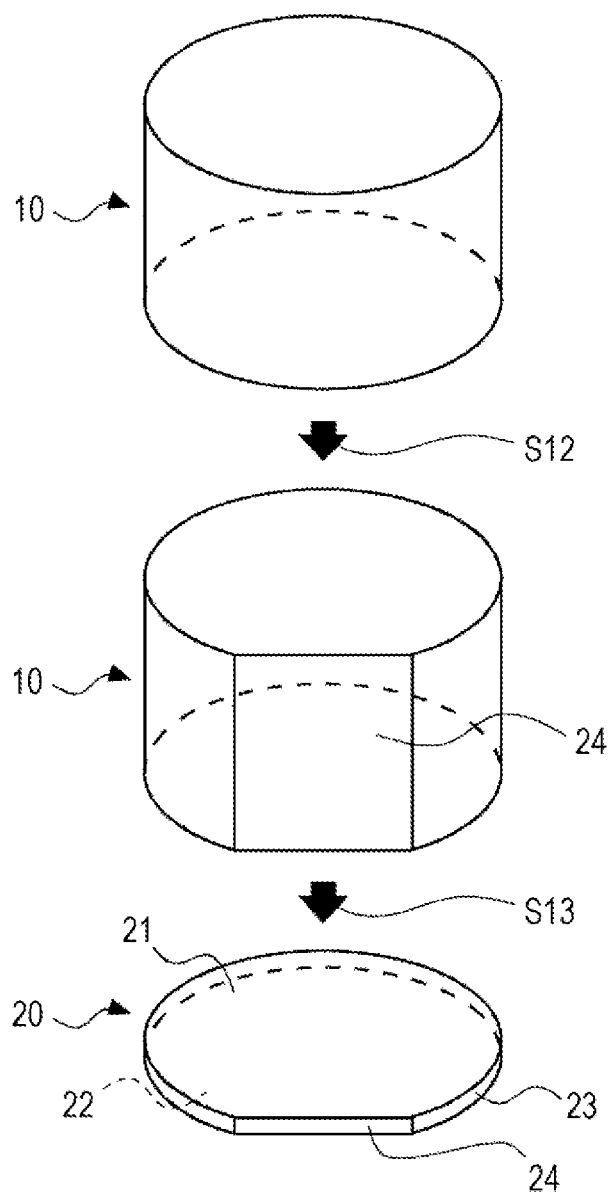
FIG. 2 is an explanatory diagram illustrating a process from an ingot to a wafer in the SiC wafer manufacturing process for achieving the first to fifth objects.
Figure 3:
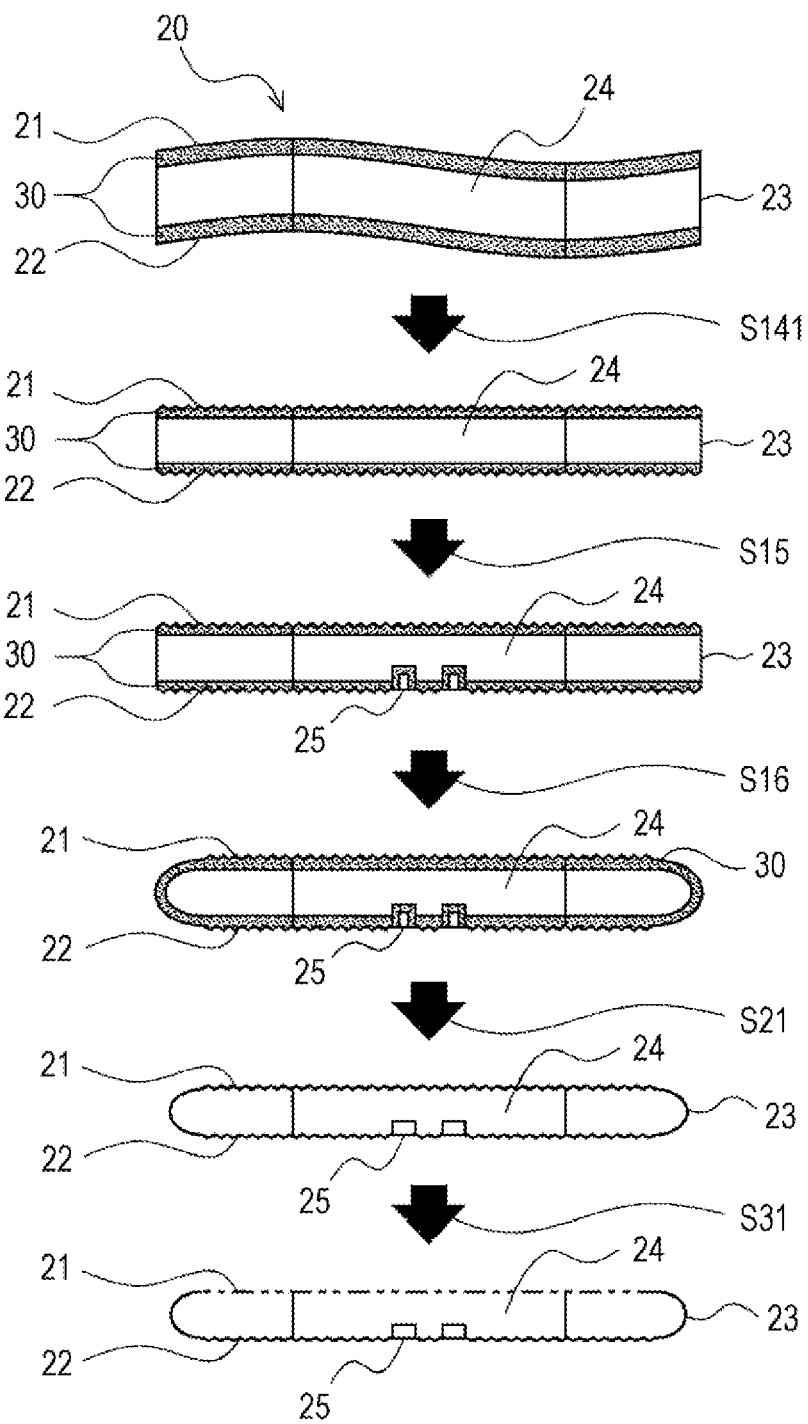
FIG. 3 is an explanatory diagram illustrating the SiC wafer manufacturing process for achieving the first object and the second object.

FIGS. 1 to 3 are SiC wafer manufacturing processes for achieving the first object.

The SiC wafer manufacturing method of the present invention for achieving the first object includes an ingot molding process (step S11) of processing a mass of a crystal-grown single crystal SiC into a columnar ingot 10, a crystal orientation molding process (step S12) of forming a notch portion in a part of the outer periphery so as to be a mark indicating the crystal orientation of the ingot 10, a slicing process (step S13) of processing the ingot 10 into a thin disk-shaped SiC wafer 20 by slicing, a satin finishing process (step S141) of making at least the back surface 22 of the SiC wafer 20 a satin surface, a stamp forming process (step S15) of forming a stamp portion 25, a chamfering process (step S16) of chamfering an outer peripheral portion 23, an etching process (step S21) of etching at least the back surface 22 of the SiC wafer 20 by heating under Si vapor pressure, and a mirror surface processing process (step S31) of making the main surface 21 of the SiC wafer 20 a mirror surface.

Incidentally, the ingot molding process Sl1 to the chamfering process S16 are a wafer shape forming process S10, the etching process S21 is a work-affected layer removing process S20, and the mirror surface processing process S31 is a mirror surface polishing process S30.

Hereinafter, each process will be described.

(1) Ingot Molding Process

The ingot molding process S11 is a process of processing a mass of a crystal-grown single crystal SiC into the columnar ingot 10. The ingot 10 is normally processed such that the longitudinal direction of the column is the <0001> direction.

In the SiC wafer manufacturing method of the present invention, the work-affected layer 30 introduced in the ingot molding process Sl1 can be removed by combining with the etching process S21 which is a subsequent process.

(2) Crystal Orientation Molding Process

The crystal orientation molding process S12 is a process of forming a notch portion in a part of the outer periphery of the ingot so as to be a mark indicating the crystal orientation of the ingot 10 formed in the ingot molding process S11. Examples of this notch portion include a plane (orientation flat 24) parallel to the <11-20> direction and grooves (notches) provided at both ends in the <11-20> direction. The notch portion is formed so that the crystal orientation of single crystal SiC can be specified.

In the SiC wafer manufacturing method of the present invention, the work-affected layer 30 introduced in the crystal orientation molding process S12 can be removed by combining with the etching process S21 which is a subsequent process.

(3) Slicing Process

The slicing process S13 is a process of slicing the ingot 10 to obtain a thin disk-shaped SiC wafer 20.

The examples of a slicing means in the slicing process S13 may include multi-wire saw cutting of cutting the ingot 10 at predetermined intervals by reciprocating a plurality of wires, a discharge processing method for intermittently generating and cutting plasma discharge, and cutting of radiating and condensing a laser beam in the ingot 10 to form a layer to be a base point of cutting and using a laser beam.

In the SiC wafer manufacturing method of the present invention, the work-affected layer 30 introduced in the slicing process S13 can be removed by combining with the etching process S21 which is a subsequent process. In particular, it is desirable to completely remove the work-affected layer 30 introduced into the surface which is the device forming surface since the work-affected layer 30 causes a decrease in yield in the device manufacturing process.

(4) Satin Finishing Process

The satin finishing process S141 is a process of forming a satin surface on at least the back surface 22 of the SiC wafer 20. As a satin finishing means in the satin finishing process S141, a conventional means capable of forming a satin surface can be adopted. The examples thereof may include sand blasting processing of spraying fine granular grinding material to the wafer surface by using air compressed by a compressor, fixed abrasive grain processing (grind grinding or the like) of performing processing by a grindstone embedding abrasive grains in a bond material, and free abrasive grain processing (wrapping polishing or the like) of performing processing while scattering fine abrasive grains over a surface plate. More preferably, the fixed abrasive grain processing and the free abrasive grain processing which can simultaneously perform flattening to remove the "waviness" introduced into the SiC wafer 20 in the slicing process S13 are preferably used.

Hereinafter, the processing method, processing conditions, and properties of abrasive grains in the preferable satin finishing process S141 of the SiC wafer manufacturing method of the present invention will be described.

(4-1) Processing Method

As a preferable processing method for the satin finishing process S141, the free abrasive grain processing (wrapping polishing or the like) of performing processing while scattering fine abrasive grains on a surface plate is preferably used. Incidentally, it is desirable that the abrasive grains are dropped as a mixed solution (slurry) obtained by mixing water and a dispersant. As the processing equipment used in this process, a general-purpose processing equipment used in conventional free abrasive grain processing can be adopted. Further, a method of processing both sides at the same time may be used, or a method of processing one side may be used.

In the satin finishing process S141, it is preferable to process the SiC wafer 20 while crushing the abrasive grains. That is, when comparing the average abrasive grain size before processing and the average abrasive grain size after processing in the satin finishing process S141, it is desirable that the abrasive grains are crushed after processing so that the abrasive grain size becomes finer.

Here, the average abrasive grain size of the abrasive grains used in the satin finishing process S141 affects the processing speed. More specifically, there is a relation that a large processing speed can be realized in a case where a large abrasive grain is used, and the processing speed is reduced in a case where a small abrasive grain is used.

Therefore, if the satin finishing process S141 is performed while crushing the abrasive grains, the surface of the SiC wafer 20 can be rapidly processed at a large processing speed at the start stage of the satin finishing process S141. On the other hand, when the processing progresses and the abrasive grains become smaller, the processing speed gradually decreases. At the final stage of the process, delicate processing on the surface of the SiC wafer 20 can be realized to suppress the roughness of the satin surface introduced on the surface of the SiC wafer from becoming excessively large.

When the etching process S21 is executed on the satin surface formed as above, the SiC wafer 20 having the satin surface suitable for the device manufacturing process can be manufactured.

Incidentally, by using the brittle abrasive grains described later, it is possible to carry out the invention in which the satin finishing process S141 is performed while crushing the abrasive grains.

Further, it is possible to carry out the invention in which the satin finishing process S141 is performed while crushing the abrasive grains under the processing conditions in the satin finishing process S141 described later.

In the aspect in which the satin finishing process S141 is performed while crushing the abrasive grains, the average abrasive grain size of the abrasive grains before processing is preferably 20 µm or more, more preferably 40 µm or more.

By using abrasive grains having an average abrasive grain size in the above range in the state before processing, rapid processing becomes possible at the start stage of the satin finishing process S141.

In the SiC wafer manufacturing method of the present invention, it is preferable that abrasive grains having an average abrasive grain size of preferably 100 µm or less, more preferably 80 µm or less, and still more preferably 60 µm or less are used at least at the start stage of the satin finishing process S141.

When the upper limit of the average abrasive grain size of the abrasive grains to be used at the start stage of the satin finishing process S141 is set in the above range, the depth of the work-affected layer 30 introduced into the SiC wafer 20 by the satin finishing process S141 can be reduced.

On the other hand, it is preferable to perform the satin finishing process S141 while crushing the abrasive grains such that the average abrasive grain particles after processing have a size of preferably less than 20 µm and more preferably 10 µm or less.

When the satin finishing process S141 is executed while crushing the abrasive grains such that the average abrasive grain particles after processing are within the above range, the roughness of the satin introduced into the SiC wafer 20 can be reduced, and it is possible to realize the surface state of the SiC wafer 20 suitable for the etching process S21 described later.

In the SiC wafer manufacturing method of the present invention, it is preferable that abrasive grains having an average abrasive grain size of preferably 0.5 µm or more and more preferably 1 µm or more are used at least at the final stage of the satin finishing process S141.

When the lower limit of the average abrasive grain size of the abrasive grains to be used at the start stage of the satin finishing process S141 is set in the above range, the surface of the SiC wafer 20 can be efficiently processed.

The following is a specific example of a case where the satin finishing process S141 is performed while crushing the abrasive grains.

The satin finishing process S141 is performed with $B_4C$ abrasive grains having an average abrasive grain size of 40 µm under the conditions of a processing pressure of 150 $g/cm^2$ and a processing time of 20 minutes, and the etching process S21 described later is performed, thereby forming a satin surface equivalent to the conventional Si wafer. At this time, the average abrasive grain size after processing in the satin finishing process S141 is 10 µm or less. The average processing speed obtained by removing the processing depth of 20 µm of the SiC wafer 20 in this process by the processing time is 1 µm/min.

(4-2) Properties of Abrasive Grains

In the SiC wafer manufacturing method of the present invention, it is desirable to perform processing while crushing the abrasive grains in the satin finishing process 141 under the free abrasive grain method. That is, it is preferable that the abrasive grains used in the present invention are brittle enough to be easily crushed by the free abrasive grain method.

More specifically, it is preferable to use abrasive grains made of a material that satisfies the following brittleness conditions.

(Brittleness condition) When the both sides of the surface of the SiC wafer are satin finished at the same time with abrasive grains adjusted to an average abrasive grain size of 40 µm under the condition of processing pressure of 150 $g/cm^2$ by the free abrasive grain method, the average abrasive grain size becomes 20 µm or less after the lapse of processing time of 20 minutes.

In the satin finishing process S141, abrasive grains having a modified Mohs hardness of less than 15 are preferably used.

In the description of this specification, the modified Mohs hardness is a value indicating a measure of the hardness of a substance when talc is 1, and diamond is 15. That is, in this process, abrasive grains having a hardness less than that of diamond are used. Specific examples of the abrasive grain material include boron carbide ($B_4C$), silicon carbide (SiC), and alumina ($Al_2O_3$). In addition thereto, any abrasive grain having a hardness of less than a modified Mohs hardness of 15 can be naturally adopted.

As described above, by using abrasive grains having a hardness lower than that of diamond, the roughness of the satin surface can be suppressed. That is, since the diamond abrasive grains have extremely high hardness compared to the SiC wafer 20 to be processed, a crush to a small size is hardly performed in the process of the satin finishing process S141, scratches or the like are introduced to a deep position on the surface of the SiC wafer 20, and the satin surface becomes rough.

Further, it is desirable that the abrasive grains used in this process are abrasive grains having a modified Mohs hardness of 13 or more. Specific examples of abrasive grain material include boron carbide ($B_4C$) and silicon carbide (SiC).

In this way, the SiC wafer 20 can be efficiently processed by adopting abrasive grains having a modified Mohs hardness of 13 or more. That is, by adopting a hardness equal to or higher than that of the SiC wafer 20 to be processed, processing can be performed efficiently.

Above all, it is desirable to adopt boron carbide ($B_4C$) abrasive grains in consideration of the cost and processing speed of the abrasive grains. That is, boron carbide ($B_4C$) abrasive grains can be obtained at low cost, and can be processed at high speed and efficiently as compared with silicon carbide abrasive grains.

Incidentally, in the description of this specification, the average abrasive grain size refers to the average particle size conforming to Japanese Industrial Standards (JIS) R6001-2: 2017.

(4-3) Processing Conditions

The processing pressure in the free abrasive grain processing in the satin finishing process S141 is 100 to 300 g/cm² and more preferably 150 to 200 g/cm².

Further, the rotation speed of the surface plate in this processing is 5 to 20 rpm and more preferably 10 to 15 rpm.

Further, the processing time in this processing is 5 to 30 minutes and more preferably 5 to 15 minutes.

The waviness introduced into the SiC wafer 20 in the slicing process S13 is normally 30 to 50 µm per side. In this satin finishing process S141, in addition to the satin finishing, the SiC wafer 20 can be flattened at the same time, and in order to remove the waviness, processing is performed from the main surface 21 and the back surface 22 of the SiC wafer 20 to a depth of 30 to 50 µm.

Although a case in which abrasive grains having a hardness lower than that of diamond is used is described as a preferable aspect of the satin finishing process S141, it is also possible to use diamond abrasive grains.

Further, although the free abrasive grain processing is described as a preferable aspect of the satin finishing process S141, it is also possible to adopt the fixed abrasive grain processing. As processing conditions, for example, diamond abrasive grains with an average abrasive grain size of 3 to 30 µm are used, a grindstone rotation speed is 1000 to 1500 rpm, a cutting pitch is 1 to 3 µm, a front-back feed is 150 to 250 m/min, a left-right feed is 15 to 25 m/min, and a processing speed is 50 to 150 µm/hour.

Incidentally, a general-purpose processing equipment used in conventional fixed abrasive grain processing can be adopted.

Further, it is also possible to adopt a conventional flattening process S17 (see FIG. 24) of a conventional method as the satin finishing process S141.

In the present invention, the surface processing method of the main surface 21 is not limited.

After the slicing process S13, the main surface 21 is not necessarily surface-processed. Further, after the slicing process S13, the subsequent etching process S21 may be immediately performed without particularly performing the flattening.

In a preferable embodiment of the present invention, the main surface 21 is subjected to a flattening process after the slicing process S13. As a processing method in the flattening process, a fixed abrasive grain method can be adopted as well as the free abrasive grain method. In the processing method in the flattening process, it is particularly preferable to adopt the free abrasive grain method.

In the embodiment in the case of surface processing the main surface 21 by the free abrasive grain method, the description of the free abrasive grain processing method described as the preferable aspect of the satin finishing process S141 described above can be applied as it is.

In a case where the satin finishing by the free abrasive grain method is performed on the back surface 22 in the satin finishing process S141, the main surface 21 may be flattened by the free abrasive grain method under the same conditions, and the main surface 21 may be flattened by a processing method different from that of the back surface 22.

A preferable embodiment of the SiC wafer manufacturing method of the present invention includes the stamp forming process S15 and the chamfering process S16 (see FIGS. 1 and 3).

(5) Stamp Forming Process

The stamp forming process S15 is a process of radiating and condensing a laser beam on the back surface 22 (or main surface 21) of the SiC wafer 20 to selectively remove the surface of the SiC wafer 20 and form the stamp portion 25. Examples of a stamp forming means in the stamp forming process S15 include laser processing. The stamp portion 25 includes information for distinguishing the SiC wafer 20 (specifically, characters, symbols, barcodes, and the like).

(6) Chamfering Process

The chamfering process S16 is a process of chamfering the outer peripheral portion 23 of the SiC wafer 20 by machining or the like. Examples of the chamfering means in the chamfering process S16 include grinding and tape polishing. This chamfer may be a round chamfer in which a predetermined arc is formed on the outer peripheral portion 23 or may be a chamfer which is cut obliquely at a predetermined angle.

The order of the satin finishing process S141, the stamp forming process S15, and the chamfering process S16 is not limited to that illustrated in FIGS. 1 and 3, but the satin finishing process S141 is preferably performed prior to the stamp forming process S15 and the chamfering process S16.

When the waviness of the wafer is removed by performing the satin finishing process S141 first in this way, it is possible to accurately form the stamp portion 25 in the stamp forming process S15 and determine the chamfering position in the chamfering process S16, and it is possible to improve the homogeneity of the wafer.

The order of the stamp forming process S15 and the chamfering process S16 is not particularly limited, but the chamfering process S16 may be performed after the stamp forming process S15 as illustrated in FIGS. 1 and 3. When the stamp forming process S15 is carried out before the chamfering process S16 in this way, the main surface 21 and the back surface 22 can be managed at an early stage, and problems in product management are unlikely to occur.

Further, the stamp forming process S15 may be carried out after the chamfering process S16. In this case, a variation in the wafer diameter can be suppressed, and the formation position of the stamp portion 25 can be accurately determined.

(7) Etching Process

The etching process S21 is a process of etching at least the back surface 22 of the SiC wafer 20 by heating under Si vapor pressure. More specifically, the etching process S21 is a process of forming the satin surface introduced into the SiC wafer 20 in the preceding process into a state (including waviness, irregularity shape, roughness, and the like) preferable for the device manufacturing process by heating and etching under Si vapor pressure.

The SiC wafer manufacturing method of the present invention has a remarkable effect that the satin surface preferable for the device manufacturing process can be formed on at least the back surface 22 of the SiC wafer 20 which is a difficult-to-process material by combining the satin finishing process S141 and the etching process S21.

Further, in the etching process S21 of heating and etching under Si vapor pressure, it is possible to remove the work-affected layer 30 introduced into the SiC wafer 20 in the preceding process. Therefore, as illustrated in FIGS. 1 and 3, the etching process S21 is preferably performed after the wafer shape forming process including the satin finishing process S141, the stamp forming process S15, and the chamfering process S16. Accordingly, in addition to the main surface 21 and the back surface 22, the outer peripheral portion 23, the orientation flat 24, and the work-affected layer 30 introduced around the stamp portion 25 can be removed, which can contribute to improving the quality of the SiC wafer 20.

Figure 24:
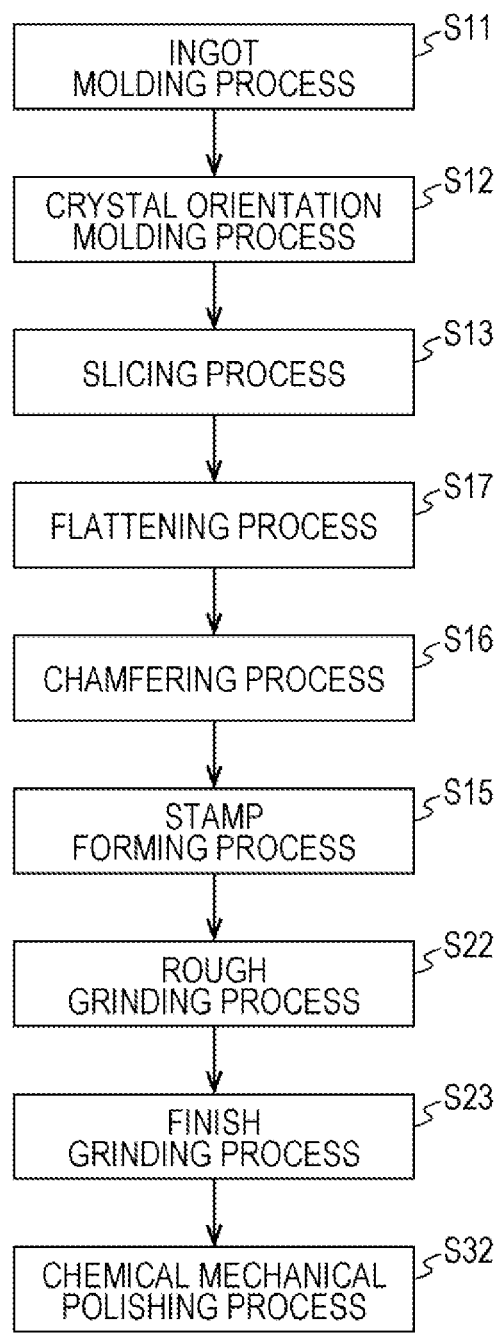
FIG. 24 is a schematic diagram illustrating a conventional SiC wafer manufacturing process.
Figure 25:
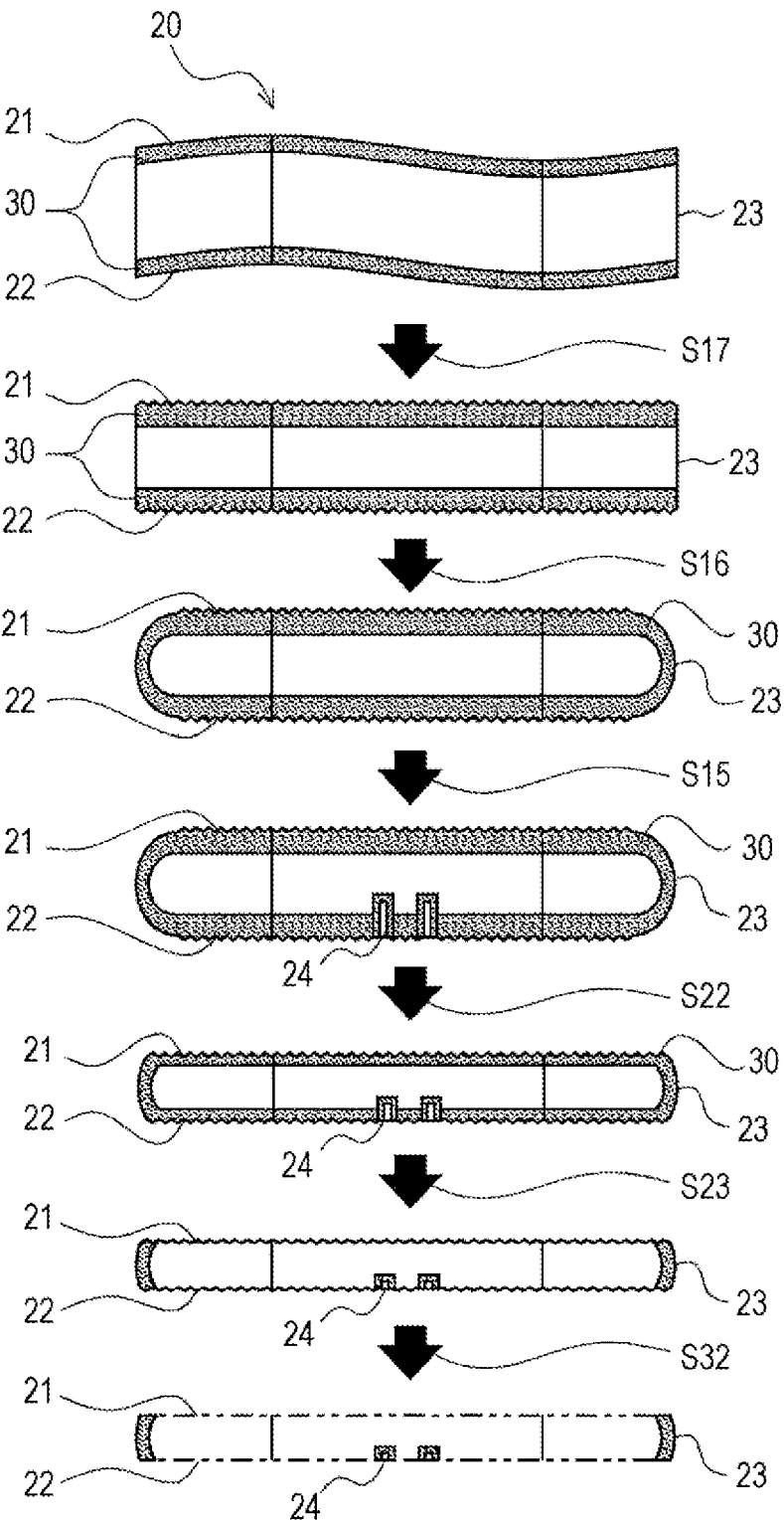
FIG. 25 is an explanatory diagram illustrating the conventional SiC wafer manufacturing process.

On the other hand, as illustrated in FIGS. 24 and 25, in a rough grinding process S22 and a finish grinding process S23 which are performed by the conventional SiC wafer manufacturing method, the outer peripheral portion 23, the orientation flat 24, and the work-affected layer 30 introduced around the stamp portion 25 cannot be removed, which becomes a factor for deteriorating the quality of the SiC wafer 20.

In the SiC wafer manufacturing method of the present invention, when the etching process S21 is performed after the ingot molding process S11 to the stamp forming process S15, the outer peripheral portion 23, the orientation flat 24, and the work-affected layer 30 introduced around the stamp portion 25 which are cannot be processed until now can be also removed in addition to the main surface 21 and the back surface 22, and the method has a remarkable effect of contributing to the improvement of the quality of the SiC wafer 20.

In the etching process S21 adopted in the SiC wafer manufacturing method of the present invention, both sides can be etched at the same time, and thus the warp of the wafer due to the Twyman effect does not occur.

In the etching process S21, it is desirable to etch the SiC wafer 20 by preferably 0.5 µm or more and more preferably 1 µm or more per side.

When the etching amount is set within the above range, a more preferable satin surface can be formed by removing burrs and the like generated in the satin finishing process S141.

When the etching progresses in the etching process S21 (the etching amount increases), the arithmetic mean roughness Ra and the maximum height Rz of the satin surface can be reduced. That is, this etching process S21 has a roughness adjusting process in which the roughness of the satin surface is adjusted by controlling the etching amount.

Accordingly, a remarkable effect is exhibited in which the satin surface having a desired roughness can be formed on at least the back surface 22 of the SiC wafer 20 which is a difficult-to-process material.

Specifically, in the etching process S21, the SiC wafer 20 may be etched by preferably 3 µm or more, more preferably 6 µm or more, still more preferably 9 µm or more, still more preferably 10 µm or more, and still more preferably 12 µm or more per side.

When the etching amount is set within the above range, the arithmetic mean roughness Ra and the maximum height Rz of the satin surface can be set within the preferable ranges.

The upper limit of the etching amount in the etching process S21 is not particularly limited, but preferably 100 µm or less and more preferably 80 µm or less can be set as a standard for the SiC wafer 20 per side.

Desirably, the etching amount in the etching process S21 is preferably 10 µm or less, more preferably 6 µm or less, and still more preferably 3 µm or less from the viewpoint of reducing the amount of material loss.

Hereinafter, the etching process S21 will be described in more detail.

First, an example of a equipment configuration used in Si vapor pressure etching will be described with reference to FIG. 4. Next, the etching mechanism and etching conditions of Si vapor pressure etching will be described.

(7-1) Equipment Configuration

Figure 4:
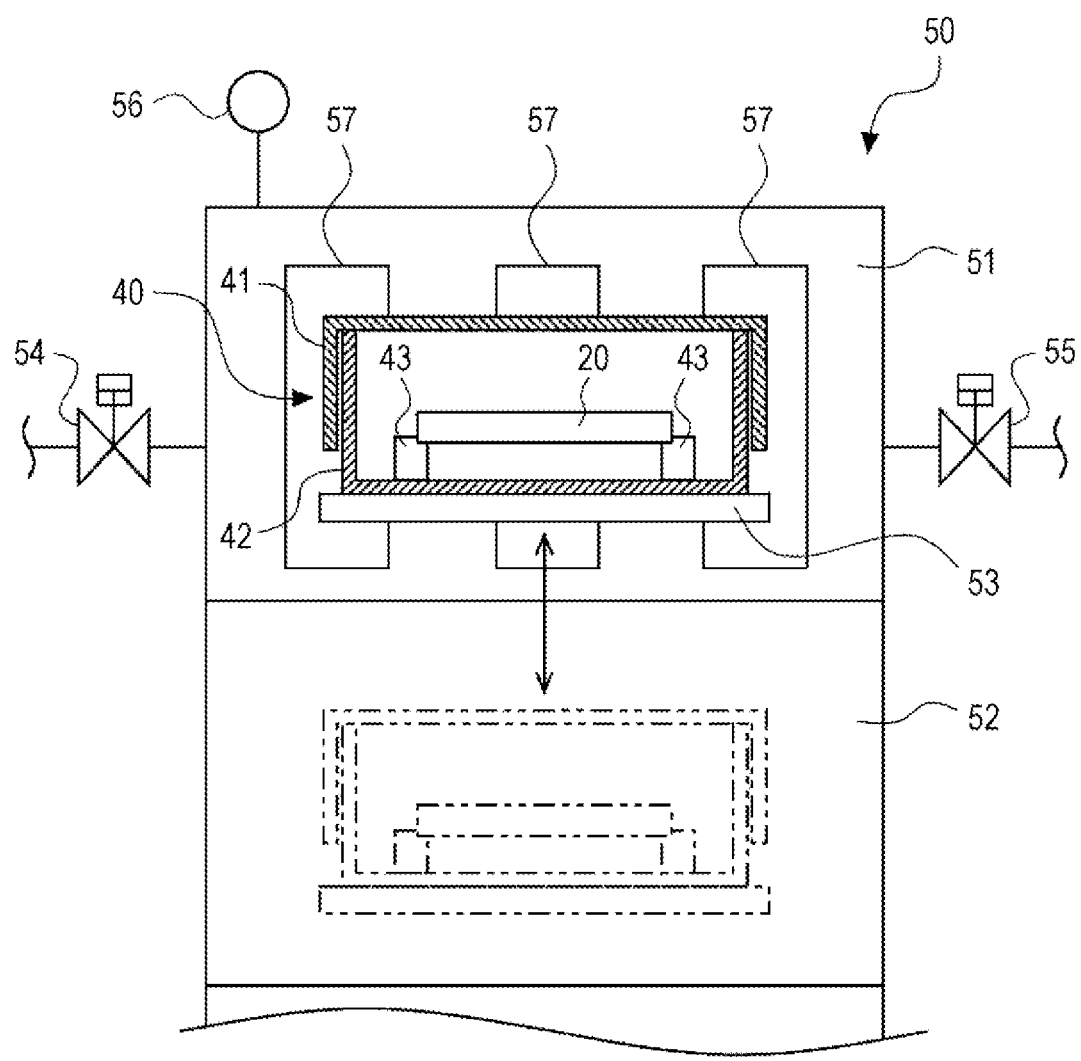
FIG. 4 is a schematic diagram illustrating a high-temperature vacuum furnace used in Si vapor pressure etching.

In this process, as illustrated in FIG. 4, it is preferable to use a equipment including a crucible 40 in which the SiC wafer 20 is housed and a high-temperature vacuum furnace 50 capable of heating the crucible 40.

The crucible 40 includes an upper container 41, a lower container 42 which can be fitted to the upper container 41, and a support base 43 which supports the SiC wafer 20. The wall surface (top surface, side surface) of the upper container 41 and the wall surface (side surface, bottom surface) of the lower container 42 are configured by a plurality of layers, and a tantalum layer (Ta) and a tantalum carbide layer (TaC and $Ta_2C$) and a tantalum silicide layer ($TaSi_2$ or $Ta_5Si_3$ and the like) are formed in order from the external side toward the internal space side.

This tantalum silicide layer supplies Si to the internal space by heating. Further, the crucible 40 includes a tantalum layer and a tantalum carbide layer, and thus it is possible to take in the surrounding C vapor. Accordingly, a high-purity Si atmosphere can be formed in the internal space during heating. Incidentally, instead of providing the tantalum silicide layer, solid Si or the like may be arranged in the internal space. In this case, when the solid Si sublimates during heating, the internal space can have a high-purity Si atmosphere.

The support base 43 can support the SiC wafer 20 so as to expose both the main surface 21 and the back surface 22.

The high-temperature vacuum furnace 50 includes a main heating chamber 51, a preheating chamber 52, and a moving table 53 which can move the crucible 40 from the preheating chamber 52 to the main heating chamber 51. The main heating chamber 51 can heat the SiC wafer 20 to a temperature of 1000° C. or higher and 2300° C. or lower. The preheating chamber 52 is a space for preheating the SiC wafer 20 before heating it in the main heating chamber 51.

A vacuum forming valve 54, an inert gas injection valve 55, and a vacuum gauge 56 are connected to the main heating chamber 51. The vacuum forming valve 54 can adjust the degree of vacuum of the main heating chamber 51. The inert gas injection valve 55 can adjust the pressure by introducing an inert gas (for example, an Ar gas) into the main heating chamber 51. The vacuum gauge 56 can measure the degree of vacuum in the main heating chamber 51.

A heater 57 is provided inside the main heating chamber 51. Further, a heat-reflecting metal plate is fixed to the side wall and ceiling of the main heating chamber 51 (not illustrated), and the heat-reflecting metal plate is configured to reflect the heat of the heater 57 toward the substantially central portion of the main heating chamber 51.

Accordingly, the SiC wafer 20 can be heated strongly and evenly to a temperature of 1000° C. or higher and 2300° C. or lower. Incidentally, as the heater 57, for example, a resistance heating type heater or a high frequency induction heating type heater can be used.

(7-2) Etching Mechanism

The SiC wafer 20 is housed in the crucible 40 and heated under a high-purity Si vapor pressure in a temperature range of 1500° C. or more and 2200° C. or less by using the high-temperature vacuum furnace 50. By heating the SiC wafer 20 under these conditions, the surface is etched. The outline of this etching is described in following 1) to 4).

1) $SiC(s) \rightarrow Si(v)I + C(s)$
2) $Ta_xSi_y \rightarrow Si(v)II + Ta_{x'}Si_{y'}$
3) $2C(s) + Si(v)I + II \rightarrow SiC_2(v)$
4) $C(s) + 2Si(v)I + II \rightarrow Si_2C(v)$ Description of 1): When the SiC wafer 20 (SiC(s)) is heated under Si vapor pressure, Si atoms (Si(v)I) are desorbed from SiC by thermal decomposition.

Description of 2): Si vapor (Si(v)II) is supplied from the tantalum silicide layer ($Ta_xSi_y$).

Description of 3) and 4): C(C(s)) remaining due to the desorption of Si atom (Si(v)I) by thermal decomposition reacts with Si vapor (Si(v)I and Si(v)II) to become $Si_2C$ or $SiC_2$ and the like and sublimates.

The reactions 1) to 4) above are carried out continuously, and as a result, etching proceeds.

(7-3) Etching Conditions

The heating temperature in Si vapor pressure etching is 1500 to 2200° C. and more preferably 1800 to 2000° C.

The processing speed (etching speed) in this processing is 0.1 to 10 μm/min.

The degree of vacuum of the main heating chamber 51 in this processing is 10-5 to 10 Pa and more preferably 10-3 to 1 Pa.

The inert gas in this processing is Ar, and the degree of vacuum is adjusted by introducing this inert gas.

The processing time in this processing is not particularly limited, and any time according to a desired etching amount can be adopted. For example, in a case where the processing speed is 1 μm/min, and the etching amount is to be 3 μm, the processing time is 3 minutes.

Incidentally, the finish grinding process S23 and the finish polishing process may be included before the etching process S21. By performing the finish grinding process S23 and the finish polishing process before the etching process S21 in this way, the flatness of the SiC wafer 20 after etching can be improved.

(8) Mirror Surface Processing Process

As the mirror surface processing process S31, chemical mechanical polishing (CMP) processing can be exemplified in which polishing is performed by combining the mechanical action of the polishing pad and the chemical action of the slurry. This chemical mechanical polishing is a process of processing the main surface 21 of the SiC wafer 20 into a mirror surface which is in a surface state preferable for the device manufacturing process (two-dot chain line portion in FIG. 3).

Incidentally, in the conventional SiC wafer manufacturing method, the main surface 21 and the back surface 22 are subjected to chemical mechanical polishing (CMP) processing to be mirrorized (two-dot chain line portion in FIG. 25).

For this processing, a general-purpose processing equipment used in conventional chemical mechanical polishing can be adopted, and processing conditions can be set within a range normally performed by those skilled in the art.

<SiC Wafer Manufacturing Method for Achieving Second Object>

Hereinafter, the SiC wafer manufacturing process of the present invention for achieving the second object will be described in detail with reference to FIGS. 2, 3, and 5. Incidentally, in the SiC wafer manufacturing process of the present invention for achieving this second object, the components which are basically the same as the above SiC wafer manufacturing process of the present invention for achieving the first object are designated by the same reference numerals to simplify the description.

The SiC wafer manufacturing method of the present invention for achieving the second object includes an ingot molding process (step S11) of processing a mass of a crystal-grown single crystal SiC into a columnar ingot 10, a crystal orientation molding process (step S12) of forming a notch in a part of the outer periphery so as to be a mark indicating the crystal orientation of the ingot 10, a slicing process (step S13) of processing the ingot 10 into a thin disk-shaped SiC wafer 20 by slicing, a flattening process (step S142) of flattening the SiC wafer 20, a stamp forming process (step S15) of forming a stamp portion 25, a chamfering process (step S16) of chamfering an outer peripheral portion 23, an etching process (step S21) of etching at least the back surface 22 of the SiC wafer 20 by heating under Si vapor pressure, and a mirror surface processing process (step S31) of making the main surface 21 of the SiC wafer 20 a mirror surface.

Incidentally, the ingot molding process Sl1 to the chamfering process S16 are a wafer shape forming process S10, the etching process S21 is a work-affected layer removing process S20, and the mirror surface processing process S31 is the mirror surface polishing process S30.

(9) Flattening Process

The flattening process S142 is a process of removing the waviness introduced into the SiC wafer 20 in the slicing process S13. Hereinafter, the processing method and processing conditions used in the flattening process S142 and the properties of the abrasive grains will be described.

(9-1) Processing Method

As a preferable processing method for the flattening process S142, the fixed abrasive grain processing (grind grinding or the like) of performing processing with a grindstone in which abrasive grains are embedded in a bond material or the free abrasive grain processing (wrapping polishing or the like) of performing processing while scattering fine abrasive grains on a surface plate is preferably used. Incidentally, it is desirable that the abrasive grains are dropped as a mixed solution (slurry) obtained by mixing water and a dispersant. As the processing equipment used in this process, a general-purpose processing equipment used in the conventional fixed abrasive grain processing and free abrasive grain processing can be adopted. Further, a method of processing both sides at the same time may be used, or a method of processing one side may be used.

Incidentally, in this flattening process S142, a satin surface formation of forming a satin surface at least on the back surface 22 of the SiC wafer 20 may be performed at the same time.

In the flattening process S142, it is preferable to process the SiC wafer 20 while crushing the abrasive grains. That is, when comparing the average abrasive grain size before processing and the average abrasive grain size after processing in the flattening process S142, it is desirable that the abrasive grains are crushed after processing so that the abrasive grain size becomes finer.

Here, the average abrasive grain size of the abrasive grains used in the flattening process S142 affects the processing speed. More specifically, there is a relation that a large processing speed can be realized in a case where a large abrasive grain is used, and the processing speed is reduced in a case where a small abrasive grain is used.

Therefore, if the flattening process S142 is performed while crushing the abrasive grains, the surface of the SiC wafer 20 can be rapidly processed at a large processing speed at the start stage of the flattening process S142. On the other hand, when the processing progresses and the abrasive grains become smaller, the processing speed gradually decreases. At the final stage of the process, delicate processing on the surface of the SiC wafer 20 can be realized to suppress the roughness of the satin surface introduced on the surface of the SiC wafer from becoming excessively large.

When the etching process S21 is executed on the satin surface formed as above, the SiC wafer 20 having the satin surface suitable for the device manufacturing process can be manufactured.

Incidentally, by using the brittle abrasive grains described later, it is possible to carry out the invention in which the flattening process S142 is performed while crushing the abrasive grains.

Further, it is possible to carry out the invention in which the flattening process S142 is performed while crushing the abrasive grains under the processing conditions in the flattening process S142 described later.

In the aspect in which the flattening process S142 is performed while crushing the abrasive grains, the average abrasive grain size of the abrasive grains before processing is preferably 20 μm or more, more preferably 40 μm or more.

By using abrasive grains having an average abrasive grain size in the above range in the state before processing, rapid processing becomes possible at the start stage of the flattening process S142.

In the SiC wafer manufacturing method of the present invention, it is preferable that abrasive grains having an average abrasive grain size of preferably 100 μm or less, more preferably 80 μm or less, and still more preferably 60 μm or less are used at least at the start stage of the flattening process S142.

When the upper limit of the average abrasive grain size of the abrasive grains to be used at the start stage of the flattening process S142 is set in the above range, the depth of the work-affected layer 30 introduced into the SiC wafer 20 by the flattening process S142 can be reduced.

On the other hand, it is preferable to perform the flattening process S142 while crushing the abrasive grains such that the average abrasive grain particles after processing have a size of preferably less than 20 μm and more preferably 10 μm or less.

When the flattening process S142 is executed while crushing the abrasive grains such that the average abrasive grain particles after processing are within the above range, the roughness of the satin surface introduced into the SiC wafer 20 can be reduced, and it is possible to realize the surface state of the SiC wafer 20 suitable for the etching process S21 described later.

In the SiC wafer manufacturing method of the present invention, it is preferable that abrasive grains having an average abrasive grain size of preferably 0.5 μm or more and more preferably 1 μm or more are used at least at the final stage of the flattening process S142.

When the lower limit of the average abrasive grain size of the abrasive grains to be used at the start stage of the flattening process S142 is set in the above range, the surface of the SiC wafer 20 can be efficiently processed.

The following is a specific example of a case where the flattening process S142 is performed while crushing the abrasive grains.

The flattening process S142 is performed with $B_4C$ abrasive grains having an average abrasive grain size of 40 μm under the conditions of a processing pressure of 150 g/cm$^2$ and a processing time of 20 minutes, and the etching process S21 described later is performed, thereby forming a satin surface equivalent to the conventional Si wafer. At this time, the average abrasive grain size after processing in the flattening process S142 is 10 μm or less. The average processing speed obtained by dividing the processing depth of 20 μm of the SiC wafer 20 in this process by the processing time is 1 μm/min.

(9-2) Properties of Abrasive Grains

In the SiC wafer manufacturing method of the present invention, it is desirable to perform processing while crushing the abrasive grains in the flattening process S142 under the free abrasive grain method. That is, it is preferable that the abrasive grains used in the present invention are brittle enough to be easily crushed by the free abrasive grain method.

More specifically, it is preferable to use abrasive grains made of a material that satisfies the following brittleness conditions.

(Brittleness condition) When the both sides of the surface of the SiC wafer are flattened at the same time with abrasive grains adjusted to an average abrasive grain size of 40 μm under the condition of processing pressure of 150 g/cm$^2$ by the free abrasive grain method, the average abrasive grain size becomes 20 μm or less after the lapse of processing time of 20 minutes.

In the flattening process S142, abrasive grains having a modified Mohs hardness of less than 15 are preferably used.

As described above, by using abrasive grains having a hardness lower than that of diamond, the roughness of the satin surface can be suppressed. That is, since the diamond abrasive grains have an extremely high hardness compared to the SiC wafer 20 to be processed, a crush to a small size is hardly performed in the process of the flattening process S142, scratches or the like are introduced to a deep position on the surface of the SiC wafer 20, and the satin surface becomes rough.

Further, it is desirable that the abrasive grains used in this process are abrasive grains having a modified Mohs hardness of 13 or more. Specific examples of abrasive grain material include boron carbide ($B_4C$) and silicon carbide (SiC).

In this way, the SiC wafer 20 can be efficiently processed by adopting abrasive grains having a modified Mohs hardness of 13 or more. That is, by adopting a hardness equal to or higher than that of the SiC wafer 20 to be processed, processing can be performed efficiently.

Above all, it is desirable to adopt boron carbide ($B_4C$) abrasive grains in consideration of the cost and processing speed of the abrasive grains. That is, boron carbide ($B_4C$) abrasive grains can be obtained at low cost, and can be processed at high speed and efficiently as compared with silicon carbide abrasive grains.

(9-3) Processing Conditions

The processing pressure in the free abrasive grain processing in the flattening process S142 is 100 to 300 g/cm$^2$ and more preferably 150 to 200 g/cm$^2$.

Further, the rotation speed of the surface plate in this processing is 5 to 20 rpm and more preferably 10 to 15 rpm.

Further, the processing time in this processing is 5 to 30 minutes and more preferably 5 to 15 minutes.

The waviness introduced into the SiC wafer 20 in the slicing process S13 is normally 30 to 50 μm per side. In this flattening process S142, the SiC wafer 20 can be flattened at the same time, and in order to remove the waviness, processing is performed from the main surface 21 and the back surface 22 of the SiC wafer 20 to a depth of 30 to 50 μm.

Although a case in which abrasive grains having a hardness lower than that of diamond is used is described as a preferable aspect of the flattening process S142, it is also possible to use diamond abrasive grains.

Further, although the free abrasive grain processing is described as a preferable aspect of the flattening process S142, it is also possible to adopt the fixed abrasive grain processing. As processing conditions, for example, diamond abrasive grains with an average abrasive grain size of 3 to 30 μm are used, a grindstone rotation speed is 1000 to 1500 rpm, a cutting pitch is 1 to 3 μm, a front-back feed is 150 to 250 m/min, a left-right feed is 15 to 25 m/min, and a processing speed is 50 to 150 μm/hour.

Incidentally, a general-purpose processing equipment used in conventional fixed abrasive grain processing can be adopted.

Figure 5:
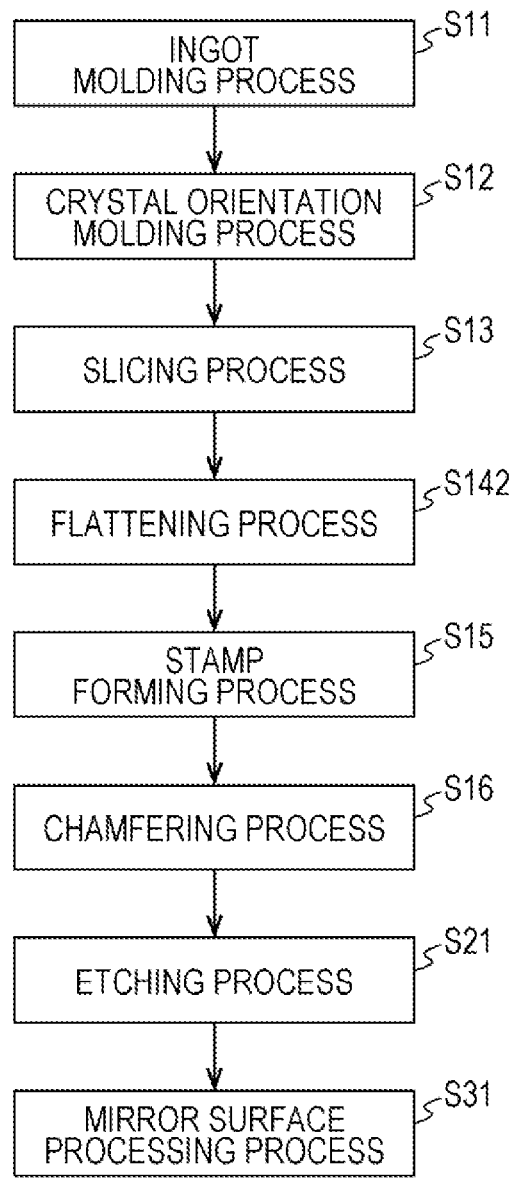
FIG. 5 is a schematic diagram illustrating the SiC wafer manufacturing process for achieving the second object.

A preferable embodiment of the SiC wafer manufacturing method of the present invention includes the stamp forming process S15 and the chamfering process S16 (FIGS. 3 and 5).

(7) Etching Process

Similarly to the above SiC wafer manufacturing process of the present invention for achieving the first object, the etching process S21 is a process of etching the surface of the SiC wafer 20 by heating under Si vapor pressure to remove the work-affected layer 30 introduced into the SiC wafer 20 in the preceding process.

That is, the etching process S21 is preferably performed after the ingot molding process Sl1 of processing a mass of a crystal-grown single crystal SiC into the columnar ingot 10, the crystal orientation molding process S12 of forming the notch portion indicating a crystal orientation in a part of the outer periphery of the ingot 10, the slicing process S13 of slicing the ingot 10 to obtain the thin disk-shaped SiC wafer 20, the stamp forming process S15 of forming the stamp portion 25 by selectively removing the surface of the SiC wafer 20, and the chamfering process S16 of chamfering the outer peripheral portion 23 of the SiC wafer 20. Accordingly, in addition to the main surface 21 and the back surface 22, the outer peripheral portion 23, the orientation flat 24, and the work-affected layer 30 introduced around the stamp portion 25 can be removed, which can contribute to improving the quality of the SiC wafer 20.

On the other hand, as illustrated in FIGS. 24 and 25, in a rough grinding process S22 and a finish grinding process S23 which are performed by the conventional SiC wafer manufacturing method, the outer peripheral portion 23, the orientation flat 24, and the work-affected layer 30 introduced around the stamp portion 25 cannot be removed, which becomes a factor for deteriorating the quality of the SiC wafer 20.

In the SiC wafer manufacturing method of the present invention, when the etching process S21 is performed after the ingot molding process Sl1 to the chamfering process S16, the outer peripheral portion 23, the orientation flat 24, and the work-affected layer 30 introduced around the stamp portion 25 which are cannot be processed until now can be also removed in addition to the main surface 21 and the back surface 22, and the method has a remarkable effect of contributing to the improvement of the quality of the SiC wafer 20.

In the etching process S21 adopted in the SiC wafer manufacturing method of the present invention, both sides can be etched at the same time, and thus the warp of the wafer due to the Twyman effect does not occur.

This etching process S21 is a process of forming the satin surface introduced into the SiC wafer 20 in the flattening process S142 into a state (including waviness, irregularity shape, roughness, and the like) preferable for the device manufacturing process by heating and etching under Si vapor pressure.

The SiC wafer manufacturing method of the present invention has a remarkable effect that the satin surface which does not have the work-affected layer 30 and is preferable for the device manufacturing process can be formed on the SiC wafer 20 which is a difficult-to-process material by combining the flattening process S142 and the etching process S21.

In the etching process S21, it is desirable to etch the SiC wafer 20 by preferably 0.5 μm or more and more preferably 1 μm or more per side.

When the etching amount is set within the above range, a more preferable satin surface can be formed by removing burrs and the like generated in the flattening process S142.

When the etching progresses in the etching process S21 (the etching amount increases), the arithmetic mean roughness Ra and the maximum height Rz of the satin surface can be reduced. That is, this etching process S21 has a roughness adjusting process in which the roughness of the satin surface is adjusted by controlling the etching amount. Accordingly, a remarkable effect is exhibited in which the satin surface having a desired roughness can be formed on at least the back surface 22 of the SiC wafer 20 which is a difficult-to-process material.

Specifically, in the etching process S21, the SiC wafer 20 may be etched by preferably 3 μm or more, more preferably 6 μm or more, still more preferably 9 μm or more, still more preferably 10 μm or more, and still more preferably 12 μm or more per side.

When the etching amount is set within the above range, the arithmetic mean roughness Ra and the maximum height Rz of the satin surface can be set within the preferable ranges.

<SiC Wafer Manufacturing Method for Achieving Third to Fifth Objects>

Hereinafter, the SiC wafer manufacturing process of the present invention for achieving the third to fifth objects will be described in detail with reference to FIGS. 2, 6, and 7. Incidentally, in the SiC wafer manufacturing process of the present invention for achieving this third to fifth objects, the components which are basically the same as the above SiC wafer manufacturing process of the present invention for achieving the first and second objects are designated by the same reference numerals to simplify the description.

Figure 26:
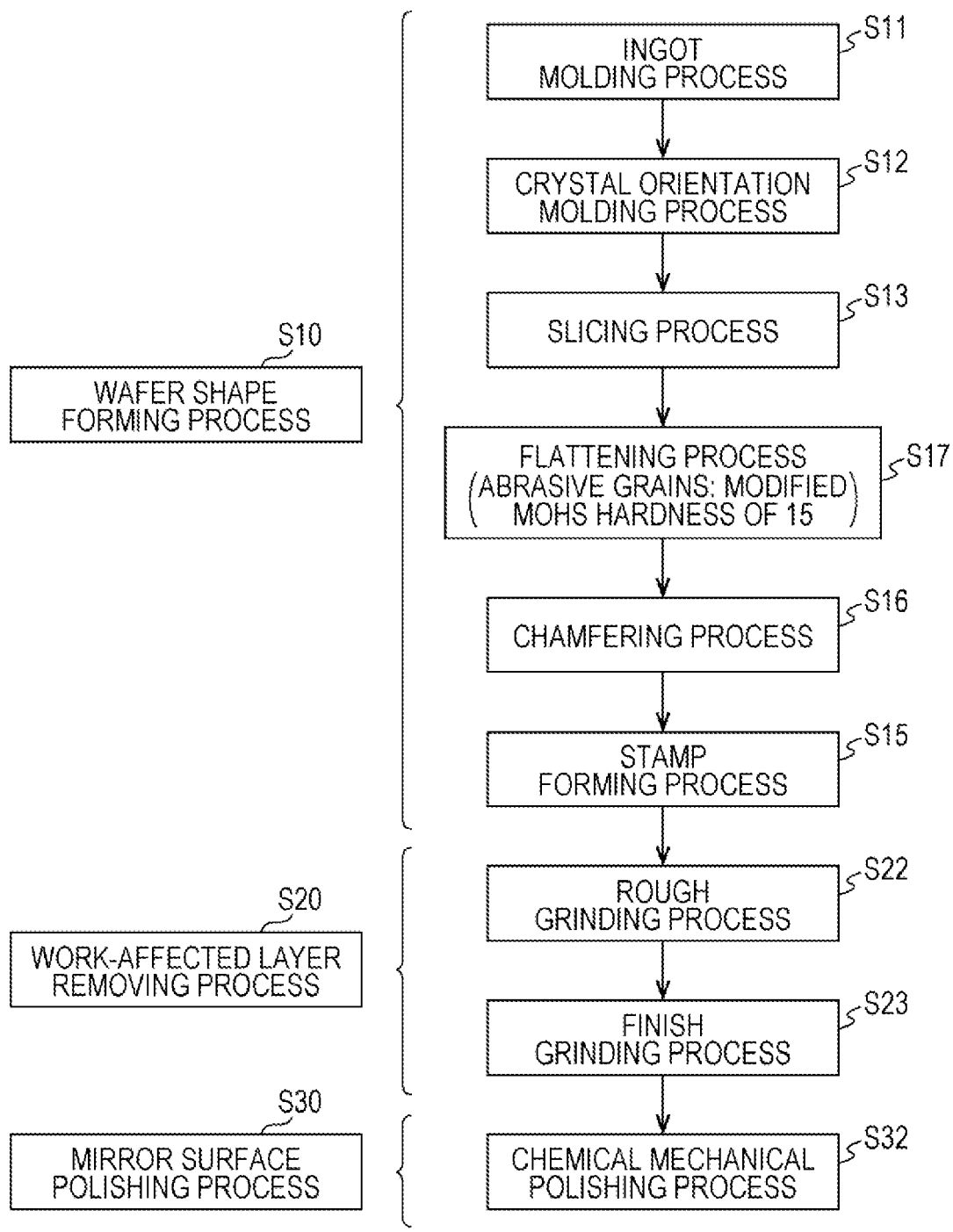
FIG. 26 is a schematic diagram illustrating a conventional SiC wafer manufacturing process.
Figure 27:
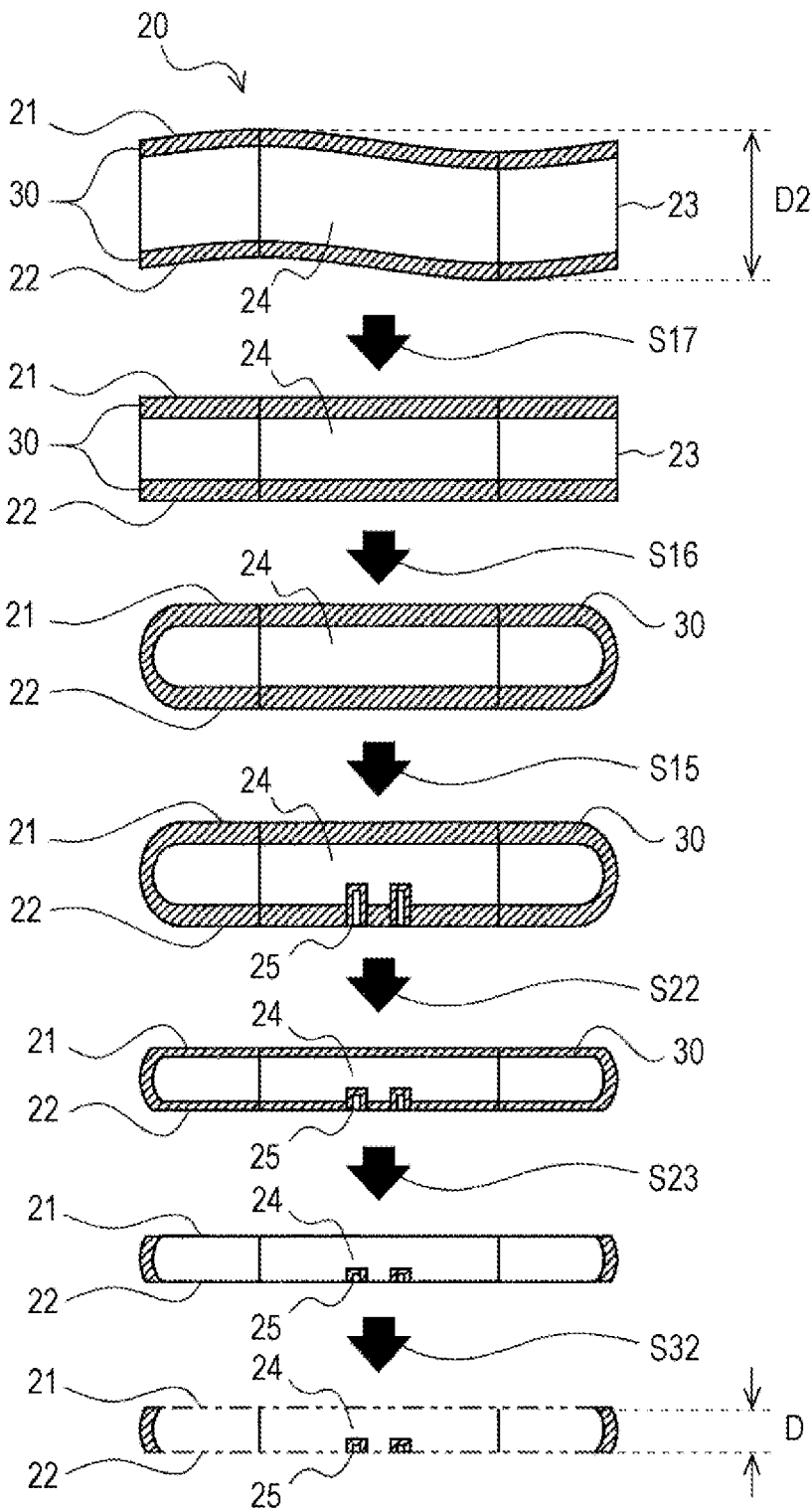
FIG. 27 is an explanatory diagram illustrating the conventional SiC wafer manufacturing process.

Normally, the SiC wafer 20 is manufactured to be the SiC wafer 20 having a thickness D by the wafer shape forming process (step S10) of forming the shape of the wafer, the work-affected layer removing process (step S20) of reducing the work-affected layer 30 introduced on the wafer surface in the wafer shape forming process S10, and the mirror surface polishing process (step S30) of mirrorizing the wafer surface (FIGS. 26 and 27).

Figure 6:
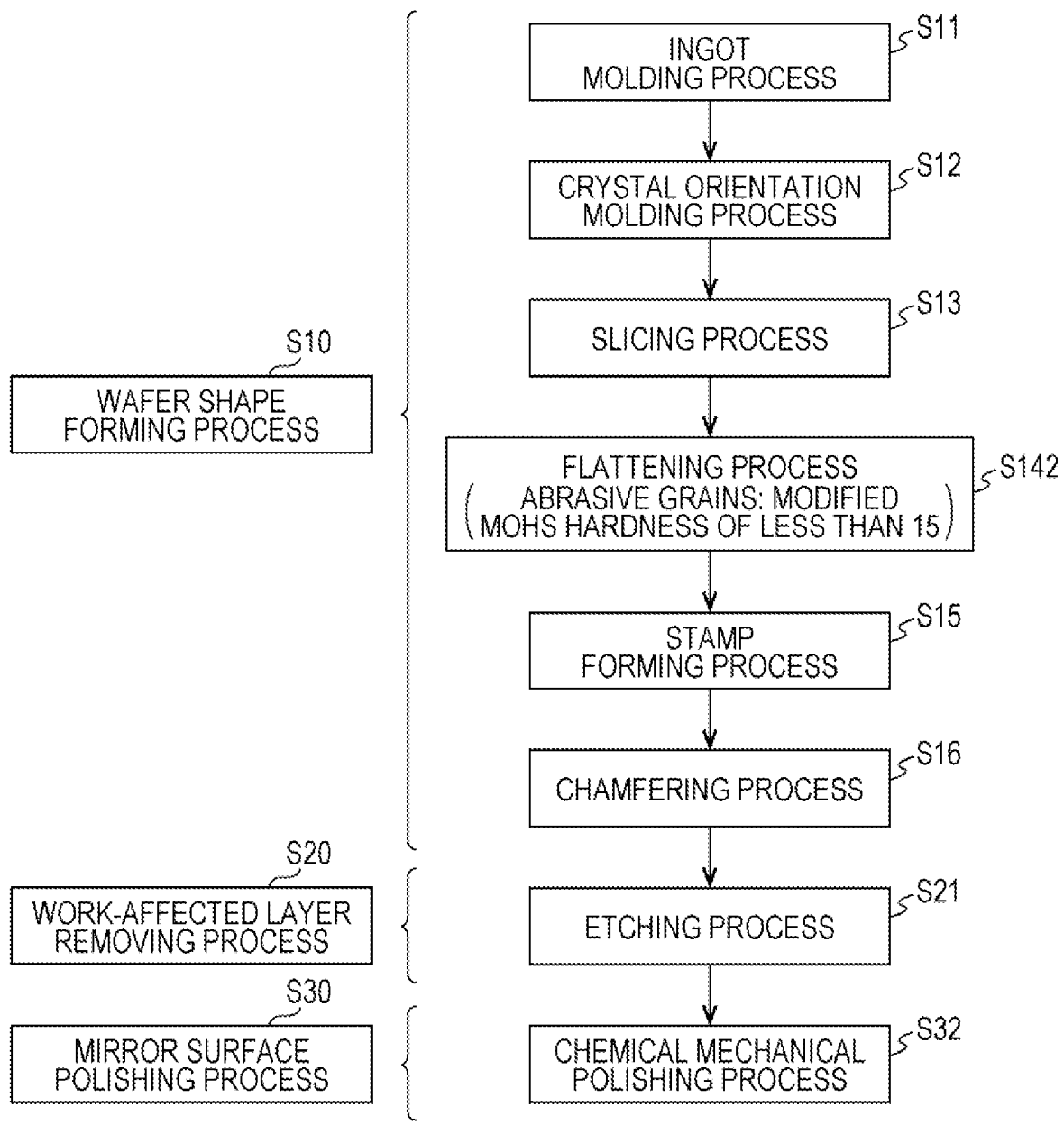
FIG. 6 is a schematic diagram illustrating the SiC wafer manufacturing process for achieving the third to fifth objects.
Figure 7:
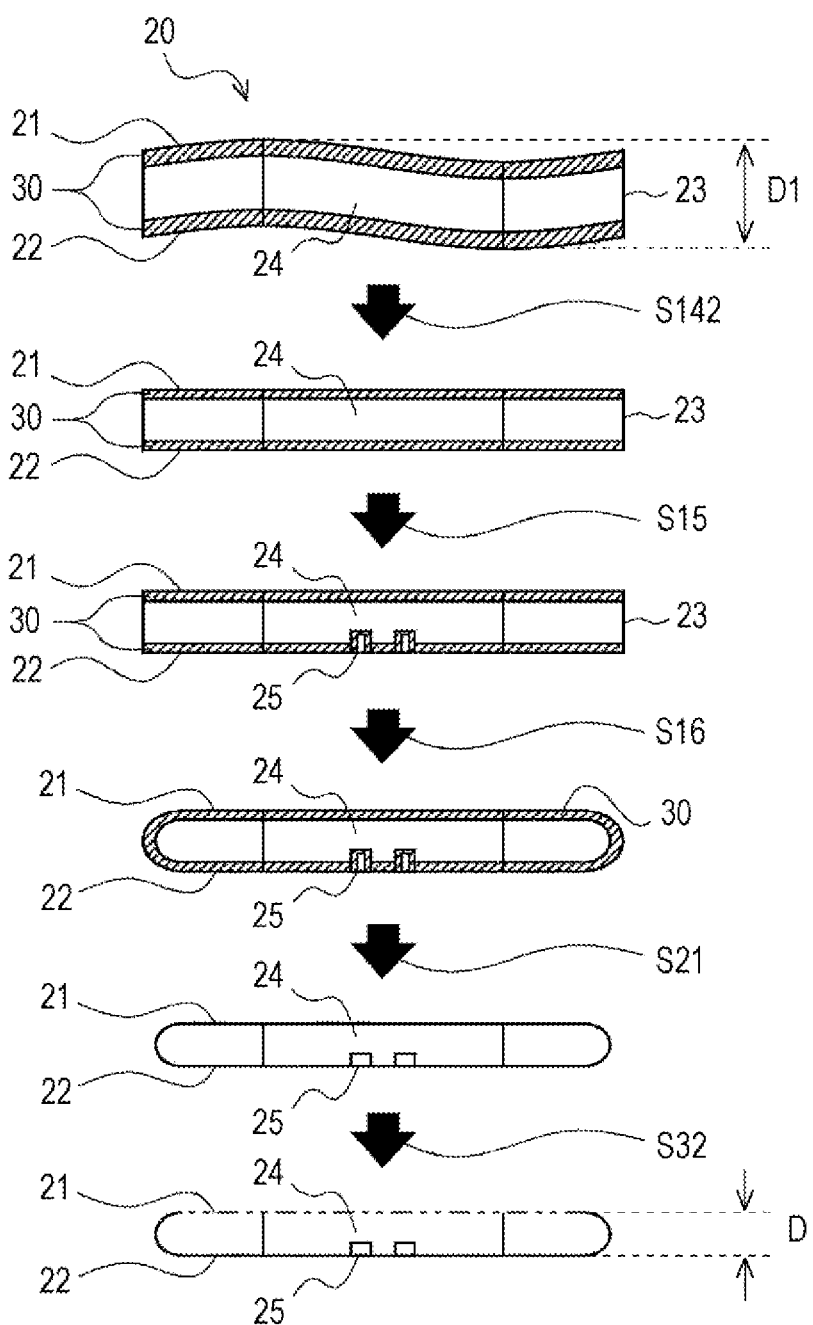
FIG. 7 is an explanatory diagram illustrating the SiC wafer manufacturing process for achieving the third object to the fifth object.

As illustrated in FIGS. 2, 6 and 7, the SiC wafer manufacturing method of the present invention also preferably includes the wafer shape forming process S10, the work-affected layer removing process S20, and the mirror surface polishing process S30.

Hereinafter, the SiC wafer manufacturing method of the present invention will be described according to the process sequence of one embodiment illustrated in FIGS. 2, 6 and 7.

<1> Wafer Shape Forming Process

In one embodiment of the present invention for achieving the third to fifth objects, the wafer shape forming process S10 includes the ingot molding process S11 of processing a mass of a crystal-grown single crystal SiC into the columnar ingot 10, the crystal orientation molding process S12 of forming a notch in a part of the outer periphery so as to be a mark indicating the crystal orientation of the ingot 10, the slicing process S13 of processing the ingot 10 of the single crystal SiC into a thin disk-shaped SiC wafer 20 by slicing, the flattening process S142 of flattening the SiC wafer 20 by using abrasive grains with a modified Mohs hardness of less than 15, the stamp forming process S15 of forming the stamp portion 25, and the chamfering process S16 of chamfering the outer peripheral portion 23.

Hereinafter, each process will be described.

(1) Ingot Molding Process

Similarly to the above SiC wafer manufacturing process of the present invention for achieving the first and second objects, the ingot molding process S11 is a process of processing a mass of a crystal-grown single crystal SiC into the columnar ingot 10. The ingot 10 is normally processed such that the longitudinal direction of the column is the <0001> direction.

In the SiC wafer manufacturing method of the present invention, strains and scratches on the SiC wafer introduced in the ingot molding process S11 can be removed by combining with the flattening process S142 and the etching process S21 which are subsequent processes.

(2) Crystal Orientation Molding Process

Similarly to the above SiC wafer manufacturing process of the present invention for achieving the first and second objects, the crystal orientation molding process S12 is a process of forming a notch in a part of the outer periphery so as to be a mark indicating the crystal orientation of the ingot 10 formed in the ingot molding process S11. Examples of this notch include a plane (orientation flat 24) parallel to the <11-20> direction and grooves (notches) provided at both ends in the <11-20> direction. The notch is formed so that the crystal orientation of single crystal SiC can be specified.

In the SiC wafer manufacturing method of the present invention, strains and scratches on the SiC wafer introduced in the crystal orientation molding process S12 can be removed by combining with the flattening process S142 and the etching process S21 which are subsequent processes.

(3) Slicing Process

Similarly to the above SiC wafer manufacturing process of the present invention for achieving the first and second objects, the examples of a slicing means in the slicing process S13 may include multi-wire saw cutting of cutting the ingot 10 at predetermined intervals by reciprocating a plurality of wires, a discharge processing method for intermittently generating and cutting plasma discharge, and cutting of radiating and condensing a laser beam in the ingot 10 to form a layer to be a base point of cutting and using a laser beam.

A pre-processing thickness Dl of the SiC wafer 20 is determined by the cutting interval in the slicing process S13. This pre-processing thickness Dl is set to a thickness taking into consideration the single crystal SiC (material loss) to be removed in future processes. In this way, the pre-processing thickness Dl is set in consideration of the amount of material loss after all processing processes, and thus the specific numerical values will be described after the description of all processing processes.

(9) Flattening Process

Similarly to the above SiC wafer manufacturing process of the present invention for achieving the second object, the flattening process S142 is a process of flattening the SiC wafer 20 by removing the waviness introduced into the SiC wafer 20 in the slicing process S13. Hereinafter, the properties of the abrasive grains used in the flattening process S142 and the processing method and processing conditions will be described.

Incidentally, as for the properties of the abrasive grains, the properties of the abrasive grains corresponding to respective objects will be described.

(9-1-1) Properties of Abrasive Grains

As illustrated in FIG. 26, in the conventional method, diamond abrasive grains having a modified Mohs hardness of 15 are used in the conventional flattening process S17.

On the other hand, the SiC wafer manufacturing method of the present invention for achieving the third object includes the flattening process S142 (hereinafter, also referred to as diamondless polishing) of flattening the SiC wafer 20 in the presence of abrasive grains having a modified Mohs hardness of less than 15.

As described above, by adopting abrasive grains having a hardness of a modified Mohs hardness of less than 15, the work-affected layer 30 to be removed in the etching process S21 (Si vapor pressure etching) described later can be formed thinly. That is, by reducing the difference in hardness from the SiC wafer 20 to be processed, it is possible to suppress the introduction of scratches deep into the surface of the SiC wafer 20 and form a surface suitable for performing Si vapor pressure etching.

Further, it is desirable that the abrasive grains used in this process are abrasive grains having a modified Mohs hardness of 13 or more. Specific examples of abrasive grain material include boron carbide ($B_4C$) and silicon carbide (SiC).

In this way, the SiC wafer 20 can be efficiently ground by adopting abrasive grains having a modified Mohs hardness of 13 or more. That is, by adopting a hardness equal to or higher than that of the SiC wafer 20 to be processed, processing can be performed efficiently.

Above all, it is desirable to adopt boron carbide ($B_4C$) abrasive grains in consideration of the cost and processing speed of the abrasive grains. That is, boron carbide ($B_4C$) abrasive grains can be obtained at low cost, and can be processed at high speed and efficiently as compared with silicon carbide abrasive grains.

In the SiC wafer manufacturing method of the present invention, it is preferable that abrasive grains having an average abrasive grain size of preferably 20 μm or more and more preferably 40 μm or more are used at least at the start stage of the flattening process S142.

When the lower limit of the average abrasive grain size of the abrasive grains to be used at the start stage of the flattening process S142 is set in the above range, the surface of the SiC wafer 20 can be rapidly processed at a large processing speed.

In the SiC wafer manufacturing method of the present invention, it is preferable that abrasive grains having an average abrasive grain size of preferably 100 μm or less, more preferably 80 μm or less, and still more preferably 60 μm or less are used at least at the start stage of the flattening process S142.

When the upper limit of the average abrasive grain size of the abrasive grains to be used at the start stage of the flattening process S142 is set in the above range, the depth of the work-affected layer introduced into the SiC wafer 20 by the flattening process S142 can be reduced.

In the SiC wafer manufacturing method of the present invention, it is preferable that abrasive grains having an average abrasive grain size of preferably less than 20 μm and more preferably 10 μm or less are used at least at the final stage of the flattening process S142, that is, from immediately before the end to the end.

When the upper limit of the average abrasive grain size of the abrasive grains to be used at the final stage of the flattening process S142 is set in the above range, the depth of the work-affected layer introduced into the SiC wafer 20 by the flattening process S142 can be reduced.

In the SiC wafer manufacturing method of the present invention, it is preferable that abrasive grains having an average abrasive grain size of preferably 0.5 µm or more and more preferably 1 µm or more are used at least at the final stage of the flattening process S142.

When the lower limit of the average abrasive grain size of the abrasive grains to be used at the start stage of the flattening process S142 is set in the above range, the surface of the SiC wafer 20 can be efficiently processed.

In the present invention, it is preferable to use abrasive grains which are brittle enough to be crushed in the flattening process S142. More specifically, it is preferable to use abrasive grains made of a material that satisfies the following brittleness conditions.

(Brittleness condition) When the both sides of the surface of the SiC wafer are flattened at the same time with abrasive grains adjusted to an average abrasive grain size of 40 µm under the condition of processing pressure of 150 g/cm$^2$ by the free abrasive grain method, the average abrasive grain size becomes 20 µm or less after the lapse of processing time of 20 minutes.

The abrasive grains satisfying such brittleness conditions exhibit a property that the abrasive grains are crushed in the flattening process S142 to have a small average abrasive grain size.

Here, the average abrasive grain size of the abrasive grains used in the flattening process S142 affects the processing speed. More specifically, there is a relation that a large processing speed can be realized in a case where a large abrasive grain is used, and the processing speed is reduced in a case where a small abrasive grain is used.

Therefore, by using abrasive grains satisfying the above brittleness conditions, the surface of the SiC wafer 20 can be rapidly processed at a large processing speed at the start stage of the flattening process S142. On the other hand, when the processing progresses, the abrasive grains are crushed so that the processing speed gradually decreases, and in the final stage of the process, delicate processing on the surface of the SiC wafer 20 can be realized to suppress the depth of the work-affected layer 30 to the minimum.

Accordingly, it is possible to shorten the time required for the flattening process S142 and realize the surface state of the SiC wafer 20 suitable for being subjected to the etching process S21 described later.

As the abrasive grains satisfying such a brittleness condition, the above-described abrasive grains having a modified Mohs hardness of less than 15 can be exemplified.

(9-1-2) Properties of Abrasive Grains

As illustrated in FIG. 26, in the conventional method, diamond abrasive grains having a modified Mohs hardness of 15 are used in the conventional flattening process S17. Since the diamond abrasive grains have a higher hardness than the SiC wafer 20 to be processed, a crush to a small size is hardly performed in the process of the conventional flattening process S17, and the work-affected layer 30 is introduced to a deep position on the surface of the SiC wafer 20.

On the other hand, in the SiC wafer manufacturing method of the present invention for achieving the third object, processing is performed while crushing the abrasive grains in the flattening process S142 under the free abrasive grain method. That is, it is necessary that the abrasive grains used in the present invention are brittle enough to be easily crushed by the free abrasive grain method.

More specifically, it is preferable to use abrasive grains made of a material that satisfies the following brittleness conditions.

(Brittleness condition) When the both sides of the surface of the SiC wafer are flattened at the same time with abrasive grains adjusted to an average abrasive grain size of 40 µm under the condition of processing pressure of 150 g/cm$^2$ by the free abrasive grain method, the average abrasive grain size becomes 20 µm or less after the lapse of processing time of 20 minutes.

In the flattening process S142, abrasive grains having a modified Mohs hardness of less than 15 are preferably used.

As described above, by adopting abrasive grains having a hardness of a modified Mohs hardness of less than 15, the work-affected layer 30 to be removed in the etching process S21 (Si vapor pressure etching) described later can be formed thinly. That is, by reducing the difference in hardness from the SiC wafer 20 to be processed, it is possible to suppress the introduction of scratches (that is, the work-affected layer 30) deep into the surface of the SiC wafer 20 and form a surface suitable for performing Si vapor pressure etching.

Further, it is desirable that the abrasive grains used in this process are abrasive grains having a modified Mohs hardness of 13 or more. Specific examples of abrasive grain material include boron carbide ($B_4C$) and silicon carbide (SiC).

In this way, the SiC wafer 20 can be efficiently ground by adopting abrasive grains having a modified Mohs hardness of 13 or more. That is, by adopting a hardness equal to or higher than that of the SiC wafer 20 to be processed, processing can be performed efficiently.

Above all, it is desirable to adopt boron carbide ($B_4C$) abrasive grains in consideration of the cost and processing speed of the abrasive grains. That is, boron carbide ($B_4C$) abrasive grains can be obtained at low cost, and can be processed at high speed and efficiently as compared with silicon carbide abrasive grains.

(9-1-3) Properties of Abrasive Grains

The type of abrasive grains used in the flattening process S142 of the present invention for achieving the fourth and fifth objects is not limited. It is preferable to use the abrasive grains having a modified Mohs hardness of less than 15 used in one embodiment of the present invention illustrated in FIG. 6 or the abrasive grains brittle enough to be crushed in the flattening process S142. However, the abrasive grains, such as diamond abrasive grains, which have a modified Mohs hardness of 15 and are also used in the conventional flattening process S17 illustrated in FIG. 26 may be used.

In a preferable embodiment of the present invention, as illustrated in FIG. 6, in the flattening process S142, abrasive grains having a modified Mohs hardness of less than 15 are preferably used.

As described above, by adopting abrasive grains having a hardness of a modified Mohs hardness of less than 15, the work-affected layer 30 to be removed in the etching process S21 (Si vapor pressure etching) described later can be formed at a depth of 3 µm or less. That is, by reducing the difference in hardness from the SiC wafer 20 to be processed, it is possible to suppress the introduction of scratches deep into the surface of the SiC wafer 20 and form a surface suitable for performing Si vapor pressure etching.

In a case where abrasive grains having a hardness of a modified Mohs hardness of less than 15 are used, it is preferable that abrasive grains having an average abrasive grain size of preferably 20 µm or more and more preferably 40 µm or more are used at least at the start stage of the flattening process S142.

When the lower limit of the average abrasive grain size of the abrasive grains to be used at the start stage of the flattening process S142 is set in the above range, the surface of the SiC wafer 20 can be rapidly processed at a large processing speed.

In a case where abrasive grains having a hardness of a modified Mohs hardness of less than 15 are used, it is preferable that abrasive grains having an average abrasive grain size of preferably 100 µm or less, more preferably 80 µm or less, and still more preferably 60 µm or less are used at least at the start stage of the flattening process S142.

When the upper limit of the average abrasive grain size of the abrasive grains to be used at the start stage of the flattening process S142 is set in the above range, the depth of the work-affected layer introduced into the SiC wafer 20 by the flattening process S142 can be reduced.

In a case where abrasive grains having a hardness of a modified Mohs hardness of less than 15 are used, it is preferable that abrasive grains having an average abrasive grain size of preferably less than 20 µm and more preferably 10 µm or less are used at least at the final stage of the flattening process S142, that is, from immediately before the end to the end.

When the upper limit of the average abrasive grain size of the abrasive grains to be used at the final stage of the flattening process S142 is set in the above range, the depth of the work-affected layer introduced into the SiC wafer 20 by the flattening process S142 can be reduced.

In a case where abrasive grains having a hardness of a modified Mohs hardness of less than 15 are used, it is preferable that abrasive grains having an average abrasive grain size of preferably 0.5 µm or more and more preferably 1 µm or more are used at least at the final stage of the flattening process S142.

When the lower limit of the average abrasive grain size of the abrasive grains to be used at the start stage of the flattening process S142 is set in the above range, the surface of the SiC wafer 20 can be efficiently processed.

It is preferable that the abrasive grains used in the present invention are brittle enough to be crushed by the free abrasive grain method.

More specifically, it is preferable to use abrasive grains made of a material that satisfies the following brittleness conditions.

(Brittleness condition) When the both sides of the surface of the SiC wafer are flattened at the same time with abrasive grains adjusted to an average abrasive grain size of 40 µm under the condition of processing pressure of 150 g/cm² by the free abrasive grain method, the average abrasive grain size becomes 20 µm or less after the lapse of processing time of 20 minutes.

When the flattening process S142 by the free abrasive grain method is executed by using the abrasive grains satisfying such brittleness conditions, the depth of the work-affected layer 30 introduced can be 3 µm or less.

Diamond abrasive grains may be used in the flattening process S142.

In a case where diamond abrasive grains are used in the flattening process S142, it is considered that the work-affected layer 30 having a depth similar to that of the abrasive grain size is introduced. Therefore, it is preferable to use diamond abrasive grains having an average abrasive grain size of preferably 10 µm or less, more preferably 5 µm or less, and still more preferably 3 µm or less in consideration of removal in the subsequent work-affected layer removing process S20.

In this case, in the flattening process S142, a work-affected layer of 10 µm or less in a preferable aspect, 5 µm or less in a more preferable aspect, and 3 µm or less in a still more preferable aspect is introduced into the SiC wafer 20.

(9-2) Processing Method

A method applicable for the flattening process S142 includes the free abrasive grain method (wrapping polishing or the like) of performing processing while scattering fine abrasive grains on a surface plate or the fixed abrasive grain method (grind grinding or the like) of performing processing with a grindstone in which abrasive grains are embedded in a bond material. More preferably, the free abrasive grain method is preferably used. Incidentally, it is desirable that the abrasive grains are dropped as a mixed solution (slurry) obtained by mixing water and a dispersant.

As the processing equipment used in this process, a general-purpose processing equipment used in the conventional fixed abrasive grain method and free abrasive grain method can be adopted. Further, a method of processing both sides at the same time may be used, or a method of processing one side may be used.

In the flattening process S142, it is desirable to process the SiC wafer 20 while crushing the abrasive grains. That is, when comparing the average abrasive grain size before processing and the average abrasive grain size after processing, it is desirable that the abrasive grains are crushed after processing so that the abrasive grain size becomes finer.

In the SiC wafer manufacturing method of the present invention, the SiC wafer 20 is flattened such that the work-affected layer 30 introduced into the SiC wafer 20 in the flattening process S142 is preferably 10 µm or less, preferably 5 µm or less, and more preferably 3 µm or less.

Such a thin work-affected layer 30 can be removed by the etching process S21 which is a subsequent process without causing extra material loss.

Therefore, the material loss can be reduced by suppressing the depth of the work-affected layer 30 in the flattening process S142 within the above numerical range and then executing the etching process S21. Accordingly, a larger number of SiC wafers 20 can be manufactured from one ingot 10.

Incidentally, as for the specific means for adjusting the depth of the work-affected layer within the above-described range, the matters described in the above "property of abrasive grains" can be applied.

In the flattening process S142, it is preferable to process the SiC wafer 20 while crushing the abrasive grains. That is, when comparing the average abrasive grain size before processing and the average abrasive grain size after processing in the flattening process S142, it is desirable that the abrasive grains are crushed after processing so that the abrasive grain size becomes finer.

As described above, the average abrasive grain size of the abrasive grains used in the flattening process S142 affects the processing speed.

Therefore, in the embodiment in which the flattening process S142 is performed while crushing the abrasive grains, the surface of the SiC wafer 20 can be rapidly processed at a large processing speed at the start stage of the flattening process S142. On the other hand, when the processing progresses and the abrasive grains become smaller, the processing speed gradually decreases. At the final stage of the process, delicate processing on the surface of the SiC wafer 20 can be realized to suppress the depth of the work-affected layer 30 to the minimum.

Accordingly, it is possible to shorten the time required for the flattening process S142 and realize the surface state of the surface of the SiC wafer 20 suitable for being subjected to the etching process S21 described later.

In other words, the average abrasive grain size of the abrasive grains used in the flattening process S142 affects the processing speed. More specifically, there is a relation that a large processing speed can be realized in a case where a large abrasive grain is used, and the processing speed is reduced in a case where a small abrasive grain is used.

Therefore, if the flattening process S142 is performed while crushing the abrasive grains, the surface of the SiC wafer 20 can be rapidly processed at a large processing speed at the start stage of the flattening process S142. On the other hand, when the processing progresses and the abrasive grains become smaller, the processing speed gradually decreases. At the final stage of the process, delicate processing on the surface of the SiC wafer 20 can be realized to form the work-affected layer 30 introduced into the surface of the SiC wafer 20 thin and uniformly.

When the etching process S21 is executed on such a thin and uniform work-affected layer 30, the high-quality SiC wafer 20 can be manufactured with a small material loss.

In the conventional flattening process S17 using diamond abrasive grains, the work-affected layer 30 is locally introduced deep into the surface and does not become the work-affected layer 30 having a uniform depth. Therefore, in order to remove all the work-affected layer 30 of the SiC wafer 20 in the subsequent work-affected layer removing process S20, it is necessary to remove even the portion where the work-affected layer 30 is not formed, and the amount of material loss is large.

The SiC wafer manufacturing method of the present invention has an advantage that the amount of material loss is smaller than that of the conventional method.

Further, in the conventional flattening process S17 using diamond abrasive grains, deep scratches are randomly generated, which causes a problem in terms of quality control.

On the other hand, in the flattening process S142 in the present invention, such scratches are unlikely to occur, which is very advantageous in terms of quality control.

By performing the flattening process S142 while crushing the abrasive grains, rapid surface processing at the start stage of the flattening process S142 and delicate processing at the final stage of the process can be realized, and thus the depth of the work-affected layer 30 can be suppressed to the minimum.

Accordingly, it is possible to shorten the time required for the flattening process S142 and realize the surface state of the surface of the SiC wafer 20 suitable for being subjected to the etching process S21 described later.

Incidentally, by using the abrasive grains having a modified Mohs hardness of less than 15 described above, it is possible to carry out the invention in which the flattening process S142 is performed while crushing the abrasive grains.

Further, it is possible to carry out the invention in which the flattening process S142 is performed while crushing the abrasive grains under the processing conditions in the flattening process S142 described later.

Incidentally, by using the brittle abrasive grains described above, it is possible to carry out the invention in which the flattening process S142 is performed while crushing the abrasive grains.

That is, by using the above-described abrasive grains having a modified Mohs hardness of less than 15 or the abrasive grains having brittleness, it is possible to carry out the invention in which the flattening process S142 is performed while crushing the abrasive grains.

In the aspect in which the flattening process S142 is performed while crushing the abrasive grains, the average abrasive grain size of the abrasive grains before processing is preferably 20 µm or more, more preferably 40 µm or more.

By using abrasive grains having an average abrasive grain size in the above range in the state before processing, rapid processing becomes possible at the start stage of the flattening process S142.

On the other hand, it is preferable to perform the flattening process S142 while crushing the abrasive grains such that the average abrasive grain particles after processing have a size of preferably less than 20 µm and more preferably 10 µm or less.

When the flattening process S142 while crushing the abrasive grains is executed such that the average abrasive grain particles after processing are within the above range, the depth of the work-affected layer 30 introduced into the SiC wafer 20 can be reduced. Accordingly, it is possible to realize the surface state of the SiC wafer 20 suitable for being subjected to the etching process S21 described later.

The following is a specific example of a case where the flattening process S142 is performed while crushing the abrasive grains.

When the flattening process S142 is performed with $B_4C$ abrasive grains having an average abrasive grain size of 40 µm under the conditions of a processing pressure of 150 g/cm$^2$ and a processing time of 20 minutes, the depth of the work-affected layer 30 of the SiC wafer 20 becomes approximately 3 µm. At this time, the average abrasive grain size after processing is 10 µm or less. The average processing speed obtained by dividing the processing depth of 20 µm of the SiC wafer 20 in this process by the processing time is 1 µm/min.

(9-3) Processing Conditions

In a case where the free abrasive grain method is adopted in the flattening process S142, the processing pressure is 100 to 300 g/cm$^2$ and more preferably 150 to 200 g/cm$^2$.

Further, in a case where the free abrasive grain method is adopted, the rotation speed of the surface plate in this processing is 5 to 20 rpm and more preferably 10 to 15 rpm.

On the other hand, in a case where the fixed abrasive grain method is adopted, the flattening process S142 can be carried out under the same processing conditions as the rough grinding process S22 and the finish grinding process S23 in the conventional method. Specifically, the conditions that the grindstone rotation speed is 1000 to 1500 rpm, the cutting pitch is 1 to 3 µm, the front-back feed is 150 to 250 m/min, the left-right feed is 15 to 25 m/min, and the processing speed is 50 to 150 µm/hour can be exemplified.

Normally, the waviness introduced into the SiC wafer 20 in the slicing process S13 is 30 to 50 µm per side. Therefore, in this flattening process S142, in order to remove the waviness, processing is performed from the main surface 21 and the back surface 22 of the SiC wafer 20 to a depth of 30 to 50 µm. Therefore, the amount of material loss per wafer accompanying the flattening process S142 is 60 to 100 µm on both sides.

Incidentally, in order to reduce the amount of material loss in the flattening process S142, it is preferable to perform the slicing process S13 such that the waviness introduced into the SiC wafer 20 is 30 µm or less.

In a case where single-sided processing is performed by the free abrasive grain method, the processing time in the flattening process S142 using abrasive grains having a modified Mohs hardness of less than 15 is preferably 5 to 30 minutes and more preferably 5 to 15 minutes. Further, in a case where double-sided processing is performed by the free abrasive grain method, the processing time is 30 to 50 minutes and more preferably 15 to 25 minutes.

On the other hand, the processing time in the conventional flattening process S17 using abrasive grains having a modified Mohs hardness of 15 is generally 30 to 50 minutes in a case where single-sided processing is performed by the free abrasive grain method and is 60 to 100 minutes in a case where double-sided processing is performed.

That is, even from the viewpoint of shortening the processing time, it is preferable to adopt the flattening process S142 using abrasive grains having a modified Mohs hardness of less than 15. Alternatively, it is preferable to perform flattening while crushing the abrasive grains by the free abrasive grain method.

While the work-affected layer up to the previous process is removed by the flattening process S142, the work-affected layer 30 is newly introduced on the surface of the SiC wafer 20. The depth of the work-affected layer 30 introduced by the flattening process S142 is smaller than the depth of the work-affected layer 30 introduced by the conventional flattening process S17. The details will be described below.

In the conventional method, diamond abrasive grains having an average abrasive grain size of 10 μm are normally used in the conventional flattening process S17 (FIGS. 26 and 27). In the conventional flattening process S17, it is considered that the work-affected layer 30 having a depth similar to the abrasive grain size of the used diamond abrasive grains is introduced. Therefore, it is a well-established theory that in a case where the normally-used diamond abrasive grains having an abrasive grain size of 10 μm are used, the depth of the work-affected layer 30 introduced in the conventional flattening process S17 is about 10 μm per one side of the SiC wafer 20.

On the other hand, the depth of the work-affected layer 30 newly introduced on the surface of the SiC wafer 20 by the flattening process S142 in the present invention is 3 μm or less per one side of the SiC wafer 20.

As described above, the depth of the work-affected layer 30 introduced by the flattening process S142 of the present invention is smaller than the depth of the work-affected layer 30 introduced by the conventional flattening process S17.

In the work-affected layer removing process S20 which is a subsequent process, it is necessary to remove all the work-affected layer 30 introduced in the flattening process S142 or the conventional flattening process S17. Therefore, by adopting the flattening process S142 in which a depth of the work-affected layer 30 introduced into the SiC wafer 20 is small, and the abrasive grains having a modified Mohs hardness of less than 15 are used, the processing amount and processing time in the subsequent work-affected layer removing process S20 can be reduced compared with a case where the conventional flattening process S17 using diamond abrasive grains in the conventional method is adopted.

Further, in the conventional flattening process S17 using diamond abrasive grains, deep scratches are randomly generated, which causes a problem in terms of quality control.

On the other hand, in the flattening process S142 using abrasive grains having a modified Mohs hardness of less than 15 in the present invention, such scratches are unlikely to occur, which is very advantageous in terms of quality control.

Further, the depth of the work-affected layer 30 introduced in the flattening process S142 of the present invention is as small as 3 μm or less and is uniform. The Si vapor pressure etching performed in the subsequent etching process S21 is suitable for removing such a small and uniform work-affected layer 30 with a minimum amount of material loss.

That is, the material loss can be remarkably reduced by combining the flattening process S142 using abrasive grains having a modified Mohs hardness of less than 15 and the etching process S21.

<2> Work-Affected Layer Removing Process (Etching Process)

The work-affected layer removing process S20 is a process of removing the work-affected layer 30 introduced into the SiC wafer 20 in the preceding process. The SiC wafer manufacturing method of the present invention includes the etching process S21 for etching the SiC wafer 20 by heating under Si vapor pressure in the work-affected layer removing process S20.

As described above, the work-affected layer removing process S20 is a process of removing the work-affected layer 30 introduced into the SiC wafer 20 in the preceding process. Therefore, as illustrated in FIGS. 6 and 7, the work-affected layer removing process S20 including the etching process S21 is preferably performed after the wafer shape forming process S10 including the flattening process S142, the stamp forming process S15, and the chamfering process S16.

The SiC wafer manufacturing method of the present invention for achieving the third object has a remarkable effect of reducing the amount of material loss in the work-affected layer removing process S20. The details will be described below.

The work-affected layer removing process S20 in the conventional method includes a rough grinding process (step S22) in which coarse grinding is performed using diamond abrasive grains and a finish grinding process (step S23) in which fine grinding is performed using diamond abrasive grains having a finer particle size than the abrasive grains used in the rough grinding process S22 (FIGS. 26 and 27).

In the rough grinding process S22 in the conventional method, processing is performed from the main surface 21 and the back surface 22 of the SiC wafer 20 to a depth of 10 to 15 μm. Therefore, the amount of material loss per wafer accompanying the rough grinding process S22 is 20 to 30 μm on both sides.

Further, the time required for this rough grinding process S22 is normally 10 to 15 minutes on both sides.

As the grinding means for the finish grinding process S23, fixed abrasive grain polishing or the like can be exemplified similarly to the rough grinding process S22.

Normally, in this finish grinding process S23, processing is performed from the main surface 21 and the back surface 22 of the SiC wafer 20 to a depth of 3 to 10 μm. Therefore, the amount of material loss per wafer accompanying the finish grinding process S23 is 6 to 20 μm on both sides.

Further, the time required for this finish grinding process S23 is normally 6 to 20 minutes on both sides.

As described above, in the conventional method, a material loss of 20 to 30 μm occurs in the rough grinding process S22 and a material loss of 6 to 20 μm occurs in the finish grinding process S23. That is, a total material loss of 30 to 50 μm occurs in the entire work-affected layer removing process S20.

On the other hand, in the SiC wafer manufacturing method of the present invention, in the preceding wafer shape forming process S10, the work-affected layer 30 introduced in the flattening process S142 using abrasive grains having a modified Mohs hardness of less than 15 is small as 3 µm or less per side and is uniform.

Here, the etching process S21 adopted in the present invention is suitable for removing the thin and uniform work-affected layer 30. Specifically, Si vapor pressure etching has a feature of preferentially etching and removing unstable sites which are easily thermally decomposed. Therefore, the work-affected layer 30 can be preferentially etched by performing Si vapor pressure etching on the work-affected layer 30 which is introduced in the flattening process S142 and is thin and uniform as described above, and thus it is possible to suppress the occurrence of an unnecessary material loss.

That is, the work-affected layer 30 introduced in the preceding wafer shape forming process S10 can be removed with only a material loss of 3 µm on one side and 6 µm on both sides which is extremely small in comparison with the conventional method (a material loss of 30 to 50 µm in total).

As described above, the SiC wafer manufacturing method of the present invention realizes a remarkable reduction in the amount of material loss by combining the flattening process S142 using abrasive grains having a modified Mohs hardness of less than 15 and the etching process S21.

From the viewpoint of removing the necessary and sufficient amount of the work-affected layer 30, specifically, in the etching process S21, it is desirable to etch the SiC wafer 20 by preferably 10 µm or less, more preferably 5 µm or less, and still more preferably 3 µm or less per side.

Further, in the etching process S21, it is desirable to etch the SiC wafer 20 by preferably 0.5 µm or more and more preferably 1 µm or more per side.

The SiC wafer manufacturing method of the present invention is also excellent in the simplicity of the process required in the work-affected layer removing process S20. The details will be described below.

In the rough grinding process S22 in the conventional method, diamond abrasive grains having an average abrasive grain size of 3 to 10 µm are adopted. In the rough grinding process S22, the work-affected layer 30 having a depth similar to the grain size of the used diamond abrasive grains is introduced. Therefore, in a case where diamond abrasive grains having an average abrasive grain size of 3 to 10 µm are used, it is considered that the depth of the work-affected layer 30 introduced in the rough grinding process S22 is generally about 3 to 10 µm.

Further, in the finish grinding process S23 in the conventional method, diamond abrasive grains having an average abrasive grain size of 0.1 to 3 µm are adopted. Similar to the rough grinding process S22, also in the finish grinding process S23, the work-affected layer 30 having a depth similar to the grain size of the used diamond abrasive grains is introduced. Therefore, in a case where diamond abrasive grains having an average abrasive grain size of 0.1 to 3 µm are used, it is considered that the depth of the work-affected layer 30 introduced in the finish grinding process S23 is generally about 0.1 to 3 µm.

As described above, in the conventional method, in order to remove the work-affected layer 30 introduced in the wafer shape forming process S10, the rough grinding process S22 is first performed, but the work-affected layer 30 is newly introduced also in this process. The finish grinding process S23 is performed to remove the newly introduced work-affected layer 30.

That is, in the conventional method, a multi-step process is required to remove the work-affected layer 30 of the SiC wafer 20, and there is a problem in terms of the simplicity of the process.

On the other hand, in the SiC wafer manufacturing method of the present invention, it is possible to remove the work-affected layer 30 introduced in the preceding wafer shape forming process S10 in one process of the etching process S21 (FIGS. 6 and 7).

This is because in the preceding wafer shape forming process S10, the work-affected layer 30 introduced in the flattening process S142 using abrasive grains having a modified Mohs hardness of less than 15 is extremely small as 3 µm or less per side in comparison with the conventional method.

That is, the SiC wafer manufacturing method of the present invention significantly improves the work efficiency of the work-affected layer removing process S20 by combining the flattening process S142 using abrasive grains having a modified Mohs hardness of less than 15 and the etching process S21.

In the conventional method, it is general to grind one side at a time in the rough grinding process S22 and the finish grinding process S23. However, the method has a problem that warp of the wafer due to the Twyman effect occurs as well as the labor for attaching and detaching the wafer increases.

On the other hand, in the etching process S21 adopted in the SiC wafer manufacturing method of the present invention, both sides can be etched at the same time, and thus the warp of the wafer due to the Twyman effect does not occur.

In the etching process S21, the work-affected layer 30 introduced in places (around the outer peripheral portion 23 and the stamp portion 25) other than the main surface 21 and the back surface 22 can also be removed (see FIG. 7), which can contribute to improving the quality of the SiC wafer 20.

The SiC wafer manufacturing method of the present invention for achieving the fourth object has a remarkable effect that more SiC wafers can be manufactured from one ingot. The details will be described below.

As described above, in the conventional method, diamond abrasive grains having an average abrasive grain size of 10 µm are used in the conventional flattening process S17. However, in this process, it is a well-established theory that the work-affected layer 30 having a size similar to the average abrasive grain size, that is, 10 µm is introduced in the SiC wafer 20.

In the conventional method, in order to remove the work-affected layer 30 of 10 µm, the work-affected layer removing process S20 includes the rough grinding process (step S22) in which coarse grinding is performed using diamond abrasive grains and the finish grinding process (step S23) in which fine grinding is performed using diamond abrasive grains having a finer particle size than the abrasive grains used in the rough grinding process S22 (FIGS. 26 and 27).

In the rough grinding process S22 in the conventional method, diamond abrasive grains having an average abrasive grain size of 3 to 10 µm are used to perform processing from the main surface 21 and the back surface 22 of the SiC wafer 20 to a depth of 10 to 15 µm. Therefore, the amount of material loss per wafer accompanying the rough grinding process S22 is 20 to 30 µm on both sides. Then, in this process, the work-affected layer 30 having a size of about 3 to 10 µm similar to the average abrasive grain size of diamond abrasive grains is newly introduced.

Incidentally, the time required for this rough grinding process S22 is normally 10 to 15 minutes on both sides.

In the following finish grinding process S23, the fixed abrasive grain polishing or the like can be exemplified similarly to the rough grinding process S22.

Normally, in this finish grinding process S23, diamond abrasive grains having an average abrasive grain size of 0.1 to 3 µm are used to perform processing from the main surface 21 and the back surface 22 of the SiC wafer 20 to a depth of 3 to 10 µm. Therefore, the amount of material loss per wafer accompanying the finish grinding process S23 is 6 to 20 µm on both sides. Then, in this process, the work-affected layer 30 having a size of about 0.1 to 3 µm similar to the average abrasive grain size of diamond abrasive grains is newly introduced.

Incidentally, the time required for this finish grinding process S23 is normally 6 to 20 minutes on both sides.

As described above, in the conventional method, in order to remove the work-affected layer 30 of about 10 µm introduced in the conventional flattening process S17, a material loss of 20 to 30 µm occurs in the rough grinding process S22, and a material loss of 6 to 20 µm occurs in the finish grinding process S23. That is, a total material loss of 30 to 50 µm occurs in the entire work-affected layer removing process S20.

On the other hand, in the SiC wafer manufacturing method of the present invention, the work-affected layer 30 introduced in the preceding flattening process S142 is removed by the etching process S21.

In a preferable embodiment, the substantially same amount as the depth of the work-affected layer 30 introduced in the flattening process S142, specifically, an amount within an error ±1 µm with respect to the depth of the work-affected layer 30, more preferably an amount within an error ±0.5 µm, and still more preferably an amount within an error ±0.2 µm is etched to be removed.

In this way, in the etching process S21, by etching while suppressing the amount of material loss, more SiC wafers 20 can be manufactured from one ingot.

Si vapor pressure etching has a feature of preferentially etching and removing unstable sites which are easily thermally decomposed. Therefore, the work-affected layer 30 can be preferentially etched by performing Si vapor pressure etching on the work-affected layer 30 which is introduced in the flattening process S142, and thus it is possible to suppress the occurrence of an unnecessary material loss.

That is, since the work-affected layer 30 introduced in the preceding wafer shape forming process S10 can be preferentially removed without causing an extra material loss, the work-affected layer 30 can be removed with only an extremely small material loss in comparison with the conventional method (a material loss of 30 to 50 µm in total).

As described above, with the configuration in which the work-affected layer 30 introduced in the flattening process S142 is removed by the etching process S21, the SiC wafer manufacturing method of the present invention realizes a remarkable reduction in the amount of material loss.

From the viewpoint of removing the necessary and sufficient amount of the work-affected layer 30, specifically, in the etching process S21, it is desirable to etch the SiC wafer 20 by preferably 10 µm or less, more preferably 5 µm or less, and still more preferably 3 µm or less per side.

Further, in the etching process S21, it is desirable to etch the SiC wafer 20 by preferably 0.5 µm or more and more preferably 1 µm or more per side.

As described above, a multi-step process is required to remove the work-affected layer 30 introduced in the conventional flattening process S17. However, in the present invention, the work-affected layer 30 introduced in the flattening process S142 can be removed in one process of the etching process S21.

That is, according to the present invention, the SiC wafer 20 can be manufactured with a smaller number of processes as compared with the conventional method.

In the conventional method, it is general to grind one side at a time in the rough grinding process S22 and the finish grinding process S23. However, the method has a problem that warp of the wafer due to the Twyman effect occurs as well as the labor for attaching and detaching the wafer increases.

On the other hand, in the etching process S21 adopted in the SiC wafer manufacturing method of the present invention, both sides can be etched at the same time, and thus the warp of the wafer due to the Twyman effect does not occur.

In the etching process S21, the work-affected layer 30 introduced in places (around the outer peripheral portion 23 and the stamp portion 25) other than the main surface 21 and the back surface 22 can also be removed (see FIG. 3), which can contribute to improving the quality of the SiC wafer 20.

That is, the work-affected layer removing process S20 is a process of removing the work-affected layer 30 introduced into the SiC wafer 20 in the preceding process. Therefore, as illustrated in FIGS. 6 and 7, the work-affected layer removing process S20 including the etching process S21 is performed after the flattening process S142. By performing the etching process S21 after the flattening process S142, the work-affected layer 30 introduced into the SiC wafer by the flattening process S142 can be removed in the etching process S21.

In the SiC wafer subjected to the etching process S21, not only the surface but also the internal lattice strain (the strain layer 32 in FIG. 22) is removed. By performing a subsequent chemical mechanical polishing process S32 on the SiC wafer 20, it is possible to manufacture the high-quality SiC wafer 20 in which the lattice strain in the wafer is removed and which has high flatness.

In addition to the flattening process S142, it is preferable that the stamp forming process S15 and the chamfering process S16 are also performed before the etching process S21. Accordingly, the work-affected layer 30 introduced around the outer peripheral portion 23 and the stamp portion 25 and stress can be removed (see FIG. 7), which can contribute to improving the quality of the SiC wafer 20.

As described above, it is desirable that the crystal lattice under the surface (the main surface 21 and the back surface 22) of the SiC wafer 20 subjected to the etching process S21 does not have lattice strain. The lattice strain does not occur in the SiC wafer 20 as described above, and thus it is possible to provide the SiC wafer 20 which is preferable for the device manufacturing process.

<3> Mirror Surface Polishing Process

One embodiment of the SiC wafer manufacturing method of the present invention includes the mirror surface polishing process S30.

The mirror surface polishing process S30 includes a chemical mechanical polishing (CMP) process (step S32) in which polishing is performed by combining the mechanical action of the polishing pad and the chemical action of the slurry.

In the SiC wafer manufacturing method of the present invention for achieving the fifth object, the chemical mechanical polishing process S32 is performed after the etching process S21 and more preferably without interposing another process (more specifically, a process in which the work-affected layer 30 can be introduced) after the etching process S21.

This chemical mechanical polishing process S32 is a process of performing processing into a mirror surface which is in a surface state preferable for the subsequent device manufacturing process. Incidentally, although FIG. 7 illustrates an aspect in which the main surface 21 of the SiC wafer 20 is mirrorized (two-dot chain line portion), both the main surface 21 and the back surface 22 may be mirrorized, or only the back surface 22 may be mirrorized.

Incidentally, from the viewpoint of product management, it is preferable to carry out the chemical mechanical polishing process S32 only on the main surface 21 to manufacture the SiC wafer 20 having a mirror surface and a satin surface. The main surface 21 subjected to the chemical mechanical polishing process S32 does not have the work-affected layer 30 and has a high flatness, and the remaining back surface 22 also has an excellent surface without the work-affected layer 30. That is, according to the SiC wafer manufacturing method of the present invention, it is possible to manufacture the high-quality SiC wafer 20 having a mirror surface and a satin surface.

Normally, in the chemical mechanical polishing process S32, processing is performed from the surface of the SiC wafer 20 to a depth of 0.5 to 1.5 µm. Therefore, the amount of material loss per wafer accompanying the chemical mechanical polishing process S32 is 0.5 to 1.5 µm in the case of single-sided processing and 1 to 3 µm in the case of double-sided processing.

Further, the time required for this chemical mechanical polishing process S32 is normally 15 to 45 minutes for single-sided polishing and 30 to 90 minutes for double-sided polishing.

Incidentally, the chemical mechanical polishing process S32 in the conventional method has a technical significance of removing the work-affected layer 30 newly introduced in the finish grinding process S23 in the work-affected layer removing process S20 (FIGS. 26 and 27). On the other hand, in the SiC wafer manufacturing method of the present invention, it is possible to remove all the work-affected layer 30 in the preceding etching process S21. Therefore, in the chemical mechanical polishing process S32 in the SiC wafer manufacturing method of the present invention, the technical significance of removing the work-affected layer 30 is less than that of the conventional method.

<4> Summary

Table 1 summarizes the amount of material loss and the depth of the introduced work-affected layer 30 in each process of the conventional method and the SiC wafer manufacturing method of the present invention for achieving the third object.

TABLE 1

|  |  | DEPTH OF WORK-AFFECTED LAYER 30 | MATERIAL LOSS AMOUNT | PROCESSING TIME |
| --- | --- | --- | --- | --- |
| PRESENT INVENTION | FLATTENING PROCESS S142: BOTH SIDES (ABRASIVE GRAINS: MODIFIED MOHS HARDNESS OF LESS THAN 15) | ~10 µm | 60-100 µm | 5-15 MINUTES |
|  | ETCHING PROCESS S21: BOTH SIDES | — | ~6 µm | 3 MINUTES |
|  | CHEMICAL MECHANICAL POLISHING PROCESS S32: ONE SIDE | — | 0.5-1.5 µm | 15-45 MINUTES |
|  |  | | TOTAL MATERIAL LOSS AMOUNT 61-108 µm | TOTAL PROCESSING TIME 23-63 MINUTES |
| CONVENTIONAL TECHNIQUE | FLATTENING PROCESS S17: BOTH SIDES (ABRASIVE GRAINS: MODIFIED MOHS HARDNESS OF 15) | ABOUT 10 µm | 60-100 µm | 60-100 MINUTES |
|  | ROUGH GRINDING PROCESS S22: BOTH SIDES | 3-10 µm | 20-30 µm | 10-15 MINUTES |
|  | FINISH GRINDING PROCESS S23: BOTH SIDES | 0.1-3 µm | 6-20 µm | 6-20 MINUTES |
|  | CHEMICAL MECHANICAL POLISHING PROCESS S32: ONE SIDE | — | 0.5-1.5 µm | 15-45 MINUTES |
|  |  | | TOTAL MATERIAL LOSS AMOUNT 87-152 µm | TOTAL PROCESSING TIME 91-180 MINUTES |

As illustrated in Table 1, in the conventional method, a total material loss of 87 to 152 µm occurs. In particular, in the conventional method, in order to reliably remove the work-affected layer 30, it is common to remove 100 µm or more per SiC wafer 20.

On the other hand, the amount of material loss in the SiC wafer manufacturing method of the present invention is 61 to 108 µm. As described above, according to the present invention, it is possible to significantly reduce the amount of material loss in the manufacture of SiC wafers.

The pre-processing thickness Dl of the SiC wafer 20 cut out from the ingot 10 in the slicing process S13 is set using this amount of material loss as an index. That is, the thickness obtained by adding the amount of material loss to the thickness D of the SiC wafer 20 to be finally obtained (the thickness of the SiC wafer 20 at the end of surface processing) is set as the pre-processing thickness Dl.

As described above, the pre-processing thickness Dl is determined by adding the amount of material loss to the thickness of the SiC wafer after the surface processing is completed. The term "surface processing" as used herein refers to processing, such as the flattening process S142, the etching process S21, and the chemical mechanical polishing process S32, which reduces the thickness of the SiC wafer 20.

That is, the pre-processing thickness Dl is set by adding the amount of material loss to the thickness of the SiC wafer 20 reaching a point of time when the thickness does not decrease further by the subsequent process.

Therefore, the thickness obtained by adding a thickness of 61 µm or more, more preferably 62 µm or more, and still more preferably 63 µm or more as a lower limit to the thickness D of the SiC wafer 20 is preferably set as the pre-processing thickness Dl.

When the thickness obtained by adding a thickness of 108 µm or less, more preferably 106 µm or less, and still more preferably 96 µm or less as an upper limit to the thickness D of the SiC wafer 20 is set as the pre-processing thickness Dl, more SiC wafers 20 can be manufactured from one ingot 10.

As described above, in the conventional method, it is common to remove 100 µm or more per SiC wafer 20. Therefore, the thickness obtained by adding a thickness of 100 µm or less and more preferably less than 100 µm as an upper limit to the thickness D of the SiC wafer 20 is preferably set as the pre-processing thickness Dl. Accordingly, more SiC wafers 20 can be manufactured as compared with a case where the conventional method performed generally is used.

As illustrated in Table 1, the lower limit of the amount of material loss is 87 µm in the conventional method. Therefore, the thickness obtained by adding a thickness of 87 µm or less, more preferably less than 87 µm, and more preferably 80 µm or less as an upper limit to the thickness D of the SiC wafer 20 is preferably set as the pre-processing thickness Dl. Accordingly, the SiC wafer 20 can be manufactured with a high yield which is difficult to realize by the conventional method.

Incidentally, the thickness D of the SiC wafer 20 subjected to the slicing process S13 to the mirror surface polishing process S30 can be, as the examples, typically 100 to 600 µm, more typically 150 to 550 µm, still more typically 200 to 500 µm, still more typically 250 to 450 µm, and still more typically 300 to 400 µm.

That is, the pre-processing thickness Dl is preferably set by adding the amount of material loss by the SiC wafer manufacturing method of the present invention to the thickness of these typical SiC wafers 20.

Specifically, in a case where it is desired to obtain the SiC wafer 20 having a thickness D of 350 µm as a final product by the SiC wafer manufacturing method of the present invention, it is more preferable to obtain the SiC wafer 20 having the pre-processing thickness Dl of 411 µm or more, more preferably 412 µm or more, and still more preferably 413 µm or more as a lower limit in the slicing process S13.

Further, it is more preferable to obtain the SiC wafer 20 having the pre-processing thickness Dl of 458 µm or less, more preferably 456 µm or less, still more preferably 450 µm or less, still more preferably less than 450 µm, still more preferably 446 µm or less, still more preferably 437 µm or less, and still more preferably less than 437 µm as an upper limit in the slicing process S13.

In the conventional method, the total processing time from after the slicing process S13 to after the chemical mechanical polishing process S32 is 91 to 180 minutes.

On the other hand, in the present invention, the total processing time from after the slicing process S13 to after the chemical mechanical polishing process S32 is 23 to 63 minutes.

As described above, the SiC water manufacturing method of the present invention is also effective from the viewpoint of shortening the processing time.

Next, Table 2 summarizes the amount of material loss and the depth of the introduced work-affected layer 30 in each process of the conventional method and the SiC wafer manufacturing method of the present invention for achieving the fourth and fifth objects.

TABLE 2

| | | DEPTH OF WORK-AFFECTED LAYER 30 | MATERIAL LOSS AMOUNT |
|---|---|---|---|
| PRESENT INVENTION | FLATTENING PROCESS S142: BOTH SIDES (ABRASIVE GRAINS: MODIFIED MOHS HARDNESS OF LESS THAN 15) | –10 µm | 60-100 µm |
| | ETCHING PROCESS S21: BOTH SIDES | — | –20 µm |
| | CHEMICAL MECHANICAL POLISHING PROCESS S32: ONE SIDE | — | 0.5-1.5 µm |
| | | | TOTAL MATERIAL LOSS AMOUNT 61-122 µm |

TABLE 2-continued

|  |  | DEPTH OF WORK-AFFECTED LAYER 30 | MATERIAL LOSS AMOUNT |
|---|---|---|---|
| CONVENTIONAL TECHNIQUE | FLATTENING PROCESS S17: BOTH SIDES (ABRASIVE GRAINS: MODIFIED MOHS HARDNESS OF 15) | ABOUT 10 μm | 60-100 μm |
|  | ROUGH GRINDING PROCESS S22: BOTH SIDES | 3-10 μm | 20-30 μm |
|  | FINISH GRINDING PROCESS S23: BOTH SIDES | 0.1-3 μm | 6-20 μm |
|  | CHEMICAL MECHANICAL POLISHING PROCESS S32: ONE SIDE | — | 0.5-1.5 μm |
|  |  |  | TOTAL MATERIAL LOSS AMOUNT 87-152 μm |

As illustrated in Table 2, in the conventional method, a total material loss of 87 to 152 μm occurs. In particular, in the conventional method, in order to reliably remove the work-affected layer 30 introduced in each process, it is common to remove 100 μm or more per SiC wafer 20.

On the other hand, the amount of material loss in the SiC wafer manufacturing method of the present invention is 61 to 122 μm as illustrated in Table 2. As described above, according to the present invention, it is possible to significantly reduce the amount of material loss in the manufacture of SiC wafers.

The pre-processing thickness Dl of the SiC wafer 20 cut out from the ingot 10 in the slicing process S13 is set using this amount of material loss as an index. That is, the thickness obtained by adding the amount of material loss to the thickness D of the SiC wafer 20 to be finally obtained (the thickness of the SiC wafer 20 at the end of surface processing) is set as the pre-processing thickness Dl.

As described above, the pre-processing thickness Dl is determined by adding the amount of material loss to the thickness of the SiC wafer after the surface processing is completed. The term "surface processing" as used herein refers to processing, such as the flattening process S142, the etching process S21, and the chemical mechanical polishing process S32, which reduces the thickness of the SiC wafer 20.

That is, the pre-processing thickness Dl is set by adding the amount of material loss to the thickness of the SiC wafer 20 reaching a point of time when the thickness does not decrease further by the subsequent process.

Therefore, the thickness obtained by adding a thickness of 61 μm or more, more preferably 62 μm or more, and still more preferably 63 μm or more as a lower limit to the thickness D of the SiC wafer 20 is preferably set as the pre-processing thickness Dl.

The thickness obtained by adding a thickness of 122 μm or less, more preferably 120 μm or less, and still more preferably 110 μm or less as an upper limit to the thickness D of the SiC wafer 20 is preferably set as the pre-processing thickness Dl. Accordingly, more SiC wafers 20 can be manufactured from one ingot 10.

As described above, in the conventional method, it is common to remove 100 μm or more per SiC wafer 20. Therefore, the thickness obtained by adding a thickness of 100 μm or less and more preferably less than 100 μm as an upper limit to the thickness D of the SiC wafer 20 is preferably set as the pre-processing thickness Dl. Accordingly, more SiC wafers 20 can be manufactured as compared with a case where the conventional method performed generally is used.

As illustrated in Table 2, the lower limit of the amount of material loss is 87 μm in the conventional method. Therefore, when the thickness obtained by adding a thickness of 87 μm or less, more preferably less than 87 μm, still more preferably 80 μm or less as an upper limit to the thickness D of the SiC wafer 20 is set as the pre-processing thickness Dl, the SiC wafer 20 can be manufactured with a high yield which is difficult to realize by the conventional method.

Incidentally, the thickness D of the SiC wafer 20 subjected to the slicing process S13 to the mirror surface polishing process S30 can be, as the examples, typically 100 to 600 μm, more typically 150 to 550 μm, still more typically 200 to 500 μm, still more typically 250 to 450 μm, and still more typically 300 to 400 μm.

That is, the pre-processing thickness Dl is preferably set by adding the amount of material loss by the SiC wafer manufacturing method of the present invention to the thickness of these typical SiC wafers 20.

Specifically, in a case where it is desired to obtain the SiC wafer 20 having a thickness D of 350 μm as a final product by the SiC wafer manufacturing method of the present invention, it is more preferable to obtain the SiC wafer 20 having the pre-processing thickness Dl of 411 μm or more, more preferably 412 μm or more, and still more preferably 413 μm or more as a lower limit in the slicing process S13.

Further, in this case, it is more preferable to obtain the SiC wafer 20 having the pre-processing thickness Dl of 472 μm or less, more preferably 470 μm or less, still more preferably 460 μm or less, still more preferably 450 μm or less, still more preferably less than 450 μm, still more preferably 437 μm or less, and still more preferably less than 437 μm as an upper limit in the slicing process S13.

In the flattening process S142, in a case where abrasive grains having a modified Mohs hardness of less than 15 are used or a case where flattening is performed while crushing abrasive grains, it is possible to suppress the depth of the work-affected layer 30 introduced in this process to 3 μm or less.

The amount of material loss and the depth of the introduced work-affected layer 30 in each process in this case are as described in Table 3 below.

TABLE 3

|  |  | DEPTH OF WORK-AFFECTED LAYER 30 | MATERIAL LOSS AMOUNT |
|---|---|---|---|
| PRESENT INVENTION | FLATTENING PROCESS S142: BOTH SIDES (ABRASIVE GRAINS: MODIFIED MOHS HARDNESS OF LESS THAN 15) | −3 μm | 60-100 μm |
|  | ETCHING PROCESS S21: BOTH SIDES | — | −6 μm |
|  | CHEMICAL MECHANICAL POLISHING PROCESS S32: ONE SIDE | — | 0.5-1.5 μm |
|  |  |  | TOTAL MATERIAL LOSS AMOUNT 61-108 μm |

As illustrated in Table 3, in the case of the preferable aspect in which the depth of the work-affected layer 30 introduced in the flattening process S142 is suppressed to 3 μm or less, the amount of material loss is 61 to 108 μm. As described above, according to the present invention, it is possible to significantly reduce the amount of material loss in the manufacture of SiC wafers.

Therefore, in a preferable aspect of the present invention, when the thickness obtained by adding a thickness of preferably 108 μm or less, more preferably 106 μm or less, and still more preferably 96 μm or less is set as the pre-processing thickness D1, more SiC wafers 20 can be manufactured from one ingot 10.

Specifically, in a case where it is desired to obtain the SiC wafer 20 having the thickness D of 350 μm as a final product according to the preferable aspect of the present invention, it is more preferable to obtain the SiC wafer 20 having the pre-processing thickness D1 of 458 μm or less, more preferably 456 μm or less, still more preferably 450 μm or less, still more preferably less than 450 μm, still more preferably 446 μm or less, still more preferably 437 μm or less, and still more preferably less than 437 μm as an upper limit in the slicing process S13.

Incidentally, the numerical values in a case where the etching amount in the etching process S21 is 20 μm or less and 6 μm or less are summarized in Tables 2 and 3, and the specific numerical values for the pre-processing thickness D1 are described on the basis of these numerical values. However, of course, the embodiments of the present invention are not limited thereto.

In a case where another numerical value is taken as the etching amount in the etching process S21, the total amount of material loss can be calculated on the basis of the numerical value to set the pre-processing thickness D1. The specific numerical value of the pre-processing thickness D1 in a case where another numerical value is taken as the etching amount is not described in this specification. However, the numerical value can be obtained by a simple calculation, and thus it can be said that the numerical value is described in this specification.

Incidentally, by performing the flattening process S142 before the etching process S21, the work-affected layer 30 (a crack layer and a strain layer) introduced by the flattening process S142 can be removed by the etching process S21. By performing the chemical mechanical polishing process S32 after the etching process S21, it is possible to manufacture the high-quality SiC wafer 20 having a high flatness without the work-affected layer 30.

EMBODIMENTS

Hereinafter, the present invention will be described in more detail with reference to embodiments. However, of course, the present invention is not limited to the following embodiments.

<<Manufacturing, Observation, and Evaluation of SiC Wafer of Present Invention for Achieving First and Second Objects>>

The SiC wafers of the first embodiment and the second embodiment are manufactured by the following methods.

First Embodiment (Slicing Process)

A single crystal SiC ingot is sliced using a slurry containing diamond abrasive grains having an average abrasive grain size of 10 μm to obtain a 6-inch diameter SiC wafer.

(Satin Finishing Process) and (Flattening Process)

In the free abrasive grain method using a slurry containing $B_4C$ abrasive grains having an average abrasive grain size of 40 μm, this SiC wafer is subjected to the satin finishing under the condition that a processing pressure is 150 $g/cm^2$, a surface plate rotation speed is 15 rpm, a head rotation speed is 5 rpm, a processing time is 20 minutes, and a processing speed is about 1.0 μm/min.

At this time, the average abrasive grain size of the $B_4C$ abrasive grains at the end of the satin finishing process is 10 μm.

(Etching Process)

The SiC wafer after the flattening process is subjected to the Si vapor pressure etching under the condition that an etching amount is 3 μm (a processing time of about 3 min and a processing speed of 1 μm/min), an etching amount is 6 μm (a processing time of about 6 min and a processing speed of 1 μm/min), and an etching amount is 9 μm (a processing time of about 9 min and a processing speed of 1 μm/min). The thickness of the SiC wafer after the etching process is 350 μm.

Second Embodiment (Slicing Process)

The slicing process is carried out under the same conditions as in the first embodiment to obtain a 6-inch diameter SiC wafer.

(Satin Finishing Process) and (Flattening Process)

This SiC wafer is flattened under the following conditions by the fixed abrasive grain method using a grindstone (vitrified bond) containing diamond abrasive grains having an average abrasive grain size of 30 μm.

Grindstone rotation speed: 1250 rpm
Cutting pitch: 2 μm
Front-back feed: 190 m/min
Left-right feed: 21 m/min
Processing speed: 100 um/hour (Etching Process)

The Si vapor pressure etching is carried out under the same conditions as in the first embodiment. The thickness of the SiC wafer after the etching process is 350 μm.

<Observation and Evaluation of Satin>

The back surfaces of the SiC wafers of the first embodiment and the second embodiment are observed using a white interference microscope. The results are illustrated in FIGS. 8 and 9.

FIG. 8 is a white interference microscope image (95 μm×75 μm) of the first embodiment, FIG. 8(a) illustrates an image before the etching process, and FIG. 8(b) illustrates an image after the etching process (an etching amount is 3 μm).

FIG. 9 is a white interference microscope image (95 μm×75 μm) of the second embodiment, FIG. 9(a) illustrates an image before the etching process, and FIG. 9(b) illustrates an image after the etching process (an etching amount is 3 μm).

As illustrated in FIGS. 8 and 9, a satin surface is formed on the back surfaces of the SiC wafers of the first and second embodiments. Specifically, as illustrated in FIG. 8, a satin surface in which irregular and fine speckled irregularities are randomly combined in a non-directional manner is formed on the back surface of the SiC wafer of the first embodiment. Further, as illustrated in FIG. 9, a satin surface in which streaky irregularities extending in one direction are arranged is formed on the back surface of the SiC wafer of the second embodiment. Further, as seen from FIGS. 8 and 9, it can be seen that the satin surface after etching has a surface structure having smooth edges with fine burrs removed.

Table 4 summarizes the arithmetic mean roughness Ra and the maximum height Rz with respect to the etching amount in the first and second embodiments.

TABLE 4

| ETCHING | FIRST EMBODIMENT | | SECOND EMBODIMENT | |
| --- | --- | --- | --- | --- |
| AMOUNT | Ra | Rz | Ra | Rz |
| μm | nm | μm | nm | μm |
| 0 | 333 | 4.8 | 141 | 3.3 |
| 3 | 294 | 4.4 | 88 | 2.4 |
| 6 | 255 | 3.3 | 108 | 2.8 |
| 9 | 216 | 2.3 | 104 | 2.4 |

As illustrated in Table 4, it can be confirmed that the arithmetic mean roughness Ra and the maximum height Rz tend to decrease by increasing the etching amount. In particular, in the first embodiment, it can be seen that the arithmetic mean roughness Ra and the maximum height Rz tend to decrease.

This result shows that it is possible to obtain a remarkable effect that the satin surface roughness of the SiC wafer which is a difficult-to-process material can be controlled by adjusting the etching amount.

The satin surfaces of the SiC wafers of the first and second embodiments are hard to slip during conveyance or in the equipment and are easy to peel off from the electrostatic chuck type sample table. Further, the satin surface roughness can be set such that the adhesion of particles is hard to occur, and a problem such as deterioration of the flatness of the wafer does not occur during chucking to the sample table.

Incidentally, when the main surface 21 of the SiC wafer is made a mirror surface by a known method, it is possible to obtain a SiC wafer in which detection by an optical sensor is possible and which has an advantage in the device manufacturing process.

<Reflectance and Transmittance of SiC Wafer>

Figure 11:
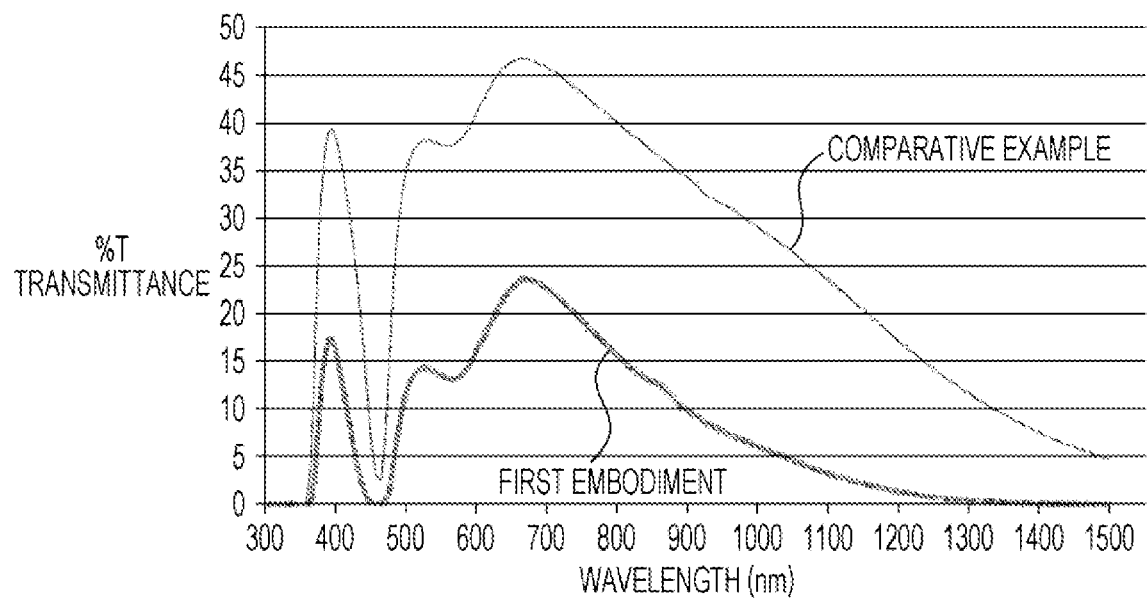
FIG. 11 is a graph illustrating an external transmittance of the SiC wafer of the first embodiment.

The reflectance and external transmittance of the SiC wafer of the first embodiment are measured using a spectrophotometer (U-4000 type spectrophotometer). FIG. 10 shows the result of measuring the reflectance, and FIG. 11 shows the result of measuring the external transmittance. Incidentally, as a comparative example, the reflectance and the external transmittance of the SiC wafer of which the main surface and back surface are mirror surfaces are shown in FIGS. 10 and 11.

FIG. 10(a) shows the result of measuring the reflectance of an electromagnetic wave having a wavelength of 300 to 1500 nm incident from the main surface side of the SiC wafer and reflected to the main surface side. In the reflectance of the comparative example in which both sides are mirror surfaces, it can be seen that the reflectance varies depending on the wavelength in the visible light region and a displacement is made between the reflectance from 19 to 27%. On the other hand, in the reflectance of the first embodiment in which the back surface is a satin surface, it can be seen that the reflectance is lower than the reflectance of the comparative example in all wavelength regions, the difference between wavelengths in the visible light region is small, and a displacement is made between the reflectance from 19 to 23%.

FIG. 10(b) shows the result of measuring the reflectance of an electromagnetic wave having a wavelength of 300 to 1500 nm incident from the back surface side of the SiC wafer and reflected to the back surface side. In the result on the main surface side of the first embodiment in FIG. 10(a), the reflectance of 19% or more is measured in the wavelength region of visible light. On the other hand, in the result on the back surface side in FIG. 10(b), the reflectance of 3% or less is measured in the wavelength region of visible light.

As described above, in the first embodiment, the reflectance differs significantly between the main surface and the back surface, so that the main surface and the back surface can be easily distinguished.

FIG. 11 shows the results of measuring the transmittance of an electromagnetic wave having a wavelength of 300 to 1500 nm incident from the main surface side of the SiC wafer and passing through the SiC wafer. The transmittance of the first embodiment in which the back surface is a satin surface is lower than the transmittance of the SiC wafer of which both sides are formed as mirror surfaces in all wavelength regions.

In particular, in the results of the first embodiment, a transmittance of 25% or less is measured in all wavelength regions. Therefore, in the first embodiment in which the satin surface is formed on the back surface, it is possible to suppress the transmission of visible light and improve the detection rate of the optical sensor.

<Measurement of Work-Affected Layer by SEM-EBSD>

Figure 12:
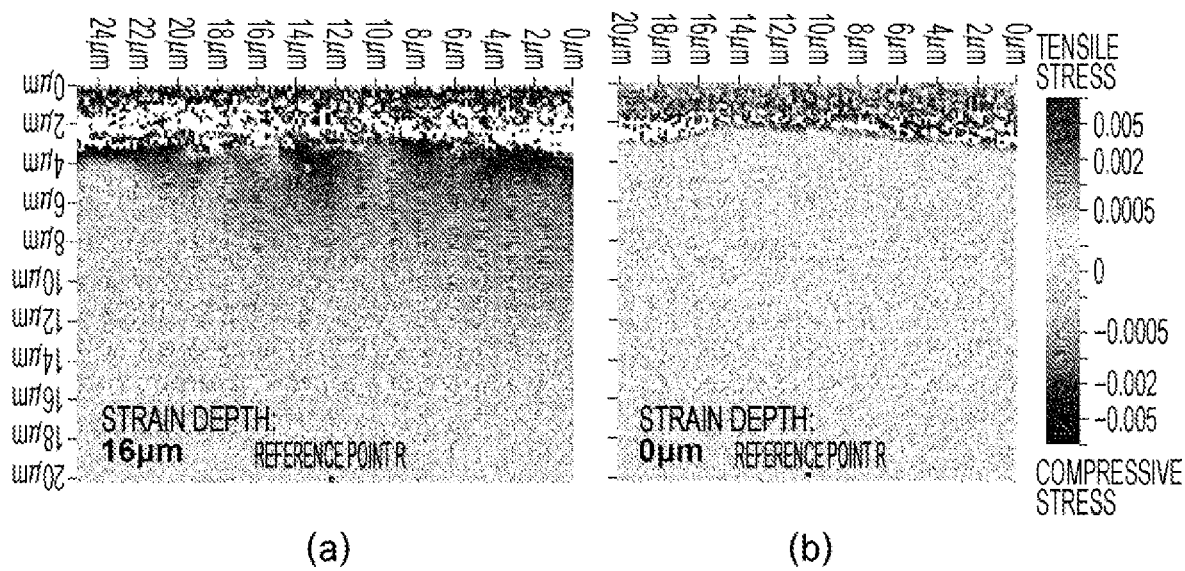
FIG. 12 is an imaging image obtained by observing a cross section of the SiC wafer of the first embodiment with SEM-EBSD.
Figure 13:
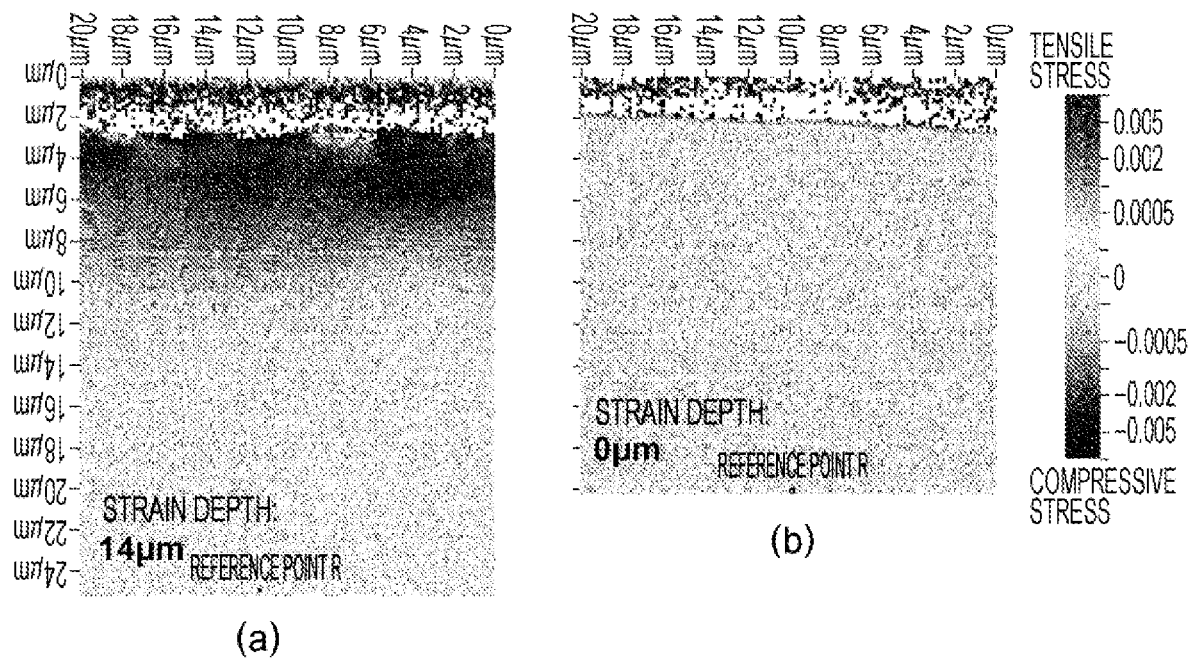
FIG. 13 is an imaging image obtained by observing a cross section of the SiC wafer of the second embodiment with the SEM-EBSD.

The stress existing in the SiC wafers of the first embodiment and the second embodiment before and after the etching process is observed by the SEM-EBSD method. The results are shown in FIGS. 12 and 13. The cross sections obtained by cleaving the SiC wafers of the first embodiment and the second embodiment are measured using a scanning electron microscope under the following conditions.

SEM equipment: Merline manufactured by Zeiss
EBSD analysis: OIM crystal orientation analyzer manufactured by TSL Solutions
Acceleration voltage: 15 kV
Probe current: 15 nA
Step size: 200 nm
Reference point R depth: 20 to 25 μm FIG. 12 is a cross-sectional SEM-EBSD imaging image of the first embodiment, and FIG. 13 is a cross-sectional SEM-EBSD imaging image of the second embodiment.

As illustrated in FIGS. 12(a) and 13(a), lattice strains are observed in the SiC wafer in both the first embodiment and the second embodiment before the etching process. The lattice strains are lattice strains introduced by the satin finishing process or the like. Incidentally, in both cases, a compressive stress is observed.

On the other hand, as illustrated in FIGS. 12(b) and 13(b), after the etching process, the crystal lattice under the surface has lattice strains of 0.001% or less with respect to the reference crystal lattice, and no lattice strain is observed in the SiC wafer of the first embodiment and the second embodiment.

From this result, it is found that almost no stress is generated in the SiC wafer 20, and the strain layer which is difficult to remove among the work-affected layer 30 is removed. That is, it is shown that the stress in the SiC wafer introduced by the flattening process or the like can be removed by the etching process.

<Measurement of Work-Affected Layer by TEM>

The cross sections of the SiC wafers of the first embodiment and the second embodiment are observed with a transmission electron microscope (TEM). The results are illustrated in FIGS. 14 and 15.

Figure 14:
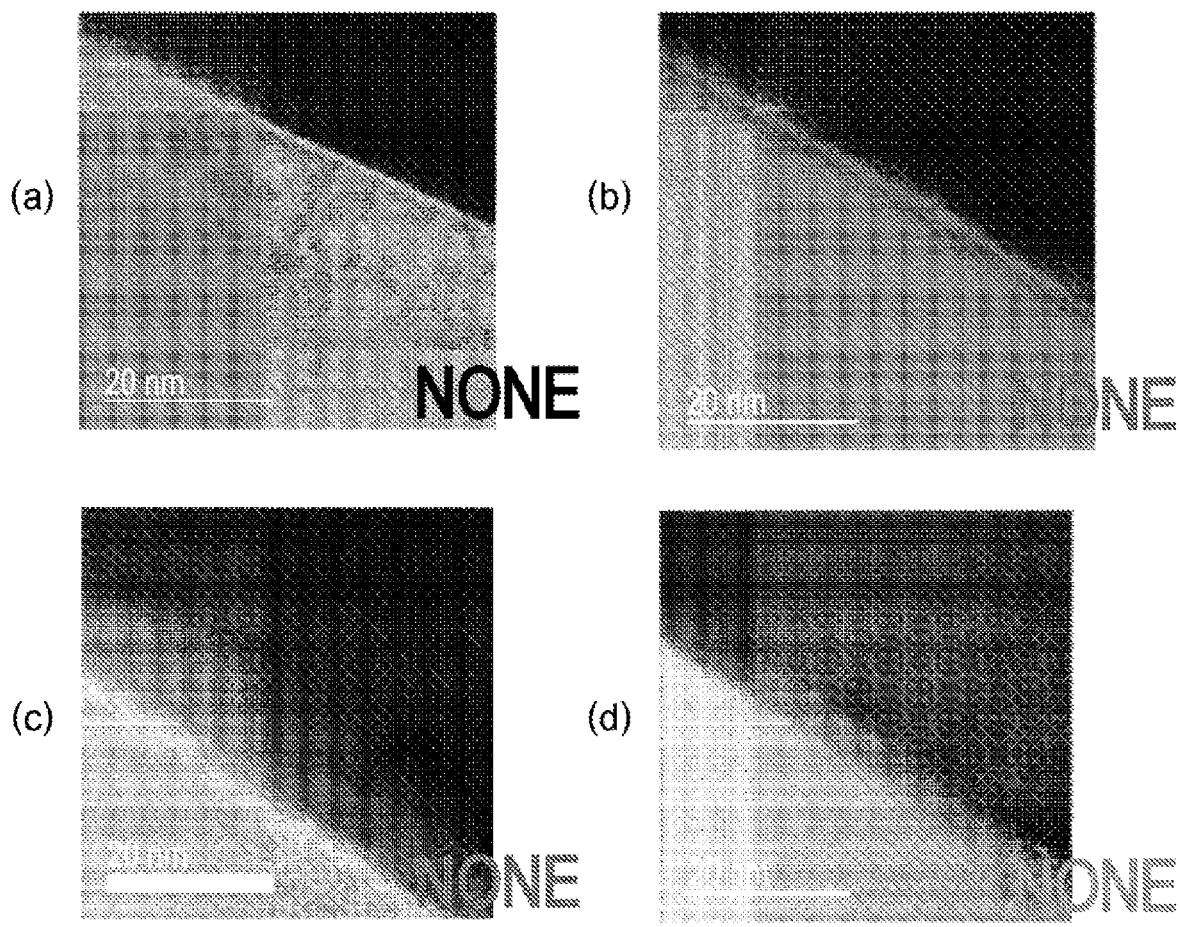
FIG. 14 is an image of a cross section of the SiC wafer of the first embodiment when observed with a transmission electron microscope.

FIG. 14 is a cross-sectional TEM image (50 nm×50 nm) of the first embodiment, in which (a) illustrates the (0001) surface side with an etching amount of 3 μm, (b) illustrates the (000-1) surface side with an etching amount of 3 μm, (c) illustrates the (0001) surface side with an etching amount of 6 μm, and (d) illustrates the (000-1) surface side with an etching amount of 6 μm.

Figure 15:
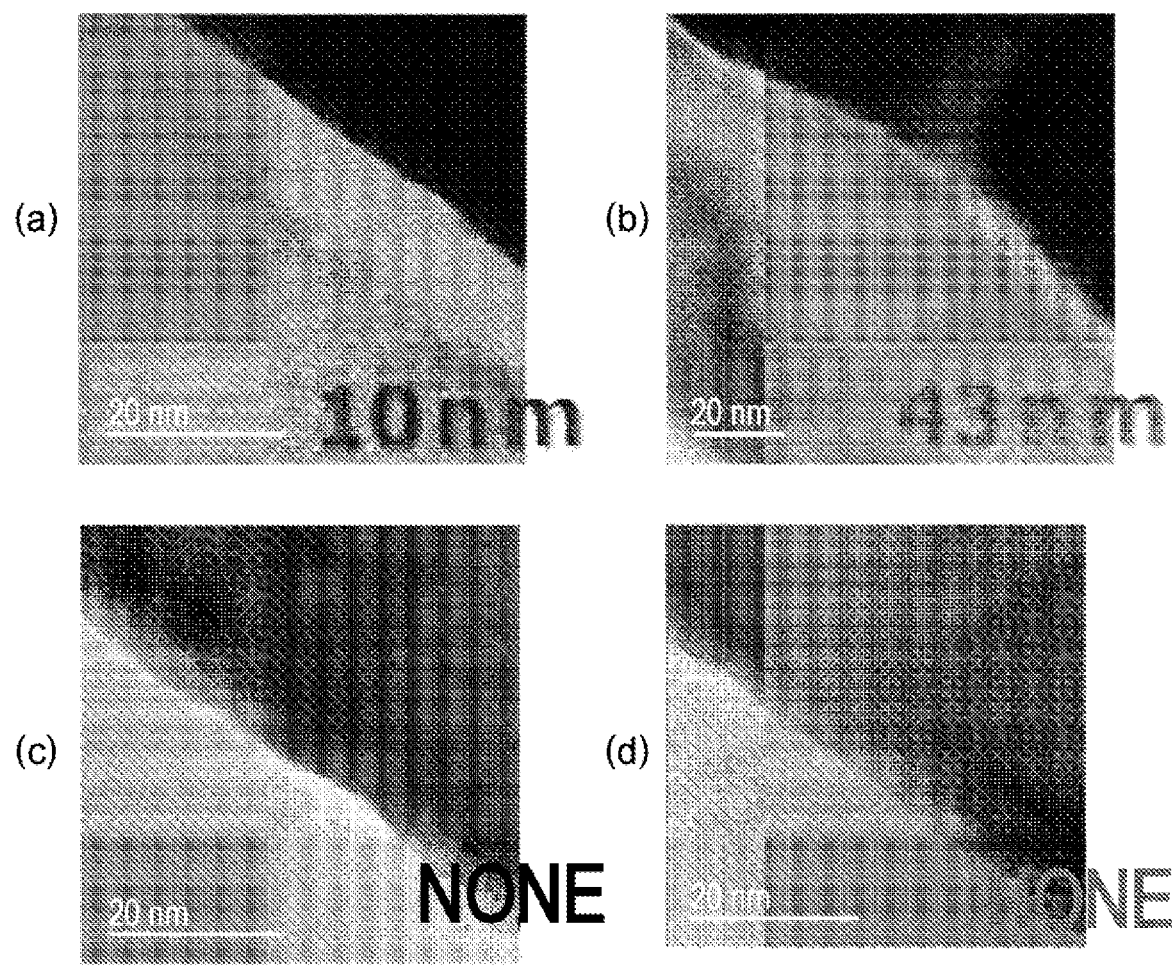
FIG. 15 is an image of a cross section of the SiC wafer of the second embodiment when observed with the transmission electron microscope.

FIG. 15 is a cross-sectional TEM image (50 nm×50 nm) of the second embodiment, in which (a) illustrates the (0001) surface side with an etching amount of 3 μm, (b) illustrates the (000-1) surface side with an etching amount of 3 μm, (c) illustrates the (0001) surface side with an etching amount of 6 μm, and (d) illustrates the (000-1) surface side with an etching amount of 6 μm.

On the basis of this cross-sectional TEM image, the presence or absence of the affected layer and the depth thereof are evaluated by the following method.

[Evaluation method] The cross-sectional TEM image is magnified to a magnification at which a work-affected layer of several nm can be confirmed, and the contrast is compared between the surface side and the bulk side to evaluate that "there is a work-affected layer" in a case where there is a contrast difference and evaluate that "there is no work-affected layer" in a case where there is no contrast difference.

In a case where "there is a work-affected layer", the depth thereof is measured on the basis of the cross-sectional TEM image.

As a result, in the SiC wafer of the first embodiment, no work-affected layer is observed when the etching amount is 3 μm or when the etching amount is 6 μm.

On the other hand, in the SiC wafer of the second embodiment, when the etching amount is 3 μm, a work-affected layer of 10 nm is observed on the (0001) surface side, and a work-affected layer of 43 nm is observed on the (000-1) surface side. However, when the etching amount is 6 μm, no work-affected layer is observed.

From the above measurement of the work-affected layer by SEM-EBSD and the measurement of the work-affected layer by TEM, it is found that substantially no work-affected layer remains in the first embodiment and the second embodiment by performing the Si vapor pressure etching.

When the chemical mechanical polishing is performed on the SiC wafer in which the work-affected layer is removed as in the SiC wafers of the first embodiment and the second embodiment, it is possible to obtain a high-quality SiC wafer which has no cracks (scratches) or lattice strain inside and a high degree of flatness.

<<Manufacturing, Observation, and Evaluation of SiC Wafer of Present Invention for Achieving Third and Fourth Objects>>

SiC wafers of a third embodiment, a fourth embodiment, a first comparative example, and a second comparative example are manufactured by the following methods.

Third Embodiment (Slicing Process)
A single crystal SiC ingot is sliced using a slurry containing diamond abrasive grains having an average abrasive grain size of 10 μm to obtain a 6-inch diameter SiC wafer.
(Flattening Process)
In the free abrasive grain method using a slurry containing $B_4C$ abrasive grains having an average abrasive grain size of 40 μm, this SiC wafer is flattened under the condition that a processing pressure is 150 g/cm$^2$, a surface plate rotation speed is 15 rpm, a head rotation speed is 5 rpm, a processing time is 20 minutes, and a processing speed is about 1.0 μm/min.

At this time, the average abrasive grain size of the $B_4C$ abrasive grains at the end of the flattening process is 10 μm.
(Etching Process)
The SiC wafer after the flattening process is subjected to the Si vapor pressure etching under the condition of an etching amount of 3 μm (processing time: about 3 min, processing speed: 1 μm/min).

Fourth Embodiment (Slicing Process)
The slicing process is carried out under the same conditions as in the third embodiment to obtain a 6-inch diameter SiC wafer.
(Flattening Process)
This SiC wafer is flattened under the following conditions by the fixed abrasive grain method using a grindstone (vitrified bond) containing diamond abrasive grains having an average abrasive grain size of 30 μm.

Grindstone rotation speed: 1250 rpm
Cutting pitch: 2 μm
Front-back feed: 190 m/min
Left-right feed: 21 m/min
Processing speed: 100 um/hour
(Etching Process)
The Si vapor pressure etching is carried out under the same conditions as in the third embodiment except that the processing time is 6 min. The etching amount is 6 μm.

First Comparative Example

Slicing Process)
The slicing process is carried out under the same conditions as in the third embodiment to obtain a 6-inch diameter SiC wafer.
(Etching Process)
The obtained SiC wafer is subjected to the Si vapor pressure etching under the same conditions as in the third embodiment.

Second Comparative Example (Slicing Process)
The slicing process is carried out under the same conditions as in the third embodiment to obtain a 6-inch diameter SiC wafer.
(Flattening Process)
This SiC wafer is flattened under the following conditions by the fixed abrasive grain method using a grindstone (vitrified bond) containing diamond abrasive grains having an average abrasive grain size of 30 μm.
  Grindstone rotation speed: 1250 rpm
  Cutting pitch: 2 μm
  Front-back feed: 190 m/min
  Left-right feed: 21 m/min
  Processing speed: 100 um/hour
(Etching Process)
The Si vapor pressure etching is carried out under the same conditions as in the third embodiment.
<Observation and Evaluation of Work-Affected Layer>

The cross sections of the SiC wafers of the third embodiment, the fourth embodiment, the first comparative example, and the second comparative example are observed with a transmission electron microscope (TEM). The results are illustrated in FIGS. 16, 17, 18, and 19. Incidentally, in each drawing, (a) is a cross-sectional TEM image in which the (0001) surface side is enlarged in the range of 50 nm square, and (b) is a cross-sectional TEM image in which the (000-1) surface side is enlarged in the range of 50 nm square.

On the basis of this cross-sectional TEM image, the presence or absence of the affected layer and the depth thereof are evaluated by the following method.

[Evaluation method] The cross-sectional TEM image is magnified to a magnification at which a work-affected layer of several nm can be confirmed, and the contrast is compared between the surface side and the bulk side to evaluate that "there is a work-affected layer" in a case where there is a contrast difference and evaluate that "there is no work-affected layer" in a case where there is no contrast difference.

In a case where "there is a work-affected layer", the depth thereof is measured on the basis of the cross-sectional TEM image.

As a result, no work-affected layer is observed in the SiC wafers of the third embodiment and the fourth embodiment.

On the other hand, in the SiC wafer of the first comparative example, a work-affected layer of 12 nm is observed on the (0001) surface side, and a work-affected layer of 28 nm is observed on the (000-1) surface side.

Further, in the SiC wafer of the second comparative example, a work-affected layer of 10 nm is observed on the (0001) surface side, and a work-affected layer of 43 nm is observed on the (000-1) surface side.

From these results, it is found that, in the manufacturing SiC wafers, a SiC wafer from which a work-affected layer is removed with a small material loss of 3 μm per side can be manufactured by combining a flattening process of flattening the SiC wafer using abrasive grains with a modified Mohs hardness of less than 15 and an etching process of etching the SiC wafer by heating under Si vapor pressure.

From these results, it is found that, in the manufacturing SiC wafers, a SiC wafer from which a work-affected layer is removed with a small material loss of 3 μm per side can be manufactured by combining a flattening process of flattening the SiC wafer while crushing abrasive grains and an etching process of etching the SiC wafer by heating under Si vapor pressure.

From the results of the third embodiment and the fourth embodiment, it is found that the work-affected layer introduced in the flattening process can be removed by the etching process with an amount of material loss of 10 μm or less which is smaller than that of the conventional technique.

These results show that a material loss can be reduced with a configuration in which the work-affected layer introduced in the flattening process is removed by the etching process, and thus more SiC wafers can be manufactured from one ingot.

<<Manufacturing, Observation, and Evaluation of SiC Wafer of Present Invention for Achieving Fifth Object>>

The SiC wafers of the fifth embodiment and the sixth embodiment are manufactured by the following methods.

Fifth Embodiment (Slicing Process)
A single crystal SiC ingot is sliced using a slurry containing diamond abrasive grains having an average abrasive grain size of 10 μm to obtain a 6-inch diameter SiC wafer.
(Flattening Process)
In the free abrasive grain method using a slurry containing $B_4C$ abrasive grains having an average abrasive grain size of 40 μm, this SiC wafer is flattened under the condition that a processing pressure is 150 g/cm$^2$, a surface plate rotation speed is 15 rpm, a head rotation speed is 5 rpm, a processing time is 20 minutes, and a processing speed is about 1.0 μm/min.

At this time, the average abrasive grain size of the $B_4C$ abrasive grains at the end of the flattening process is 10 μm.
(Etching Process)
The SiC wafer after the flattening process is subjected to the Si vapor pressure etching under the condition of an etching amount of 3 μm (processing time: about 3 min, processing speed: 1 μm/min).

Sixth Embodiment (Slicing Process)
The slicing process is carried out under the same conditions as in the fifth embodiment to obtain a 6-inch diameter SiC wafer.
(Etching Process)
The obtained SiC wafer is subjected to the Si vapor pressure etching under the same conditions as in the fifth embodiment. The etching amount is 3.5 μm.
<Stress Measurement by SEM-EBSD>

Figure 20:
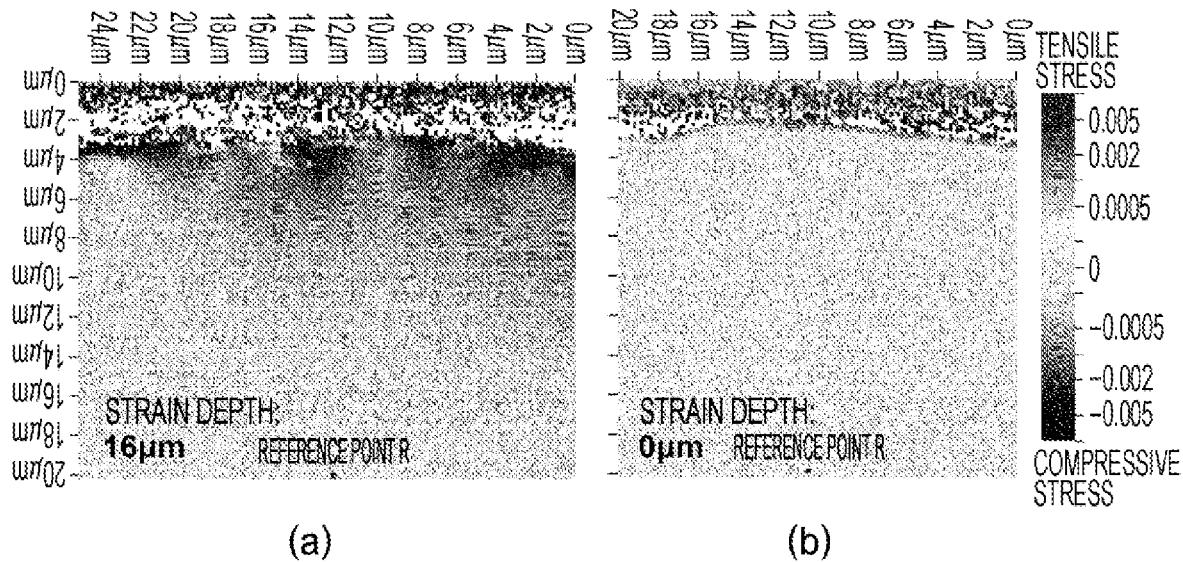
FIG. 20 is an imaging image obtained by observing a cross section of a SiC wafer of a fifth embodiment with the SEM-EBSD.
Figure 21:
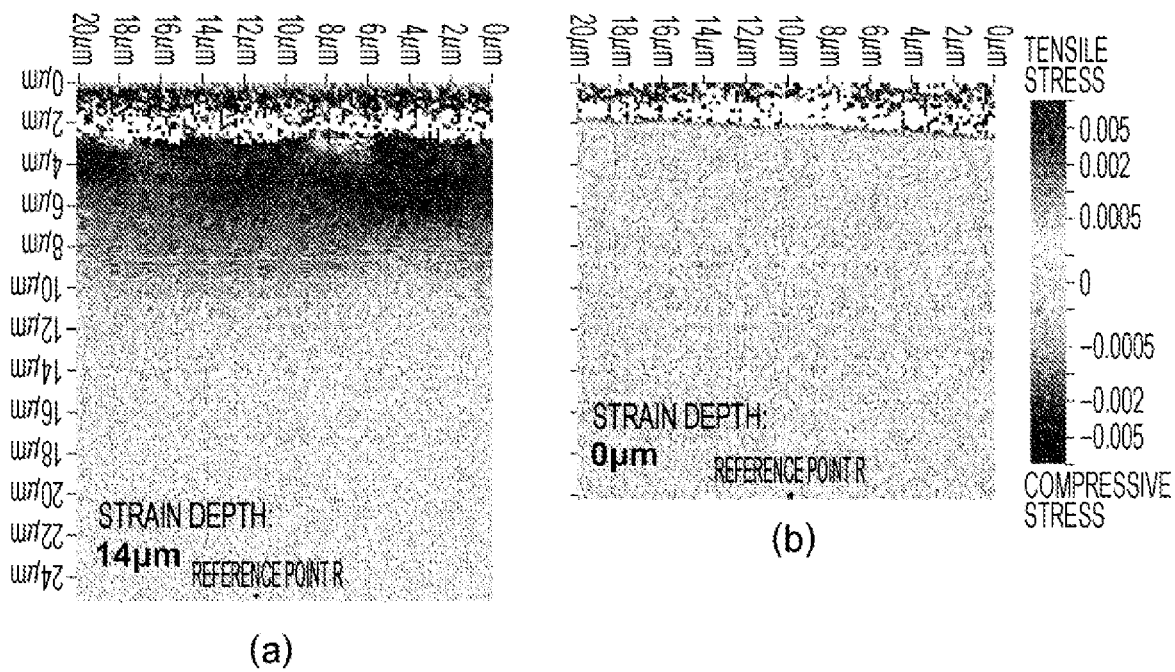
FIG. 21 is an imaging image of a cross section of a SiC wafer of a sixth embodiment when observed with the SEM-EBSD.

The stress existing in the SiC wafers of the fifth embodiment and the sixth embodiment before and after the etching process is observed by the SEM-EBSD method. The results are shown in FIGS. 20 and 21. The cross sections obtained by cleaving the SiC wafers of the first embodiment and the second embodiment are measured using a scanning electron microscope under the following conditions.

SEM equipment: Merline manufactured by Zeiss
EBSD analysis: OIM crystal orientation analyzer manufactured by TSL Solutions
Acceleration voltage: 15 kV
Probe current: 15 nA
Step size: 200 nm
Reference point R depth: 20 to 25 μm FIG. 20 is a cross-sectional SEM-EBSD imaging image of the fifth embodiment, and FIG. 21 is a cross-sectional SEM-EBSD imaging image of the sixth embodiment.

As illustrated in FIGS. 20(a) and 21(a), lattice strains are observed in the SiC wafer in both the fifth embodiment and the sixth embodiment before the etching process. The lattice strains are lattice strains introduced by the rough surface processing process or the like. Incidentally, in both cases, a compressive stress is observed.

On the other hand, as illustrated in FIGS. 20(b) and 21(b), after the etching process, the crystal lattice under the surface has lattice strains of 0.001% or less with respect to the reference crystal lattice, and no lattice strain is observed in the SiC wafer of the fifth embodiment and the sixth embodiment.

This result shows that the stress in the SiC wafer introduced by the etching process can be removed by the etching process.

When the chemical mechanical polishing is performed on the SiC wafer in which the stress is removed as in the SiC wafers of the fifth embodiment and the sixth embodiment, it is possible to obtain a high-quality SiC wafer which has no lattice strain inside and a high degree of flatness.

REFERENCE SIGNS LIST

10 Ingot
20 SiC wafer
21 Main surface
22 Back surface
23 Outer peripheral portion
24 Orientation flat
25 Stamp portion
30 Work-affected layer
31 Crack layer
32 Strain layer
33 Bulk layer
40 Crucible
41 Upper container
42 Lower container
43 Support base
50 High-temperature vacuum furnace
51 Main heating chamber
52 Preheating chamber
53 Moving table
54 Vacuum forming valve
55 Inert gas injection valve
56 Vacuum gauge
57 Heater
S10 Wafer shape forming process
S11 Ingot molding process
S12 Crystal orientation molding process
S13 Slicing process
S141 Satin finishing process
S142 Flattening process
S15 Stamp forming process
S16 Chamfering process
S17 Conventional flattening process
S20 Work-affected layer removing process
S21 Etching process
S22 Rough grinding process
S23 Finish grinding process
S30 Mirror surface polishing process
S31 Mirror surface processing process
S32 Chemical mechanical polishing process

The invention claimed is:

1. A SiC wafer manufacturing method comprising:
   a flattening process of flattening a SiC wafer while crushing abrasive grains by a free abrasive grain method;
   an etching process of etching the SiC wafer by heating under Si vapor pressure;
   a chamfering process of chamfering an outer peripheral portion of the SiC wafer; and
   a stamp forming process of forming a stamp on the surface of the SiC wafer;
   wherein the chamferinq process and the stamp forming process are performed before the etching process, or after the flattening process.

2. The SiC wafer manufacturing method according to claim 1, wherein in the flattening process, the SiC wafer is flattened while crushing the abrasive grains such that an average abrasive grain size at start of processing is 20 μm or more, and an average abrasive grain size at end of processing is less than 20 μm.

3. The SiC wafer manufacturing method according to of claim 1, wherein the abrasive grains are boron carbide abrasive grains and/or silicon carbide abrasive grains.

4. The SiC wafer manufacturing method according to claim 1, wherein an amount of the SiC wafer etched by the etching process is 10 μm or less per side.

* * * * *